United States Patent
Far

(10) Patent No.: US 10,581,448 B1
(45) Date of Patent: Mar. 3, 2020

(54) THERMOMETER CURRENT MODE ANALOG TO DIGITAL CONVERTER

(71) Applicant: Ali Tasdighi Far, San Jose, CA (US)

(72) Inventor: Ali Tasdighi Far, San Jose, CA (US)

(*) Notice: Subject to any disclaimer, the term of this patent is extended or adjusted under 35 U.S.C. 154(b) by 0 days.

(21) Appl. No.: 16/266,083

(22) Filed: Feb. 3, 2019

Related U.S. Application Data

(60) Provisional application No. 62/677,150, filed on May 28, 2018.

(51) Int. Cl.
  *H03M 1/44* (2006.01)
  *H03M 1/46* (2006.01)
  *H03M 7/16* (2006.01)

(52) U.S. Cl.
  CPC ............ *H03M 1/447* (2013.01); *H03M 1/46* (2013.01); *H03M 7/16* (2013.01)

(58) Field of Classification Search
  CPC ........... H03M 1/46; H03M 1/447; H03M 7/16
  (Continued)

(56) References Cited

U.S. PATENT DOCUMENTS

| | | |
|---|---|---|
| 3,187,325 A | 6/1965 | Waldhauer |
| 4,069,460 A | 1/1978 | Sauer |

(Continued)

OTHER PUBLICATIONS

S. Arayawat et al., "A CMOS-based Algorithmic ADC," 2005 IEEE Conference on Electron Devices and Solid-State Circuits, 2005, pp. 661-664.

(Continued)

Primary Examiner — Lam T Mai

(57) ABSTRACT

A family of current mode analog to digital converters, or TiADC, utilizing methods, circuits, and apparatuses, are disclosed with the following benefits: (1) There are normal and random non-systematic mismatch between devices in silicon manufacturing, that introduce non-linearity in current mode analog to digital converter's, or iADC, reference network. The iADC's linearity is improved by utilizing a thermometer current mode signal conditioning method, SCM. Successive applications of the SCM effectuates a segmented current reference network to function like a thermometer network, which operates based on the function of summation. Having a TiADC with a thermometer reference network, where current segments are summed or accumulated incrementally, would inherently reduce the impact of statistical distribution of component's random mismatch on the iADC's non-linearity. Accordingly, linearity of TiADC can be improved by the square root of the sum of the square of mismatch errors of the number of segmented current references in the thermometer network. (2) speed is improved by operating the TiADC in current mode, which is inherently faster. (3) voltage swings in current mode are small, which enables the iADC to operate at lower power supply voltages. (4) The TiADC can operate in subthreshold and at very low currents, which lower powers consumption. (5) the TiADC is asynchronous. Being clock free, TiADC has lower dynamic power consumption with reduces digital system noise. (6) the signal conditioning method or SCM utilized in TiADC provides concurrent functions of analog differencing and digital comparison. This trait enhances the dynamic response of iADC, wherein the digital output throughput accuracy degrades gradually and not abruptly as a function of increasing frequency of iADC's input signal. (7) No passive devices, such as capacitors or resistors, are required for the TiADC. (8) TiADC can be fabricated on low cost mainstream standard digital CMOS processes.

21 Claims, 46 Drawing Sheets

(58) Field of Classification Search
USPC .............................. 341/155–160; 327/52, 56
See application file for complete search history.

(56) References Cited

U.S. PATENT DOCUMENTS

| | | | |
|---|---|---|---|
| 4,179,687 A | | 12/1979 | van de Plassche et al. |
| 4,275,386 A | * | 6/1981 | Michel ................ H03M 1/125 |
| | | | 341/159 |
| 4,379,285 A | | 4/1983 | Dooley |
| 4,608,555 A | | 8/1986 | Hoeft |
| 4,667,180 A | | 5/1987 | Robinson |
| 4,675,651 A | | 6/1987 | Marbot et al. |
| 4,677,369 A | | 6/1987 | Bowers et al. |
| 4,691,190 A | | 9/1987 | Robinson |
| 5,072,221 A | | 12/1991 | Schmidt |
| 5,283,579 A | | 2/1994 | Tasdighi |
| 5,283,582 A | * | 2/1994 | Krenik ................ H03M 1/366 |
| | | | 341/158 |
| 5,294,927 A | | 3/1994 | Levinson et al. |
| 5,410,197 A | * | 4/1995 | Krenik ............... H03F 3/45183 |
| | | | 327/52 |
| 5,459,465 A | | 10/1995 | Kagey |
| 5,640,084 A | | 6/1997 | Tero et al. |
| 5,668,710 A | | 9/1997 | Caliboso et al. |
| 5,675,341 A | | 10/1997 | Vallancourt et al. |
| 5,719,578 A | | 2/1998 | Bohme |
| 5,734,260 A | | 3/1998 | Tasdighi et al. |
| 5,734,291 A | | 3/1998 | Tasdighi et al. |
| 5,805,097 A | * | 9/1998 | Yung .................. H03M 1/46 |
| | | | 341/161 |
| 5,814,995 A | | 9/1998 | Tasdighi |
| 5,923,208 A | | 7/1999 | Tasdighi et al. |
| 5,963,158 A | * | 10/1999 | Yasuda ............... G11C 27/028 |
| | | | 327/94 |
| 5,990,820 A | | 11/1999 | Tan |
| 6,005,374 A | | 12/1999 | Tasdighi |
| 6,037,890 A | | 3/2000 | Glass et al. |
| 6,054,823 A | | 4/2000 | Collings et al. |
| 6,122,284 A | | 9/2000 | Tasdighi et al. |
| 6,130,632 A | | 10/2000 | Opris |
| 6,150,967 A | * | 11/2000 | Nakamura ......... G01R 19/2509 |
| | | | 341/135 |
| 6,313,780 B1 | * | 11/2001 | Hughes ............... H03M 1/0682 |
| | | | 341/120 |
| 6,504,500 B1 | | 1/2003 | Tsukamoto |
| 6,891,495 B2 | | 5/2005 | Chen et al. |
| 6,909,389 B1 | * | 6/2005 | Hyde .................. H03M 1/1057 |
| | | | 341/135 |
| 6,972,706 B2 | | 12/2005 | Snoeijs |
| 7,076,384 B1 | * | 7/2006 | Radulov ............. H03M 1/1057 |
| | | | 324/601 |
| 7,079,063 B1 | * | 7/2006 | Nguyen ............... H03M 1/067 |
| | | | 341/144 |
| 7,170,436 B2 | | 1/2007 | Ye |
| 7,187,316 B1 | | 3/2007 | DeGeronimo |
| 7,250,883 B2 | | 7/2007 | Suzuki |
| 7,397,407 B2 | | 7/2008 | Shimizu et al. |
| 7,414,562 B2 | | 8/2008 | KOk et al. |
| 7,466,252 B1 | * | 12/2008 | Radulov ............. H03M 1/1061 |
| | | | 341/120 |
| 7,714,762 B2 | | 5/2010 | Poon et al. |
| 7,719,454 B2 | | 5/2010 | Minerva |
| 7,839,317 B1 | | 11/2010 | Sauer |
| 7,893,318 B2 | | 2/2011 | Wolf et al. |
| 7,911,366 B2 | | 3/2011 | Randlett et al. |
| 9,519,304 B1 | | 12/2016 | Far |
| 9,780,652 B1 | | 10/2017 | Far |
| 9,921,600 B1 | | 3/2018 | Far |
| 2002/0063644 A1 | * | 5/2002 | Clara ................. H03M 1/0682 |
| | | | 341/136 |
| 2004/0080446 A1 | * | 4/2004 | Chen .................. H03M 1/447 |
| | | | 341/162 |
| 2005/0285770 A1 | | 12/2005 | Ye |
| 2006/0290551 A1 | * | 12/2006 | Suzuki ................ H03M 1/447 |
| | | | 341/155 |
| 2007/0085719 A1 | * | 4/2007 | Maxim ................ H03C 3/403 |
| | | | 341/144 |
| 2008/0024346 A1 | * | 1/2008 | Kok ..................... H03M 1/125 |
| | | | 341/155 |
| 2008/0048644 A1 | | 2/2008 | Hales et al. |
| 2009/0174587 A1 | * | 7/2009 | Ogawa ................ H03K 17/302 |
| | | | 341/144 |
| 2010/0066579 A1 | | 3/2010 | Randlett |
| 2010/0149012 A1 | * | 6/2010 | Nguyen .............. H03M 1/0663 |
| | | | 341/143 |
| 2011/0122008 A1 | * | 5/2011 | Mahooti .............. H03M 1/069 |
| | | | 341/142 |

OTHER PUBLICATIONS

J. A. Bell et al., "CMOS current mode interpolating flash analog to digital converter," The 2002 45th Midwest Symposium on Circuits and Systems, 2002. MWSCAS-2002., 2002, pp. II-363-II-366 vol. 2.

V. Bhatia et al., "Low power delay proficient current mode ADC design," 2012 2nd International Conference on Power, Control and Embedded Systems, Allahabad, 2012, pp. 1-4.

J. Bonan et al., "A 3mW, 250 Msamples/sec, 4-bit current-mode FLASH analog-to-digital converter," 2003 46th Midwest Symposium on Circuits and Systems, 2003, pp. 1-4 vol. 1.

S. Chuenarom et at., "Low Power Current-Mode Algorithmic ADC in Half Flash (BCD)," APCCAS 2006—2006 IEEE Asia Pacific Conference on Circuits and Systems, Singapore, 2006, pp. 175-178.

A. J. Correia et al., "Current-mode algorithmic pipeline analog-to-digital converter," Circuits and Systems, 1996., IEEE Asia Pacific Conference on, Seoul, 1996, pp. 401-404.

H. Hedayati, "A low-power low-voltage fully digital compatible analog-to-digital converter," Proceedings. The 16th International Conference on Microelectronics, 2004. ICM 2004., 2004, pp. 227-230.

T. Kaya et al., "A modified active current mirror suitable for current-mode algorithmic analog-to-digital converters," 9th International Conference on Electronics, Circuits and Systems, 2002, pp. 257-260 vol. 1.

G. Khodabndehloo et al., "An area-speed efficient method for current mode analog to digital converters," 2009 European Conference on Circuit Theory and Design, Antalya, 2009, pp. 201-204.

D. G. Nairn et al, "Algorithmic analogue/digital convertor based on current mirrors," in Electronics Letters, vol. 24, No. 8, pp. 471-472, Apr. 14, 1988.

D. G. Nairn et al., "High-resolution, current-mode A/D convertors using active current mirrors," in Electronics Letters, vol. 24, No. 21, pp. 1331-1332, Oct. 13, 1988.

N. Oki et al., "An algorithmic of analog-to-digital converter using current-mode and digital CMOS process," 1998 Midwest Symposium on Circuits and Systems (Cat. No. 98CB36268), Notre Dame, IN, 1998, pp. 520-521.

P. O. Pouliquen et al., "A Gray-code MOS current-mode analog-to-digital converter design," 1991., IEEE International Sympoisum on Circuits and Systems, 1991, pp. 1924-1927 vol. 4.

L. Ravezzi et al., "Current-mode A/D converter," in Electronics Letters, vol. 34, No. 7, pp. 615-616, Apr. 2, 1998.

J. Sarao et al, "Current mode building and blocks and their application in ADC," 2001 IEEE Pacific Rim Conference on Communications, Computers and Signal Processing (IEEE Cat. No. 01CH37233), Victoria, BC, 2001, pp. 283-286 vol. 1.

V. Tipsuwanporn et al., "Algorithmic ADC using current mode without DAC," Asia-Pacific Conference on Circuits and Systems, 2002, pp. 453-456 vol. 1.

L. Vesalainen et al., "A gray-code current-mode ADC for mixed-mode cellular computer," 2004 IEEE International Symposium on Circuits and Systems (IEEE Cat. No. 04CH37512), 2004, pp. III-81-4 vol. 3.

B. M. Wilamowski et al., "A Gray-Code Current Mode ADC Structure," MELECON 2006—2006 IEEE Mediterranean Electrotechnical Conference, Malaga, 2006, pp. 35-38.

(56) References Cited

OTHER PUBLICATIONS

A. Far, "Small size class AB amplifier for energy harvesting with ultra low power, high gain, and high CMRR," 2016 IEEE International Autumn Meeting on Power, Electronics and Computing (ROPEC), Ixtapa, 2016, pp. 1-5.

A. Far, "Compact ultra low power class AB buffer amplifier," 2017 IEEE International Autumn Meeting on Power, Electronics and Computing (ROPEC), Ixtapa, 2017, pp. 1-6.

A. Far, "Subthreshold current reference suitable for energy harvesting: 20ppm/C and 0.1%/V at 140nW," 2015 IEEE International Autumn Meeting on Power, Electronics and Computing (ROPEC), Ixtapa, 2015, pp. 1-4.

A. Far, "Amplifier for energy harvesting: Low voltage, ultra low current, rail-to-rail input-output, high speed," 2016 IEEE International Autumn Meeting on Power, Electronics and Computing (ROPEC), Ixtapa, 2016, pp. 1-6.

A. Far, "Class AB amplifier with noise reduction, speed boost, gain enhancement, and ultra low power," 2018 IEEE 9th Latin American Symposium on Circuits & Systems (LASCAS), Puerto Vallarta, Mexico, 2018, pp. 1-4.

A. Far, "Low noise rail-to-rail amplifier runs fast at ultra low currents and targets energy harvesting," 2017 IEEE International Autumn Meeting on Power, Electronics and Computing (ROPEC), Ixtapa, 2017, pp. 1-6.

A. Far, "A 5 µW fractional CMOS bandgap voltage and current reference," 2013 IEEE Global High Tech Congress on Electronics, Shenzhen, 2013, pp. 7-11.

A. Far, "A 400nW CMOS bandgap voltage reference," 2013 International Conference on Electrical, Electronics and System Engineering (ICEESE), Kuala Lumpur, 2013, pp. 15-20.

A. Far, "Enhanced gain, low voltage, rail-to-rail buffer amplifier suitable for energy harvesting," 2017 IEEE International Autumn Meeting on Power, Electronics and Computing (ROPEC), Ixtapa, 2017, pp. 1-6.

A. Far, "Subthreshold bandgap voltage reference aiming for energy harvesting: 100na, 5 ppm/c, 40 ppm/v, psrr-88db," 2015 IEEE 5th International Conference on Consumer Electronics—Berlin (ICCE—Berlin), Berlin, 2015, pp. 310-313.

A. Far, "A 220nA bandgap reference with 80dB PSRR targeting energy harvesting," 2016 IEEE Canadian Conference on Electrical and Computer Engineering (CCECE), Vancouver, BC, 2016, pp. 1-4.

A. Far, "Sub-1 volt class AB amplifier with low noise, ultra low power, high-speed, using winner-take-all," 2018 IEEE 9th Latin American Symposium on Circuits & Systems (LASCAS), Puerto Vallarta, Mexico, 2018, pp. 1-4.

A. Far, "A low supply voltage 2 µW half bandgap reference in standard sub-µ CMOS," 2014 IEEE International Conference on Electronics, Computing and Communication Technologies (CONECCT), Bangalore, 2014, pp. 1-5.

A. Far, "Current reference for energy harvesting: 50um per side, at 70 nW, regulating to 125C," 2014 IEEE International Autumn Meeting on Power, Electronics and Computing (ROPEC), Ixtapa, 2014, pp. 1-5.

\* cited by examiner

| xT7 | xT6 | xT5 | xT4 | xT3 | xT2 | xT1 | D3 | D2 | D1 |
|---|---|---|---|---|---|---|---|---|---|
| 0 | 0 | 0 | 0 | 0 | 0 | 0 | 0 | 0 | 0 |
| 0 | 0 | 0 | 0 | 0 | 0 | 1 | 0 | 0 | 1 |
| 0 | 0 | 0 | 0 | 0 | 1 | 1 | 0 | 1 | 0 |
| 0 | 0 | 0 | 0 | 1 | 1 | 1 | 0 | 1 | 1 |
| 0 | 0 | 0 | 1 | 1 | 1 | 1 | 1 | 0 | 0 |
| 0 | 0 | 1 | 1 | 1 | 1 | 1 | 1 | 0 | 1 |
| 0 | 1 | 1 | 1 | 1 | 1 | 1 | 1 | 1 | 0 |
| 1 | 1 | 1 | 1 | 1 | 1 | 1 | 1 | 1 | 1 |

| G3 | G2 | G1 |
|---|---|---|
| 0 | 0 | 0 |
| 0 | 0 | 1 |
| 0 | 1 | 1 |
| 0 | 1 | 0 |
| 1 | 1 | 0 |
| 1 | 1 | 1 |
| 1 | 0 | 1 |
| 1 | 0 | 0 |

| D3 | D2 | D1 |
|---|---|---|
| 0 | 0 | 0 |
| 0 | 0 | 1 |
| 0 | 1 | 0 |
| 0 | 1 | 1 |
| 1 | 0 | 0 |
| 1 | 0 | 1 |
| 1 | 1 | 0 |
| 1 | 1 | 1 |

| S | D3 | D2 | D1 |
|---|---|---|---|
| 1 | B3/xB3 | B2/xB2 | B1/xB1 |
| 0 | $\overline{B3/xB3}$ | $\overline{B2/xB2}$ | $\overline{B1/xB1}$ |

Summary of terms, acronyms, and abbreviations including usage examples

| Term | Description | Term | Description |
|---|---|---|---|
| ADC | Analog to Digital Converter | iDAC | Current output Digital to Analog Converter |
| iADC | Current mode ADC | TiADC | Thermometer iADC |
| FiADC | Flash iADC | AiADC | Algorithmic iADC |
| DNL | Differential non-linearity | INL | Integral non-linearity |
| MSB | Most Significant Bit | LSB | Least Significant Bit |
| $V_{DD}$ | Positive power supply or rail | $V_{SS}$ | negative supply, rail, ground |
| Code 1 | Digital voltage high or $V_{DD}$ | Code 0 | Digital voltage low or $V_{SS}$ |
| MOSFETs or FET | Metal-Oxide-Field-Effect-Transistors | Terminal | Used interchangeably with terms such as port or node |
| PMOS or PMOSFET | P-channel MOSFET | Example: $P_{6N}$ | PMOS number 6 in Fig. 1N |
| NMOS or NMOSFET | N-channel MOSFET | Example: $N_{2N}$ | NMOS number 2 in Fig. 1N |
| Example: $G_1$ | Gray code bit number 1 | Example: $P_{5_{3A}}$ | PMOS number 5 in Fig. 3A |
| Example: $D_2$ or $D_{O2}$ | Binary code bit number 1 | Example: $N_{7_{3B}}$ | NMOS number 7 in Fig. 3B |
| Example: $\overline{T_2}$ or $\overline{T_{O2}}$ | $XT_2$ opposite of $T_2$ or $XT_{O2}$ opposite of $T_{O2}$ | Example: $\overline{B_3}$ | $XB_3$ opposite of digital $B_3$ |
| Example: $T_1$ or $T_{O_1}$ | Thermometer code bit number 1 | Example: $T_{O_{1,2,3}}$ | Thermometer code bits number 1,2, and 3 |
| $V_{GS}$ | gate-terminal to source-terminal voltage | $V_{DS}$ | drain-terminal to source-terminal voltage |
| $V_{On}$ or $V_{sat}$ | Minimum $V_{DS}$ for saturation | $I_{DS}$ or $I_D$ | drain to source current of FET |
| SCC | signal conditioning circuit | SCB | signal conditioning block |
| SCM | signal conditioning method | RGC | regulated cascode current mirror |
| DABS | differencing absolute value circuit | DABS2 | differencing absolute value circuit with a gain of 2 |
| DIF2 | subtraction circuit with a gain of 2 | RALSP | residual analog least significant portion circuit |
| $I_R$ or $I_{A_R}$ | Reference current | $I_R/m$ | segmented reference current $I_R/m$ |
| $I_I$ or $I_{IN}$ or $I_{A_I}$ | analog input current | $A_I$ | input terminal of SCC |
| $A_R$ | Reference input terminal of SCC | $A_R/m$ | segmented reference signal $A_R/m$ |

FIG. 7A

Additional summary of terms, acronyms, and abbreviations including usage examples

| Term | Description | Term | Description |
|---|---|---|---|
| $V_{I-}$ | voltage at inverting input node of amplifier or comparator | $V_{I+}$ | voltage at non-inverting input node of amplifier or comparator |
| Example: $V_{A_I}$ | Voltage at $A_I$ terminal | Example: $Vgs_{N_{2G'}}$ | $V_{GS}$ of NMOS number 2 in Figure 1G' |
| Example: $I_{N6_{3B}}$ | Drain current of NMOS number 6 in Fig. 3B | Example: $V_O$ | Output voltage of amplifier or comparator |
| Example: $I_{A_P}$ | Current through $A_P$ node (output of SCC circuit) | Example: $I_{E_N}$ | Current through $E_N$ node (input of RALSP circuit) |
| Example: $I_{A_L}$ | Current through $A_L$ node (output of RALSP circuit) | Example: $A_{2J}$ | Amplifier number 2 in Figure 1J |
| $I_{2Q}$ | Current source number 2 in Figure 1Q | Example: $Id_{N_{4Q}}$ | Drain current of NMOS number 4 in Figure 1Q |
| Example: $|I_{A_I} - I_{A_R}|$ | Absolute value of the $I_{A_I}$ and $I_{A_R}$ difference | Example: $XOR_{1_{2B}}$ | Logic gate exclusive or number 1 in Figure 2B |
| CM2 | Current mirror with a gain of 2 | Example: $INV_{1_{2C}}$ | Logic inverter number 1 in Fig. 2C |
| Example: $CM_{NH}$ | Current mirror N-type in Figure 1H | Example: $SCC_{2_{3A}}$ | Signal conditioning circuit number 2 in Figure 3A |
| $A_I/T_O$ | $A_I/T_O$ terminal as both analog current input $A_I$ and a digital voltage output $T_O$ | Example: $SCC_{4_{3C}}$ | Signal conditioning circuit number 4 in Figure 3C |
| Example: $SCC_{3_{3E}}$ | Signal conditioning circuit number 3 in Fig. 3E | Example: $DIF2_{3_{3E}}$ | Gain of 2 differencing circuit number 3 in Fig. 3E |
| Example: $DABS2_{2_{3F}}$ | Gain of 2 differencing absolute value circuit number 2 in Figure 3F | Example: $DABS2_{1_{3G}}$ | Gain of 2 differencing absolute value circuit number 1 in Figure 3G |
| Example: $RALSP_{1_{4B}}$ | Residual analog least significant portion circuit number 1 in Fig. 4B | Example: $DECODE_{1_{3G}}$ | Logic decoder number 1 in Fig. 3G |
| Example: $ENCODE_{1_{3B}}$ | Logic encoder number 1 in Fig. 3B | Example: $FLIP_{1_{4A}}$ | Flip logic circuit number 1 in Fig. 4A |
| Zero-crossing | When $|I_I - I_R/m|$ nears zero | Example: $CM_{NH}$ | Current mirror N-type in Figure 1H |

FIG. 7B

THERMOMETER CURRENT MODE ANALOG TO DIGITAL CONVERTER

CROSS-REFERENCE TO RELATED PATENT APPLICATIONS

The present disclosure claims priority from U.S. Provisional Patent Application Ser. No. 62/677,150, filed May 28, 2018 and which is herein specifically incorporated by reference in its entirety.

FIELD OF DISCLOSURE

The present invention relates to improvements in analog to digital converters (ADC) and more specifically to current mode ADCs (iADC).

BACKGROUND

Normal and random mismatch, between field effect transistors (FET), in standard complementary metal-oxide semiconductor (CMOS) manufacturing, decreases the accuracy of ADCs whose precision depend on matching of such FETs. Manufacturing costs are higher for ADCs that require high precision and highly matched passive components such as resistors and capacitor. Costs are also higher for those ADCs that need post fabrication trimming or on-chip calibration of FETs or passive components to attain higher accuracies. Resistor free, capacitor free, trim or calibration free, and clock free ADCs that rely on FET matching for their accuracy, generally yield lower precision and lower resolutions. Emerging green and low power applications require ADCs that operate at low voltage power supplies and low currents. Additionally, operating with low voltage power supplies generally restricts the input range of ADCs, which can limit ADC's accuracy over the full zero-scale to full-scale input signal span and constrain ADC's signal to noise ratio requirements. Operating at low currents also slows the conversion speed of ADCs. Sampling ADCs that for example utilize switching techniques, such as switch capacitors, can yield high accuracy ADCs, but they are more expensive due to the needed capacitors and exhibit higher dynamic power consumption because of the needed free running clock requirement.

Definitions, Acronyms and Abbreviations

Refer to FIG. 7A and FIG. 7B which provide explanations and a summary of terms, definitions, acronyms, with examples of term usages and abbreviations that are used throughout this application.

SUMMARY OF THE DISCLOSURE

Aspects of the embodiments disclosed herein include a method for conditioning signals (SCM) in an integrated circuit, the method comprising: receiving an input current; and producing a first comparison by comparing the input current to a first reference current and producing a first difference current; and producing a first digital thermometer code corresponding to the polarity of the first difference current. The method for conditioning signals (SCM) in an integrated circuit, the method further comprising: producing successive comparisons by comparing the first and subsequent difference signals respectively with a second and subsequent reference signals; and producing successive thermometer digital codes corresponding to the respective polarities of the successive comparisons Aspects of the embodiments disclosed herein further include a signal conditioning method (SCM), the method comprising: providing a first signal conditioning block (SCB); and the first SCB having an analog input port, an analog output port, and a digital output port; and receiving an analog input signal ($I_{A_I}$) at the first SCB's analog input port ($A_I$); and receiving an analog reference input signal ($I_{A_R}$) at the first SCB's analog input port $A_I$; and generating a digital output signal $T_O$ at the first SCB's digital output port; and generating an analog output signal ($I_{A_O}$) at the first SCB's analog output port ($A_O$); and generating $T_O$ with a polarity X and generating $I_{A_O}=I_{A_I}-I_{A_R}$, if $I_{A_I}>I_{A_R}$; and generating $T_O$ with a polarity opposite to X and generating $I_{A_O}=0$, if $I_{A_I} \leq I_{A_R}$. The signal conditioning method (SCM), the method further comprising: providing an analog to digital converter (ADC) having T bits of resolution comprising; and cascading T of SCBs beginning with the first SCB and ending with a last SCB, the analog output $A_O$ of the first SCB communicating with the analog input $A_I$ of a second SCB, and respectively, the analog output $A_O$ of each successive SCB communicating with the analog input $A_I$ of each subsequent successive SCB; and receiving, at the analog input port $A_I$ of each SCB, an analog reference input signal $I_{A_R}$ wherein each respective analog reference input signal $I_{A_R}$ is individually weighted; and providing a reference input port to the ADC; and receiving an ADC reference signal at the reference input port of the ADC, wherein the ADC reference signal is proportional to $I_{A_R}$; and providing a plurality of digital output ports to the ADC, wherein each digital output port to the ADC receives the digital output signal $T_O$ from each SCB to form an ADC thermometer code; and wherein the analog input signal ($I_{A_I}$) at the first SCB's analog input port $A_I$ is the input signal to the ADC. The signal conditioning method (SCM), the method further comprising: programming each respective analog reference input signal $I_{A_R}$ such that each is individually weighted. The signal conditioning method (SCM), the method further comprising: mapping the ADC thermometer code to another output code format.

Aspects of the embodiments disclosed herein further include a signal conditioning method (SCM), the method comprising: providing a first signal conditioning block (SCB); and the first SCB having an analog input port ($A_I$), a first analog output port ($A_O$), a second analog output port ($A_N$), and a digital output port; and receiving an analog input signal ($I_{A_I}$) at the first SCB's analog input port $A_I$; and receiving an analog reference input signal ($I_{A_R}$) at the first SCB's analog input port $A_I$; and generating a digital output signal $T_O$ at the first SCB's digital output port; and generating a first analog output signal $I_{A_O}$ at the first SCB's first analog output port ($A_O$); and generating a second analog output signal ($I_{A_N}$) at the first SCB's second analog output port $A_N$; and generating $T_O$ with a polarity X and generating $I_{A_O}=I_{A_I}-I_{A_R}$ and generating $I_{A_N}=0$, if $I_{A_I}>I_{A_R}$; and generating $T_O$ with a polarity opposite to X and generating $I_{A_O}=0$ and generating $I_{A_N}=I_{A_R}-I_{A_I}$, if $I_{A_I} \leq I_{A_R}$. The signal conditioning method (SCM), the method further comprising: providing an analog to digital converter (ADC) having T bits of resolution comprising: cascading T of SCBs beginning with the first SCB and ending with a last SCB, the first analog output $A_O$ of the first SCB communicating with the analog input $A_I$ of a second SCB, and respectively, the analog output $A_O$ of each successive SCB communicating with the analog input $A_I$ of each subsequent successive SCB; and receiving, at the analog input port $A_I$ of each SCB, an analog reference input signal $I_{A_R}$ wherein each respective analog reference input signal $I_{A_R}$ is individually weighted; providing a reference input port to the ADC; and receiving an ADC reference signal at the reference input port of the ADC, wherein the ADC reference signal is proportional to $I_{A_R}$; and providing a plurality of digital output ports to the ADC, wherein each digital output port to the ADC receives the digital output signal $T_O$ from each SCB to form an ADC thermometer code; and providing a plurality of analog output ports to the ADC, wherein each analog output port to the ADC receives the second output signal ($I_{A_N}$) from each SCB; and wherein the analog input signal ($I_{A_I}$) at the first SCB's analog input port $A_I$ is the input signal to the ADC; and wherein the first SCB and every other successive SCB is an odd-numbered SCB, and wherein the second SCB and every other successive SCB is an even-numbered SCB. The signal conditioning method (SCM), the method further comprising: generating $I'_{A_L}$ by summing the subtracting of the second analog output signal ($I_{A_N}$) of an odd-numbered SCB from the second analog output signal ($I_{A_N}$) of an even-numbered SCB to the subtracting of the second analog output signal ($I_{A_N}$) of another odd-numbered SCB from the second analog output signal ($I_{A_N}$) of another even-numbered SCB; and generating a residual analog least significant portion (RALSP) signal $I_{A_L} = I'_{A_L} - I_{O_P}$; and wherein the $I_{A_O}$ of the last SCB is $I_{O_P}$. The signal conditioning method (SCM), the method further comprising: wherein the even-numbered SCB and the another even-numbered SCB subtracting of the second analog output signal ($I_{A_N}$) of an odd-numbered SCB from the second analog output signal ($I_{A_N}$) of an even-numbered SCB to the subtracting of the second analog output signal ($I_{A_N}$) of another odd-numbered SCB from the second analog output signal ($I_{A_N}$) of another even-numbered SCB. The signal conditioning method (SCM), the method further comprising: summing the $I_{A_N}$ of all odd-numbered SCBs to generate an odd-numbered sum $I_{O_N}$; and summing the $I_{A_N}$ of all even-numbered SCBs to generate an even-numbered sum $I_{E_N}$; and wherein the $I_{A_O}$ of the last SCB is $I_{O_P}$; and generating a residual analog least significant portion (RALSP) signal $I_{A_L} = I_{O_N} - I_{E_N} - I_{O_P}$. The signal conditioning method (SCM), the method further comprising: providing a second ADC having a second ADC analog input port receiving the $I_{A_L}$. The signal conditioning method (SCM), the method further comprising: selecting an SCB in transition (SCB$_t$), wherein the digital output signal $T_O$ of all SCBs preceding the SCB$_t$ exhibits a polarity opposite to the polarity of the digital output signal $T_O$ of all SCBs including and succeeding the SCB$_t$; and generating a residual analog least significant portion (RALSP) signal $I_{A_L} = I'_{A_L} - I_{O_P}$; and wherein the $I_{A_N}$ signal of the SCB$_t$ is $I'_{A_L}$; and wherein the $I_{A_O}$ of the last SCB is $I_{O_P}$. The signal conditioning method (SCM), the method further comprising: providing a second ADC having a second ADC analog input port receiving the $I_{A_L}$. The signal conditioning method (SCM), the method further comprising: spanning $I_{A_I}$ signal from zero scale to full scale, wherein $I_{A_I}$'s zero scale to full scale is proportional to $I_{A_R}$; and detecting a SCB in transition (SCB$_t$), wherein $T_O$ of all SCBs before SCB$_t$ have the opposite polarity of $T_O$ of all SCBs after SCB$_t$; and generating a $I_{O_N}$ which is the $I_{A_N}$ signal of an Odd number SCB$_t$ if an Odd numbered SCB$_t$ is detected, otherwise $I_{O_N}=0$; and generating a $I_{E_N}$ which is the $I_{A_N}$ signal of an Even number SCB$_t$ if the Even numbered SCB$_t$ is detected, otherwise $I_{E_N}=0$; and generating a $I_{O_P}$ which is the first output signal $I_{A_O}$ of the last SCBs; and generating a residual analog least significant portion (RALSP) signal $I_{A_L} = I_{O_N} - I_{E_N} - I_{O_P}$. The signal conditioning method (SCM), the method further comprising: providing a second ADC having a second ADC analog input port receiving the $I_{A_L}$. The signal conditioning method (SCM), the method further comprising: generating by summing the subtraction of the $I_{A_N}$ of an odd-numbered SCBs from the $I_{A_N}$ of an even-numbered SCBs that is adjacent to the odd-numbered SCBs; and generating a residual analog least significant portion (RALSP) signal $I_{A_L} = I'_{A_L} - I_{O_P}$; and wherein the $I_{A_O}$ of the last SCB is $I_{O_P}$. The signal conditioning method (SCM), the method further comprising: providing a second ADC having a second ADC analog input port receiving the $I_{A_L}$. The signal conditioning method (SCM), the method further comprising: generating $I'_{A_L}$ by gating the $I_{A_N}$ of a succeeding SCB to the $A_L$ port, the gating responsive to the $T_O$ of a previous SCB; and generating $I_{O_P}$ by gating the $I_{A_O}$ of the last SCB, the gating responsive to the $T_O$ of the SCB preceding the last SCB; and directing the $I_{A_N}$ of the first SCB to the $A_L$ port; and generating a residual analog least significant portion (RALSP) signal $I_{A_L} = I'_{A_L} - I_{O_P}$. The signal conditioning method (SCM), the method further comprising: providing a second ADC having a second ADC analog input port receiving the $I_{A_L}$.

Aspects of the embodiments disclosed herein further include a method to generate absolute value of a difference (ABSDIF) between two currents, the method further comprising: a current mirror (CM) comprising a first transistor ($M_1$) and a second transistor ($M_2$); and the $M_1$ having first source, gate, and drain terminals; and the $M_2$ having second source, gate, and drain terminals; and the $M_1$ and the $M_2$ source terminals are connected together at negative power supply ($V_{SS}$); and the $M_1$ and the $M_2$ gate terminals are connected together at node 3 ($n_3$); and the $M_1$'s drain terminal is connected to node 1 ($n_1$); and the $M_2$'s drain terminal is connected to node 2 ($n_2$); and node $n_1$ receiving a first current signal ($I_1$); and node $n_2$ receiving a second current signal ($I_2$); and a current steering circuit (CSC) whose first terminal ($n_{1_{CSC}}$) is connected to $n_1$, second terminal ($n_{2_{CSC}}$) is connected to $n_2$, third terminal ($n_{3_{CSC}}$) is connected to $n_3$, fourth terminal ($n_{4_{CSC}}$) is connected to node 4 ($n_4$), fifth terminal ($n_{5_{CSC}}$) is connected to $V_{SS}$; and the CSC generating $I_1 - I_2$ to flow through node n4, and CSC causing $I_2$ to flow through the current mirror, if $I_1 > I_2$; and the CSC generating $I_2 - I_1$ to flow through node n4, and CSC causing $I_1$ to flow through the current mirror, if $I_2 > I_1$; and wherein the current flowing through $n_4$ is the absolute value of the difference between current value of $I_1$ and $I_2$. The system to generate ABSDIF, the system further comprising: CSC keeping the steering circuitry from falling deep into the off state during the zero-crossing transition wherein $I_1$ and $I_2$ are near or at balance. The system to generate ABSDIF, the system further comprising: cascading CM to increase output impedance and sharpen the zero crossing of ABSDIF when $I_1$ and $I_2$ are near or at balance. The system to generate ABSDIF, the system further comprising: utilizing regulated cascade current mirrors for CM to increase output impedance and sharpen the zero crossing of ABSDIF when $I_1$ and $I_2$ are near balance.

BRIEF DESCRIPTION OF THE DRAWINGS

The subject matter presented herein is illustrated by way of example, and not by way of limitation, in the figures of the accompanying drawings and illustrations, and in which like reference numerals refer to similar elements and in which:

FIG. 1A' is a schematic circuit diagram of another embodiment illustrating a SCC

FIG. 2A' illustrates the truth table for FIG. 2A.

FIG. 2B' illustrates the truth table for FIG. 2B.

FIG. 2C' illustrates the logic table for FIG. 2C.

FIG. 7A is a summary of terms, acronyms, and abbreviations including examples that are used throughout this application.

FIG. 7B is an additional summary of terms, acronyms, and abbreviations including examples that are used throughout this application.

DETAILED DESCRIPTION

Numerous embodiments are described in the present application and are presented for illustrative purposes only and is not intended to be exhaustive. The embodiments were chosen and described to explain principles of operation and their practical applications. The present disclosure is not a literal description of all embodiments of the disclosure(s). The described embodiments also are not, and are not intended to be, limiting in any sense. One of ordinary skill in the art will recognize that the disclosed embodiment(s) may be practiced with various modifications and alterations, such as structural, logical, and electrical modifications. For example, the present disclosure is not a listing of features which must necessarily be present in all embodiments. On the contrary, a variety of components are described to illustrate the wide variety of possible embodiments of the present disclosure(s). Although particular features of the disclosed embodiments may be described with reference to one or more particular embodiments and/or drawings, it should be understood that such features are not limited to usage in the one or more particular embodiments or drawings with reference to which they are described, unless expressly specified otherwise. The scope of the disclosure is to be defined by the claims.

Although process (or method) steps may be described or claimed in a particular sequential order, such processes may be configured to work in different orders. In other words, any sequence or order of steps that may be explicitly described or claimed does not necessarily indicate a requirement that the steps be performed in that order. The steps of processes described herein may be performed in any order possible. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to the embodiment(s). In addition, although a process may be described as including a plurality of steps, that does not imply that all or any of the steps are essential or required. Various other embodiments within the scope of the described disclosure(s) include other processes that omit some or all of the described steps. In addition, although a circuit may be described as including a plurality of components, aspects, steps, qualities, characteristics and/or features, that does not indicate that any or all of the plurality are essential or required. Various other embodiments may include other circuit elements or limitations that omit some or all of the described plurality.

Figure 6A:
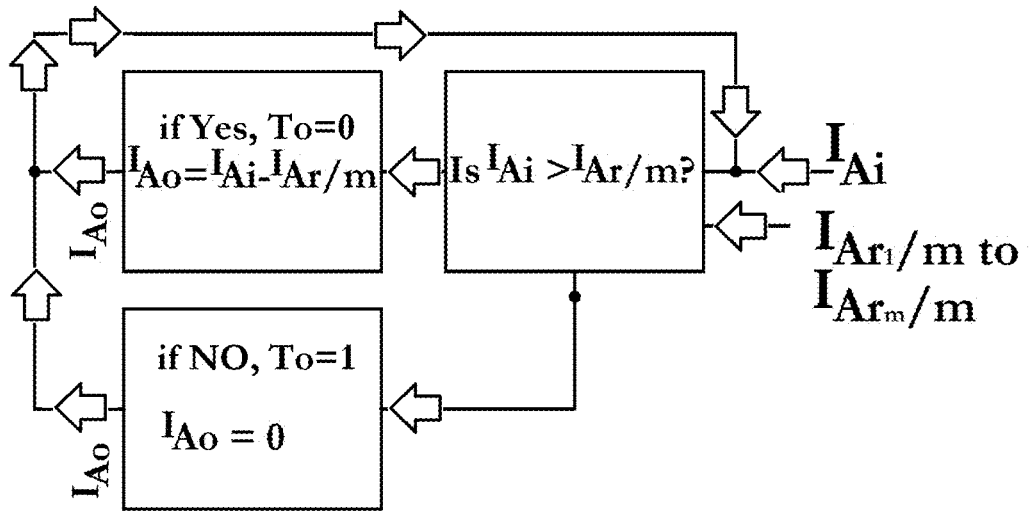
FIG. 6A is a flow chart illustrating a SCM utilized in TiADC.
Figure 6B:
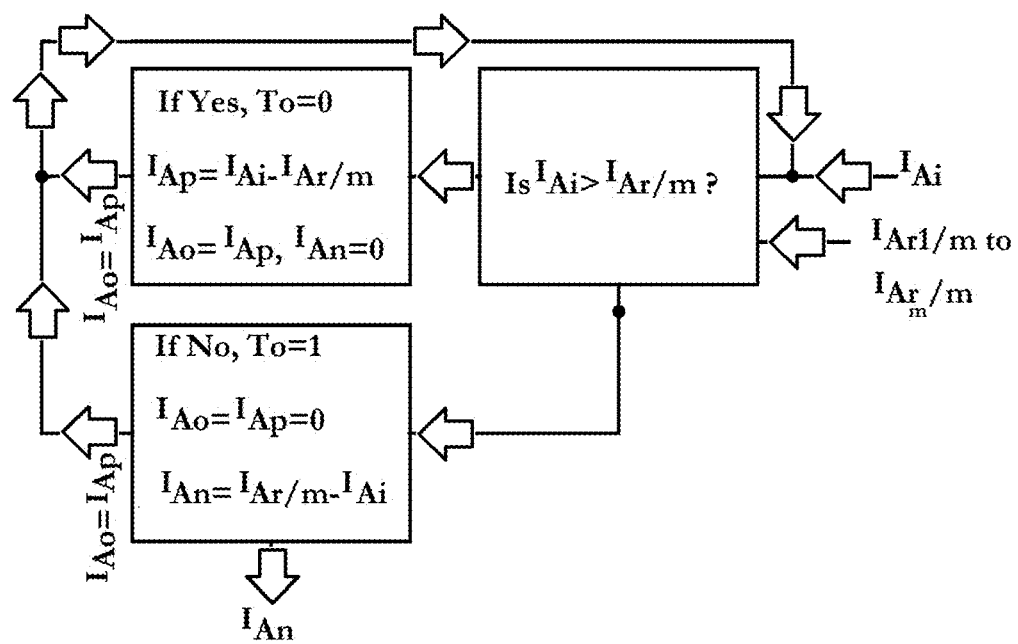
FIG. 6B is a flow chart illustrating another SCM utilized in TiADC.

This application discloses signal conditioning methods (SCM) that are illustrated in flow charts of FIGS. 6A and 6B. Disclosed SCMs are utilized in several embodiments of signal conditioning circuits (SCC). The disclosed SCCs are utilized in several embodiments of thermometer current mode analog to digital converters (TiADC). The disclosed TiADCs are combined with other current mode ADCs (iADC) to extend the resolution of iADC, cost effectively.

Note that $V_{DD}$ and $V_{SS}$ are applied to all the circuitries in this disclosure, but may not be shown for brevity. The Vss may be connected to the ground (zero) potential. Body terminal MOSFETs can be connected to their respective source terminals or their respective power supplies, $V_{DD}$ and $V_{SS}$. FETs utilized in this disclosure can be designed to operate in subthreshold or normal (non-subthreshold region). In the SCC that operates in current mode, the $T_O$ digital output signal represents the sign of comparison between the input and (segmented) reference signals (or $I_{A_I}$ and $I_{A_R}/m$). The terms 'zero-crossing' refers to SCC's analog output signals, when the net difference between SCC's analog input signal and an analog reference input signal values, crosses zero or is nears zero. A polarity and opposite polarity denote a digital state (e.g., logic 1) and its opposite state (e.g., logic 0).

Utilizing SCM, FIG. 6A illustrates a flow chart where a signal conditioning block (SCB) receives an analog input signal ($I_{A_I}$) at analog input port $A_I$, and an analog segmented reference input signal ($I_{A_R}/m$). The SCB also generates an analog output signal ($I_{A_O}$) at an analog output port $A_O$, and a thermometer digital output signal ($T_O$). Note that the signal terms $I_{A_R}$ and $I_R$ can be used interchangeably throughout this disclosure, unless otherwise specified.

Utilizing SCM, FIG. 6B illustrates another flow chart where a SCB receives an $I_{A_I}$, and $I_{A_R}/m$ (or $I_R/m$). It generates a first analog output signal ($I_{A_O}=I_{A_P}$), a second analog output signal ($I_{A_N}$) at a second analog output port $A_N$, and a thermometer digital output signal ($T_O$).

Again, by utilizing SCM, plurality of SCBs illustrated in FIG. 6A's flow chart are successively cascaded to make a TiADC, and plurality of SCBs illustrated in FIG. 6B's flow chart are successively cascaded to make a TiADC. Also, note that Signal conditioning circuit (SCC) is the transistor level embodiment of SCB.

A TiADC, of the kind arranged based on FIG. 6B's flow chart, can be combined with one or more iADs to make a multi-stage iADC that is cost effective and has higher resolution, which will be explained later.

Employing the SCM as described in FIG. 6A's flow chart, a SCB initiates a thermometer code $T_O$ that signifies the comparison of $I_{A_I}$ with $I_{A_R}/m$, and generates their analog difference $I_{A_O}=I_{A_I}-I_{A_R}/m$. If $I_{A_O} \geq 0$, then SCB's thermometer code $T_O=0$ is initiated and concurrently the analog signal $I_{A_O}=I_{A_I}-I_{A_R}/m$ is applied as the analog input to a next SCB. If $I_{A_O}<0$, then the thermometer digital code $T_O=1$ is initiated and $I_{A_O}=0$ is applied as the input to a next SCB. Cascading plurality of SCBs, where one SCB's analog output communicates with the next SCB's input, would arrange a TiADC.

Accordingly, utilizing SCM in cascade of SCBs to make a TiADC can be explained with the following equations:

$$I_{A_{O_j}} = I_{A_{I_{j+1}}} = \begin{cases} \sum_{j=1}^{m-1}\left[I_{A_{I_j}} - \frac{I_{A_{R_j}}}{m}\right], & I_{A_{O_j}} \geq 0 \\ 0, & I_{A_{O_j}} < 0 \end{cases} \quad \text{Equation 1}$$

$$T_{O_j} = \begin{cases} 0, & I_{A_{O_j}} \geq 0 \\ 1, & I_{A_{O_j}} < 0 \end{cases} \quad \text{Equation 2}$$

For $$I_{A_{O_j}} = I_{A_{I_{j+1}}} = \sum_{j=1}^{m-1}\left[I_{A_{I_j}} - \frac{I_{A_{R_j}}}{m}\right] \text{ note that } I_{A_{I_1}}$$

is the first input to the first SCB (which is effectively the analog input signal to the TiADC).

Note that the practical upper limit for $m=2^{16}$, which could be achievable by trimming or calibration of the iADC, but common applications could have a range of $m=2^4$ to $m=2^{12}$. For clarity of this disclosure's description and brevity's sake, the embodiments in this disclosure are illustrated with $D=3$ and $m=2^D=2^3=8$, and such illustrations are by way of example, and not by way of limitation.

For example, for a 3-bit binary ADC, there are $m-1=2^3-1=7$ bits of thermometer digital output codes $T_{O_1}$ to $T_{O_7}$, and there are $m-1=7$ segments of analog reference input signals $$\frac{I_{R_1}}{m} \text{ to } \frac{I_{R_7}}{m}$$

with each segment equally weighted at value of $$\frac{I_R}{m}$$

to provide the ADC with a linear transfer function. Each of the $$\frac{I_{R_1}}{m} \text{ to } \frac{I_{R_7}}{m}$$

are inputted to the $SCC_1$ to $SCC_7$, respectively, which generate the $T_{O_1}$ to $T_{O_1}$ digital output signals, respectively.

As $I_{A_I}$ is increased in value, in increments of $I_R/m$, from zero scale to full scale (equal in value to that of $I_R$), the SMC illustrated by equations 1 and 2 above provide the following analog and digital inputs and outputs:

If $I_{A_I} \geq \frac{1I}{m} \therefore I_{A_{I_2}} = I_{A_{O_1}} = I_{A_I} - \frac{I_{R_1}}{m} > 0 \therefore T_{O_1}=0, T_{O_{2,3,4,5,6,7}}=1$ If $I_{A_I} \geq \frac{2I_R}{m} \therefore I_{A_{I_3}} =$ $I_{A_{O_2}} = I_{A_{I_2}} - \frac{I_{R_2}}{m} = I_{A_I} - \left(\frac{I_{R_1}}{m} + \frac{I_{R_2}}{m}\right) > 0 \therefore T_{O_{2,1}}=0, T_{O_{3,4,5,6,7}}=1$ If $I_{A_I} \geq \frac{3I_R}{m} \therefore I_{A_{I_4}} = I_{A_{O_3}} =$ $I_{A_{I_3}} - \frac{I_{R_3}}{m} = I_{A_I} - \left(\frac{I_{R_1}}{m} + \frac{I_{R_2}}{m} + \frac{I_{R_3}}{m}\right) > 0 \therefore T_{O_{3,2,1}}=0, T_{O_{4,5,6,7}}=1$ If $I_{A_I} \geq \frac{4I_R}{m} \therefore I_{A_{I_5}} = I_{A_{O_4}} = I_{A_{I_4}} - \frac{I_{R_4}}{m} =$ $I_{A_I} - \left(\frac{I_{R_1}}{m} + \frac{I_{R_2}}{m} + \frac{I_{R_3}}{m} + \frac{I_{R_4}}{m}\right) > 0 \therefore T_{O_{4,3,2,1}}=0, T_{O_{5,6,7}}=1$ If $I_{A_I} \geq \frac{5I_R}{m} \therefore I_{A_{I_6}} = I_{A_{O_5}} = I_{A_{I_5}} - \frac{I_{R_5}}{m} =$ $I_{A_I} - \left(\frac{I_{R_1}}{m} + \frac{I_{R_2}}{m} + \frac{I_{R_3}}{m} + \frac{I_{R_4}}{m} + \frac{I_{R_5}}{m}\right) > 0 \therefore T_{O_{5,4,3,2,1}} = 0, T_{O_{6,7}}=1$ If $I_{A_I} \geq \frac{6I_R}{m} \therefore I_{A_{I_7}} = I_{A_{O_6}} = I_{A_{I_6}} - \frac{I_{R_6}}{m} =$ $I_{A_I} - \left(\frac{I_{R_1}}{m} + \frac{I_{R_2}}{m} + \frac{I_{R_3}}{m} + \frac{I_{R_4}}{m} + \frac{I_{R_5}}{m} + \frac{I_{R_6}}{m}\right) > 0 \therefore T_{O_{6,5,4,3,2,1}} = 0, T_{O_7}=1$ If $I_{A_I} \geq \frac{7I_R}{m} \therefore I_{A_{I_8}} = I_{A_{O_7}} = I_{A_{I_7}} - \frac{I_{R_7}}{m} =$ $I_{A_I} - \left(\frac{I_{R_1}}{m} + \frac{I_{R_2}}{m} + \frac{I_{R_3}}{m} + \frac{I_{R_4}}{m} + \frac{I_{R_5}}{m} + \frac{I_{R_6}}{m} + \frac{I_{R_7}}{m}\right) > 0 \therefore$ $T_{O_{7,6,5,4,3,2,1}} = 0$ For sake of clarity of this disclosure's description, the lines above are ended at the $I_{A_I}$ line but they can continue for higher resolution iADCs with higher number of thermometer (or binary) output codes.

Another SCM is illustrated in FIG. 6B. Here, the SCB (that utilizes this SCM) compares $I_{A_I}$ with $I_{A_R}/m$, and generates their difference $I_{A_O}=I_{A_I}-I_{A_R}/m$. If $I_{A_O} \geq 0$, then a thermometer code $T_O=0$ is initiated and $I_{A_O}=I_{A_P}=I_{A_I}-I_{A_R}/m$ is applied as the input to another next SCB. If $I_{A_O}<0$, then the thermometer digital code $T_O=1$ is initiated, and $I_{A_O}=I_{A_P}=0$ is applied as the input to another next SCB. Moreover, as it will be explained later, when $I_{A_O}<0$, then $I_{A_N}=I_{A_R}/m-I_{A_I}$, and information contained in each SCB's $A_N$ port is utilized to generate the analog residual analog least significant portion (RALSP). This feature provides for implementing multistage higher resolution iADC cost effectively. As reminder, the signal terms $I_{A_R}$ and $I_R$ can be used interchangeably throughout this disclosure, unless otherwise specified. Again, each SCB corresponds to SCC which is a transistor level embodiment of SCB.

For example, for a 3-bit ADC (i.e., D=3), there are $2^3-1=7$ segments of reference signals, and with $m=2^3$ then each segmented reference signal is $I_{A_R}/2^3=I_{A_R}/8$. A TiADC in this example is comprised of $2^D-1=2^3-1=7$ SCBs. For example for a 7 thermometer bit (3 binary bits) TiADC, applicable to either FIG. 6A or FIG. 6B, there are 7 segments of reference signal $$I_{A_{R_1}}/8 \text{ to } I_{A_{R_7}}/8$$

(equally weighted at value of $I_{A_R}/8$) inputted to seven SCBs, wherein for example, $$I_{A_{R_1}}/8 \text{ to } I_{A_{R_7}}/8$$

are inputted to $SCB_1$ through $SCB_7$, respectively. The cascade of seven SCBs are successively placed in a chain where the output signal $$I_{A_{O_1}}$$

of $SCB_1$ is fed onto the input port $A_{I_2}$ of $SCB_2$, and $$I_{A_{O_2}}$$

of $SCB_2$ is fed onto the input port $A_{I_3}$ of $SCB_3$, and so on until the output signal $$I_{A_{O_6}}$$

of $SCB_6$ is fed onto the input port $A_{I_7}$ of $SCB_7$.

The $T_{O_1}$ through $T_{O_7}$, generated from the seven successive $SCB_1$ through $SCB_7$, are the successive digital thermometer output codes representing the digital format of the iADC's analog input signal. The seven $T_O$ s can be encoded to generated other digital output formats such as binary ($D_O$) or gray ($G_O$) codes that are digital representation of the iADC's analog input signal.

In the case of FIG. 6B, the information generated in $$I_{A_{N_1}}$$

through $$I_{A_{N_7}}$$

signals of successive $SCB_1$ through $SCB_7$ are utilized to construct the RALSP signal, or $I_{A_L}$, for utilization of TiADC in multi-stage iADCs, which is explained later in this disclosure.

As mentioned earlier, the embodiments disclosed in this application generally operate in current mode, wherein analog inputs (e.g., $A_I$, $A_R$) and analog outputs (e.g., $A_O$, $A_N$, $A_L$) carry current signals (e.g., $I_I$ or $I_{A_I}$, $I_R$ or $I_{A_R}$, $I_{A_L}$, $I_{A_O}$, $I_{A_N}$, etc).

Considering the 3-bit TiADC example, note that for TiADC embodiments in this disclosure, $I_{A_I}$ is inputted onto the first SCB when it is compared with reference signal value of $$\frac{I_R}{8}$$

and the comparisons ripple through successively and incrementally (one $$\frac{I_R}{8}$$

at a time) to the seventh SCB where $I_{A_I}$ is effectively compared with final and cumulative reference signal value of $$\frac{7I_R}{8}.$$

Alternatively, $I_{A_I}$ can inputted onto the fourth SCB where it can be compared with the cumulative half scale reference signal value of $$\frac{4I_R}{8}.$$

At this point, if the SCB's compare sign is positive, then the next comparisons would ripple up to the fifth SCB and from there it incrementally ripples up (one $$\frac{I_R}{8}$$

at a time) to the seventh SCB where $I_{A_I}$ is effectively compared with cumulative reference signal value of $$\frac{7I_R}{8}.$$

Conversely, If the compare sign is negative, then the next comparisons would ripple down to the third SCB and then incrementally ripple down (one $$\frac{I_R}{8}$$

at a time) to the first SCB where $I_{A_I}$ is effectively compared with reference signal value of $$\frac{I_R}{8}.$$

In summary, the following benefits can be attained for an TiADC that arranges its' thermometer current reference network in accordance with the SCM:

First, the linearity of TiADC can be improved by lowering the sensitivity of the ADC's reference network to normal and random (non-systematic) mismatch errors in CMOS fabrication. An ADC's non-linearity is primarily caused by the random (non-systematic) but normal component mismatch, between components used in the ADC, in silicon manufacturing. Utilizing SCM, the disclosed thermometer current reference network is arranged to operate based on the basis of mathematical function of 'summation'.

The above mentioned equations 1 and 2, applied to a 3-bit iADC example, demonstrate that as the input signal to an TiADC increase from value of $$\frac{I_R}{8}$$

to value of $$\frac{7I_R}{8},$$

the $SCB_1$ outputs $T_{O1}$ after comparing $$I_{A_{I_1}}$$

of $SCB_1$ with the first segment of reference signal $$\frac{I_{R_1}}{8}.$$

The comparison between the input signal to a TiADC and its' thermometer current reference network based on the SCM, effectively involves increasing the reference signal incrementally one $\frac{I_R}{8}$ at a time, starting from $\frac{I_{R_1}}{8}$ segment and ending with the cumulative $\frac{I_{R_1}}{8} + \frac{I_{R_2}}{8} + \frac{I_{R_3}}{8} + \frac{I_{R_4}}{8} + \frac{I_{R_5}}{8} + \frac{I_{R_6}}{8} + \frac{I_{R_7}}{8}$.

Accordingly, the respective plurality of $T_O$ s are generated by SCBs.

ADC's non-linearity due to the random statistical contribution (non-systematic) of mismatches, between the current reference segments in the thermometer current network, are accumulated by the square root of the sum of the squares of such the random (i.e., non-systematic) mismatches attributed to the number of current reference segments (set by $2^D-1=T-1$). In other words, the accumulated random statistical contributions of random mismatches between the current reference segments is reduced by about $\sqrt{2^D}=\sqrt{T}$, where the number of current reference segments of a thermometer network are $2^D-1=T-1$.

Let's for example, consider current reference segments in a TiADC are made of FET based current sources, where they have a random but normal mismatch of $\sigma=2\%$. For a 3-bit TiADC, let's consider there are $2^3-1=7$ reference current segments, and each having equal values of $I_R/2^3$. Utilizing SCM in TiADC would reduce the ADC's non-linearity to $\sigma/\sqrt{2^D}=2\%/\sqrt{8}=0.7\%$ that is attributed to the statistical distribution of the random mismatch between FETs in the in the seven current reference segments of the thermometer network of TiADC.

Second, the disclosed TiADC is inherently monotonic (e.g., to the degree of precision attained by the MSB TiADC) since for (e.g., 3-MSB) bit transitions, either a reference current segment is added to (or subtracted from) the previous one. This is again, due to the inherent benefit of the disclosed TiADC (utilizing the SCM) which effectively behaves like a thermometer current reference network that function based on summation.

Third, SCM can be implemented on a multi-stage iADC which utilizes TiADC for the MSB bank (e.g., first 3-MSBs) and then utilizing smaller, faster, and less accurate iADC for subsequent stages (e.g., next 6-LSBs). For a 9-bit iADC, the first stage 3-bit iADC need to be 9 bits accurate or 0.19% accurate. A higher accuracy iADC can be achieved utilizing the TiADC (of SCM) for the first stage. The second stage 6-bit iADC need only be 6-bit accurate or 1.5% for the whole 9-bit resolution iADC to still attain 9-bits of accuracy or about 0.19%. Therefore, the second stage can be made with smaller FETs, for example, to optimize for smaller size (lower cost), faster dynamic performance instead of optimizing for accuracy.

Fourth, TiADC with non-linear transfer function can be arranged based on this disclosure. This is accomplished by programming (by different scaling of) the current reference segments of the TiADC according to an objective non-linear transfer function.

Next section provides the descriptions for a number of SCCs embodiments (of SCBs) that are illustrated in FIGS. 1A to 1F and FIGS. 1A' to 1G'. Notice that the SCM here is applied in current mode SCCs. Some of the benefits of the disclosed SCC embodiments are summarized below:

First, the signal conditioning function is chiefly in current mode. Operations in the current mode is inherently fast that are accompanied with small voltage swings at signal nodes of SCC, which enables operating the SCC at high speed, low power supplies, and low currents.

Second, simple SCC provide analog signal conditioning, including generating the difference between segmented reference input currents ($I_{A_R}/m$ or $I_R/m$) and input current ($I_{A_I}$). The differencing function performed by the SCC is concurrent with the comparison of $I_R/m$ with $I_{A_I}$, which provides digital $T_O$ output code. Besides providing asynchronous clock free analog input to digital output conversion, the disclosed SCC performs concurrent analog differencing and digital comparison, which provides dynamic response benefits wherein the iADC's digital output accuracy degrades gradually and not abruptly as a function of increasing frequency of iADC's input signal.

Third, next sections explain how the SCC is less sensitive to peripheral non-idealities. This is because of the high-input impedance of SCC when $I_R/m$ and $I_{A_I}$ are in balance, the SCC operating in current mode, and the high-output impedance of current sources $I_R/m$ and $I_{A_I}$ feeding the input of SCC. The steering FETs do not impede accuracy of SCC, since the said FETs just act as conduits to pass the current difference between $I_R/m$ and $I_{A_I}$ through. Also, non-idealities of amplifiers (utilized in SCC to sharpen $I_R/m-I_{A_I}$ zero-crossing) would not impede the accuracy of SCC. Moreover, non-idealities of SCC's comparator (that generates $T_O$) would not compromise SCC's accuracy.

Fourth, steering FETs, amplifiers, and comparators can be optimized for small size, low current consumption, and higher speed, instead for accuracy.

Fifth, the SCC can concurrently perform both the analog signal conditioning of subtracting $I_R/m$ from $I_{A_I}$ and generates $T_O$ which is the comparison between $I_R/m$ and $I_{A_I}$. As mentioned earlier, concurrent analog and digital computation is beneficial for the dynamic performance of iADC that utilizes SCC.

Sixth, the SCC's can utilize small amplifiers with small steering FETs in its negative feedback loop, to form a current feedback amplifier. Such configuration, helps speed of SCC since it runs in current feed-back mode when $I_R/m$ from $I_{A_I}$ are off balance. This amplifier in SCC helps improve its' zero-crossing profile when $I_R/m$ and $I_{A_I}$ values are in balance.

Seventh, the terminal voltage of $I_{A_I}$ and that of $I_R/m$ can track the $V_{1+}$ of SCC's amplifier. A such, systematic mismatch due to $V_{DS}$ differences between segmented current sources can be minimized, when plurality of such SCCs are utilized in for example in a TiADC, which helps improving the TiADC linearity.

Eighth, as described earlier, the SCC can utilize a comparator to generate its digital output signal, $T_O$. Equalizing comparator's $V_{I+}$, among plurality of SCCs, also helps with a more consistent $T_O$ signal profile, across normal manufacturing variations and operating conditions.

Ninth, driving the comparator $V_{I-}$ with an amplifier's $V_O$, provides some input voltage overdrive, which also sharpens the digital response of comparator.

Tenth, utilizing differential input amplifier and comparator in the SCC, would improve the noise rejection for SCC.

Eleventh, to bias the steering FETs' gate nodes or input nodes of amplifier and comparator, the bias voltages needed in SCC can be generated by simple scaled diode connected MOSFETs that are shared among plurality of SCC s, which improves matching between multiple SCC and it saves on area and current consumption.

Note that it would be obvious to those disclosed in the art to add hysteresis in the compare functions of SCC to improve noise, and jitter avoid rapid output oscillations. This disclosure would later provide descriptions of TiADC illustrated in FIGS. 3A, 3B, 3C, and 3D, which can utilize the different embodiments of the SCCs below.

Figure 1A:
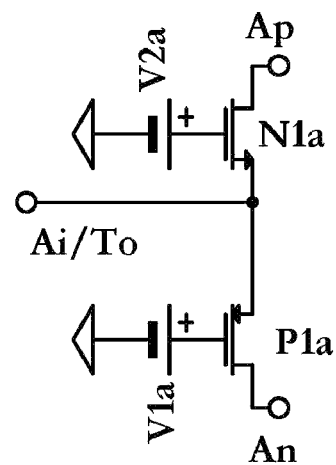
FIG. 1A is a schematic circuit diagram of an embodiment illustrating a SCC
Figure 1A:
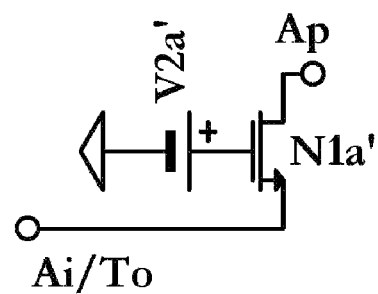

Description of FIGS. 1A and 1A'

FIG. 1A is a schematic circuit diagram of an embodiment illustrating a SCC, which has two analog output terminals ($A_P$ and $A_N$), and one input/output node ($A_I/T_O$), which is both an analog current input node and a digital voltage output node.

Let's consider the case when an analog input current signal ($I_{A_I}$) flows out, and an analog segmented reference signal ($I_R/m$) flows in the $A_I/T_O$ node.

The $V_{1A}$ and $V_{2A}$ are bias voltages of steering FETs ($P_{1A}$ and $N_{1A}$) to keep the FETs off such that the $A_I/T_O$ node impedance ($Z_{A_I/T_O}$) remain high when $I_R/m$ and $I_{A_I}$ are near balance.

Also note the output impedance $Z_{A_I/T_O}$ is also high, considering the high output impedance of current sources $I_R/m$ and $I_{A_I}$ that are coupled to the $A_I/T_O$ node. As such, a slight imbalance between $I_R/m$ and $I_I$ current signals (applied onto a high $Z_{A_I/T_O}$) can cause a large voltage swing at $A_I/T_O$ node.

If $I_{A_I}>I_R/m$, then $P_{1A}$ remains off and $I_{A_N}\cong 0$. Also, when $I_{A_I}>I_R/m$, then the $A_I/T_O$ terminal voltage is pulled-down (and clamped to $V_{2A}-Vgs_{N_{1A}}$) when $N_{1A}$ is turned on, and $I_{A_I}-I_R/m$ flows through $N_{1A}$ and out of $A_P$ terminal, or $I_{A_P}\cong I_{A_I}-I_R/m$. Note that here, the voltage at $A_I/T_O$ node is $V_{A_I/T_O}$=low.

If $I_{A_I}<I_R/m$, then $N_{1A}$ remains off and $I_{A_P}\cong 0$. Also, when $I_{A_I}<I_R/m$, then the $A_I/T_O$ terminal voltage is lifted (until clamped at $V_{1A}-Vsg_{P_{1A}}$) when $P_{1A}$ is turned on, and where $I_R/m-I_{A_I}$ flows through $P_{1A}$ and out of $A_N$ terminal, or $I_{A_N}\cong I_R/m-I_{A_I}$. Note that here, the voltage at $A_I/T_O$ node is $V_{A_I/T_O}$=high.

As stated earlier, the source input impedance of $N_{1A}$ and $P_{1A}$ at $A_I/T_O$ terminal stays high (i.e., $Z_{A_I/T_O}$ is high) while $N_{1A}$ and $P_{1A}$ remain off, which is when $I_R/m$ and $I_{A_I}$ are near balance. A small difference between $I_R/m$ and $I_{A_I}$ causes their net difference ($I_{A_N}$ or $I_{A_P}$) to flow-in or out of $A_N$ or $A_P$ terminals, and lower the $Z_{A_I/T_O}$.

Moreover, a comparison signal (un-buffered digital equivalent $T_O$) generated by $Z_{A_I/T_O} \times (I_R/m-I_{A_I})$ which causes $V_{A_I/T_O}$ to swing between the clamped values programmed by $V_{2A}-Vgs_{N_{1A}}$ and $V_{1A}-Vsg_{P_{1A}}$. The $V_{1A}$ and $V_{2A}$ values need to be programmed for $V_{A_I/T_O}$ to have wide enough voltage swing (to initiate a digital equivalent $T_O$). Also, the choice for $V_{1A}$ and $V_{2A}$ values impacts the on-off profile for steering FETs, $P_{1A}$ and $N_{1A}$. The on-off profiles of steering FETs impact the speedy and consistency of steering the $I_R/m$ and $I_{A_I}$ difference, over normal variations in manufacturing process and operating conditions. Utilization of SCC, of FIG. 1A in TiADC illustrated in FIGS. 3A and 3D will be discussed later.

FIG. 1A' is a schematic circuit diagram of another embodiment illustrating a SCC, which has only one analog output terminals, $A_P$, and one input/output terminal, $A_I/T_O$. The SCC embodiment in FIG. 1A' is similar to that of FIG. 1A, but for elimination of one steering FET $P_1$ and its associated bias voltage source $V_{1A}$. Also, there is no $A_N$ terminal, which simplifies the SCC further and reduces its area and cost.

In FIG. 1A', if $I_{A_I}>I_R/m$ then the $A_I/T_O$ terminal voltage is pulled-down (and clamped to $V_{2A}-Vgs_{N_{1A'}}$) when $N_{1A'}$ is turned on, and where $I_{A_I}-I_R/m$ flows through $N_{1A'}$ and out of $A_P$ terminal, or $I_{A_P}\cong I_I-I_R/m$. Note that here, the voltage at $A_I/T_O$ node is $V_{A_I/T_O}$=low.

When $I_{A_I}<I_R/m$ then the $A_I/T_O$ terminal voltage is lifted, which turns $N_{1A'}$ off, and $I_{A_P}\cong 0$. Note that here, the voltage at $A_I/T_O$ node is $V_{A_I/T_O}$=high. Description for utilizing the SCC, of FIG. 1A' in TiADC illustrated in FIGS. 3B and 3C will be explained later.

Figure 1B:
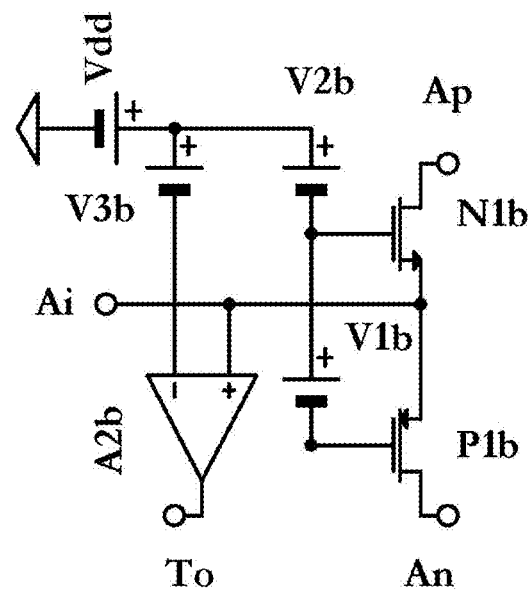
FIG. 1B is a schematic circuit diagram of another embodiment illustrating a SCC FIG. 1B' is a schematic circuit diagram of another embodiment illustrating a SCC
Figure 1B:
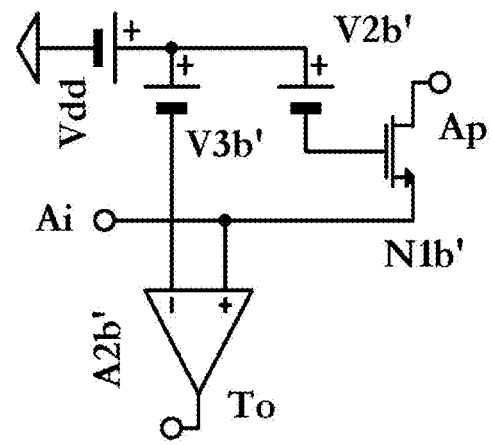

Description of FIGS. 1B and 1B'

FIG. 1B is a schematic circuit diagram of another embodiment illustrating a SCC, which also has two analog output terminals, $A_P$ and $A_N$, one digital output terminal, $T_O$, and one analog input terminal $A_I$. The comparator, $A_{2B}$, improves the $T_O$ (buffered digital) output signal profile.

In FIG. 1B, when $I_{A_I}>I_R/m$, $P_{1B}$ remains off and $I_{A_N}\cong 0$. Here, the $A_I$ terminal voltage, $V_{A_I}$, is pulled-down by the net $I_{A_I}-I_R/m$ until steering FET $N_{1B}$ is turned on at $V_{A_I}\cong V_{DD}-V_{2B}-Vgs_{N_{1B}}$ when $I_{A_P}\cong I_{A_I}-I_R/m$. Concurrently, here $T_O=0$.

Also, in FIG. 1B, when $I_{A_I}<I_R/m$, $N_{1B}$ remains off and $I_{A_P}\cong 0$. Here, $V_{A_I}$ is lifted up by the net $I_R/m-I_{A_I}$ until steering FET $P_{1B}$ is turned on at $V_{A_I}\cong V_{DD}-V_{2B}-V_{1B}+Vsg_{P_{1B}}$, when $I_{A_N}\cong I_R/m-I_{A_I}$. Conversely, here $T_O=1$.

Note that the impedance $Z_{A_I}$ is high which causes $V_{A_I}$ to swing when a small difference ($\Delta i$) between $I_R/m$ and $I_{A_I}$ values is applied ($\Delta i=I_R/m-I_{A_I}$) at the $A_I$ terminal. The bias voltage $V_{3B}$ at the negative input terminal of comparator $A_{2B}$ can for example be programmed to the middle of the $V_{A_I}$ swing range $V_{DD}-V_{2B}-Vgs_{N_{1B}}$ and $V_{DD}-V_{2B}-V_{1B}+Vsg_{P_{1B}}$.

Additional benefits of this SCC to those outlined earlier is a more stable response profile for the $T_O$ signal, which is buffered from the $A_I$ terminal via the $A_{2B}$ comparator that generates a rail-to-rail digital $T_O$ output signal. Description for utilizing the SCC of FIG. 1B in TiADCs will be provided later.

FIG. 1B' is a schematic circuit diagram of another embodiment illustrating a signal conditioning circuit (SCC), which has one output terminals, $A_P$, one digital output terminal, $T_O$, and one analog input terminal, $A_I$. The SCC embodiment in FIG. 1B' is similar to that of FIG. 1B, but for elimination of $P_{1C}$ steering FET, and without the $A_N$ terminal.

In FIG. 1B', when $I_{A_I}>I_R/m$ then the net of $I_{A_I}-I_R/m$ flows through $N_{1B'}$ and out of $A_P$ terminal, or $I_{A_{P_B}}-I_R/m$. Accordingly, $T_O=0$.

When $I_{A_I}<I_R/m$ then the $A_I$ terminal voltage is lifted, which turns $N_{1B'}$ off, and $I_{A_P}\cong 0$, and thus $T_O=0$. Description for utilizing, the SCC of FIG. 1B' in TiADC illustrated in FIG. 3C will be provided later.

Figure 1C:
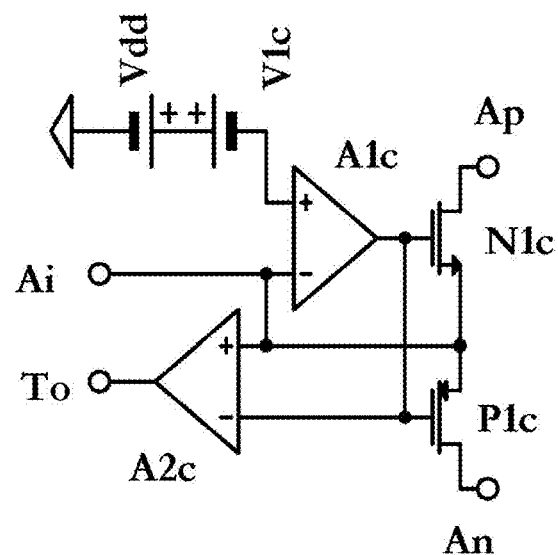
FIG. 1C is a schematic circuit diagram of another embodiment illustrating a SCC FIG. 1C' is a schematic circuit diagram of another embodiment illustrating a SCC
Figure 1C:
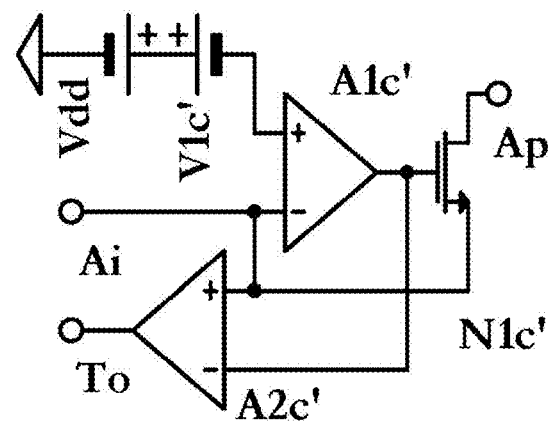

Description of FIGS. 1C and 1C'

FIG. 1C is a schematic circuit diagram of another embodiment illustrating a SCC, which also has two analog output terminals $A_P$ and $A_N$, one digital output terminal $T_O$, and one analog input terminal $A_I$.

The current steering FETs, $N_{1C}$ and $P_{1C}$, are placed in the negative feedback loop of an amplifier $A_{1C}$, making it behave like a current input feedback amplifier. The comparison between $I_{A_I}$ and $I_R/m$ occurs at the $A_I$ node (that is also the inverting input terminal of $A_{1C}$). The $V_{A_I}$ tracks the positive input terminal of $A_{1C}$, which in this embodiment is set to $V_{tc}=V_{DD}-V_{1C}$.

The output of $A_{1C}$ amplifier drives the gates terminals of steering FETs $N_{1C}$ and $P_{1C}$, which steer $I_{A_P}$ and $I_{A_N}$ current signals with a sharper zero-crossing profile (when $I_{A_I}$ and $I_R/m$ are near balance), due in-part to the $A_{1C}$'s gain.

Moreover, output of $A_{1C}$ amplifier, which can have a wide output voltage swing, and the $A_I$ node of SCC (whose steady state voltage tracks $V_{tc}$) are applied to the inputs of the $A_{2C}$ comparator. Thus, the $A_{2C}$ comparator can receive a wider differential voltage overdrive (around $V_{tc}$) at its inputs and generate a more consistent $T_O$ response.

Note that neither the gain nor the accuracy of $A_{1C}$, nor the accuracy of comparator $A_{2C}$ are critical to the accuracy of SCC. As such, $A_{1C}$ and $A_{2C}$ can be made with smaller geometry MOSFETs to optimize for small size, low current, low capacitance, and high-speed.

In FIG. 1C when $I_{A_I}>I_R/m$, $P_{1C}$ remains off and $I_{A_N}\cong 0$, and $V_{A_I}$ tend to fall. Here, the net $I_{A_I}-I_R/m$ applied to $A_I$ (that is also connected to the negative input terminal of amplifier $A_{1C}$) causes $A_{1C}$'s output to rise and turn steering FET $N_{1C}$ on, which steers the net current onto $N_{1C}$ where $I_{A_P}\cong I_{A_I}-I_R/m$. Here, $T_O=0$.

When $I_{A_I}<I_R/m$, $N_{1C}$ remains off and $I_{A_P}\cong 0$, and $V_{A_I}$ tend to rise. Here, the net $I_R/m-I_{A_I}$ applied to the $A_I$ terminal which causes $A_{1C}$'s output to fall and turn steering FET $P_{1C}$ on, which steers the net current $I_R/m-I_{A_I}\cong I_{A_N}$ through $P_{1C}$. Here, the $T_O=1$.

Additional benefits of SCC illustrated in FIG. 1C to those outlined earlier are:

First, $V_{tc}$ sets the steady state DC bias voltage at the $A_I$ input terminal, where the $I_{A_I}$ and $I_R/m$ current signals are applied. Ability to program $V_{tc}$ provides flexibility for the implementation of input signal current source, $I_{A_I}$, whose current output terminal may have voltage restrictions. Moreover, systematic matching between plurality of segmented reference current sources running at $I_R/m$, remains unimpeded, since their drain voltage terminals (connected to the $A_I$ port) are subjected to the same $V_{DS}$, and near $V_{tc}$ at steady-state.

Second, and as noted earlier, near steady-state conditions, $V_{A_I}=V_{tc}$ which is $V_{I_+}$ of $A_{2C}$ comparator. Thus, by providing a pre-programmed $V_{tc}$ that is shared among plurality of SCCs, a more matched response between plurality of SCCs, attributed to their respective $A_{2C}$ comparators and $T_O$ ports, can be achieved. Description for utilizing the SCC of FIG. 1C in TiADC illustrated in FIG. 3A, will be provided later.

FIG. 1C' is a schematic circuit diagram of another embodiment illustrating a SCC, which has one output terminals, $A_P$, one digital output terminal, $T_O$, and one analog input terminal, $A_I$. The SCC embodiment in FIG. 1C' is similar to that of FIG. 1C, but without the $P_{1C}$ FET and no $A_n$ terminal.

Note that the amplifier, $A_{1C'}$ and steering FET $N_{1C'}$ in $A_{1C'}$'s negative feed-back loop, form a current input feed-back amplifier with $A_I$ as its input.

In FIG. 1C', when $I_{A_I}>I_R/m$ then the net of $I_{A_I}-I_R/m$ flows through $N_{1C'}$ and out of $A_P$ terminal where Ihd $A_P\cong I_{A_I}-I_R/m$. Here, $T_O=0$.

When $I_{A_I}<I_R/m$ then the $A_I$ terminal voltage is lifted above $V_{tc}$. Accordingly, the amplifier $A_{1C'}$ output falls, which turns $N_{1C'}$ off ($I_{A_P}\cong 0$). Accordingly, $T_O=1$. Description for utilizing the SCC of FIG. 1C' in TiADCs will be provided later.

Figure 1D:
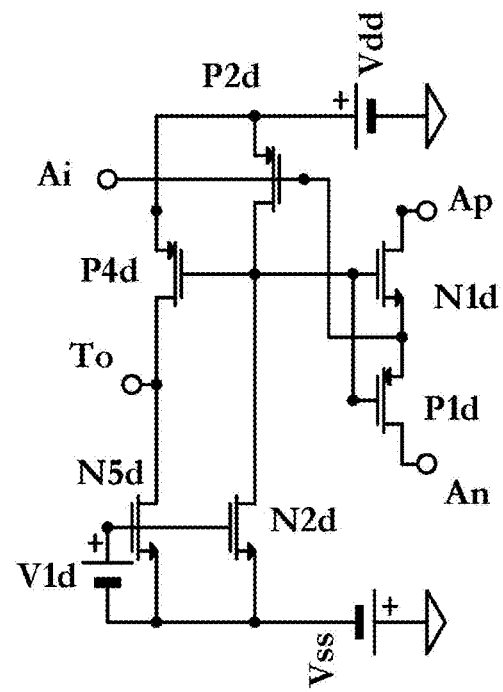
FIG. 1D is a schematic circuit diagram of another embodiment illustrating a SCC that utilizes FIG. 1C.
Figure 1D:
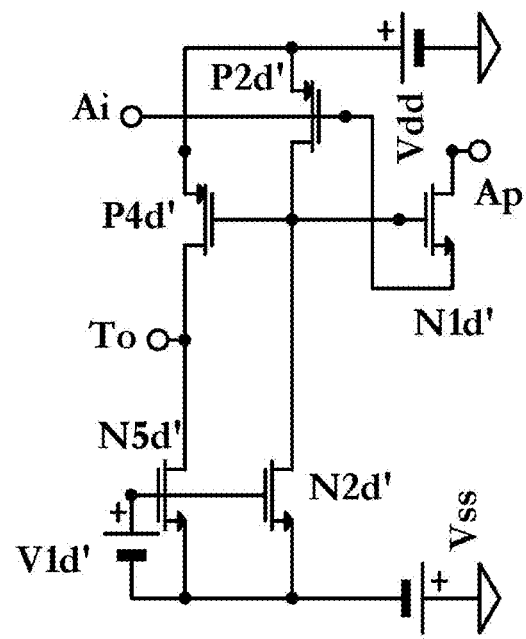

Description of FIGS. 1D and 1D'

FIG. 1D is a schematic circuit diagram of another embodiment illustrating a SCC, which also has two analog output terminals, $A_P$ and $A_N$, one digital output terminal, $T_O$, and one analog input terminal, $A_I$.

A two FET inverting common source amplifier ($A_{1D}$) composed of $P_{2D}$ and current source $N_{2D}$ (biased with $V_{1D}$ which can be share among plurality of SCCs) in FIG. 1D can be considered as an embodiment for the amplifier $A_{1C}$ depicted in FIG. 1C. Also, the output of $A_{1D}$ amplifier drives a two FET inverting comparator ($A_{2D}$), to generate the digital $T_O$ signal, composed of $P_{4D}$ and current source $N_{5D}$ (biased with $V_{1D}$) in FIG. 1D, which can be considered as an embodiment for the comparator $A_{2C}$ depicted in FIG. 1C.

Note that steering FETs $P_{1D}$ and $N_{1D}$ are arranged in a feed-back loop between the amplifier $A_{1D}$'s output and its inverting input, whose combination form the current input feedback amplifier $A_{1D}$, with a near steady-state input bias voltage $V_{A_I}\cong V_{DD}-Vsg_{P_{2D}}$.

As explained earlier, the gain and accuracy of $A_{1D}$ amplifier and $A_{2D}$ comparator are not critical for the accuracy of SCC, and thus $P_{2D}$ and $P_{4D}$ can be sized with smaller geometry MOSFETs to optimize for lower cost, low current, low capacitance, and high-speed.

Also note that near the zero-crossing zone, the net current difference $I_{A_I}-I_R/m$ is small. Thus, here the current ($I_D$), and gate to source voltage ($V_{GS}$) for both $N_{1D}$ and $P_{1D}$ are also small. As such, with proper operating current ($Id_{P2D}=Id_{N2D}$) and scaling of $P_{2D}$, while near steady-state, the $A_{1D}$ amplifier can maintain its regulation near zero-crossing, considering that $Von_{P_{2D}}<Vds_{P_{2D}}=Vsg_{P_{2D}}-Vgs_{N_{1D}}$.

In FIG. 1D, when $I_{A_I}$ is farther from zero-crossing zone where for example $I_{A_I}>I_R/m$, then $P_{1D}$ remains off and $I_{A_N}\cong 0$. Here, the larger net $I_{A_I}-I_R/m$ that is applied to the $A_I$ node can turn $P_{2D}$ hard on and cause $Vds_{P_{2D}}$ to shrink to near zero, where $P_{2D}$ can enter the triode region, and the amplifier $A_{1D}$ stops regulating. However, the larger net $I_{A_I}-I_R/m$ can continue pulling down on the $A_I$ node, which continues to turns $P_{1D}$ more off and turn $N_{1D}$ more on, which sustains SCC's proper operation in steering the net current onto $N_{1D}$ where $I_{A_P}\cong I_{A_I}-I_R/m$. Accordingly, the $T_O=0$.

In FIG. 1D, when $I_{A_I}<I_R/m$, the net $I_R/m-I_{A_I}$ applied to the $A_I$ terminal, causes $P_{2D}$ to starve when $N_{2D}$ pulls down on the gate terminal of $N_{1D}$, $P_{1D}$, $P_{4D}$. Thus, $P_{1D}$ turns on more and $N_{1D}$ turns off, and $P_{4D}$ turns on (which lifts $T_O$). As such, $I_R/m-I_{A_I}\cong I_{A_N}$ is steered through $P_{1D}$, and $I_{A_P}\cong 0$. Accordingly, the $T_O=1$.

Additional benefits of this SCC on top of what was outlined earlier are:

First, utilizing the steering FETs, $N_{1D}$ and $P_{1D}$, in the feed-back loop of a two FET current input amplifier, $A_{1D}$, helps with a sharper zero cross-over when $I_{A_I}$ and $I_R/m$ are close in value.

Second, utilizing a two FET current input amplifier, $A_{1D}$, and a two FET comparator $A_{2D}$, enables SCC with a small and low cost implementation of SCC, illustrated in FIG. 1C, which can perform both the analog signal conditioning and the digital comparison for $I_R/m$ and $I_{A_I}$.

Third, $V_{GS}$ of $P_{2D}$, established by its W/L and $I_{DS}$, set the near steady-state $V_{A_I}$ for the segment current sources and input current source where the $I_{A_I}$ and $I_R/m$ current signals are applied. Ability to program $V_{A_I}$ via W/L and $I_{DS}$ of $P_{2D}$ provide flexibility for the implementation of input signal current source, $I_{A_I}$, which could otherwise constrain $I_{A_I}$'s terminal voltage range depending on the end-application.

Fourth, utilizing such SCC in a TiADC, would improve TiADC's linearity since systematic matching between plurality of segmented current sources (running at $I_R/m$) are not compromised. This is because all segmented current source running at $I_R/m$ are subjected to same $V_{DS}$, established near steady-state conditions by $V_{GS}$ of $P_{2D}$.

Fifth, and as explained earlier near steady-state, $V_{GS}$ of $P_{2D}$ sets $V_{A_I}$ which is $V_{I_-}$ of $A_{1D}$. Concurrently, the bias voltage at $V_{I_+}$ of comparator $A_{2D}$, is set by $V_{GS}$ of $P_{4D}$ that initiates the $T_O$ digital output. Thus, (among plurality of SCCs that would be utilized in a TiADC) by programming the scale of W/L and $I_{DS}$ of $P_{2D}$ and $P_{4D}$, the responses for the $A_{2D}$ comparators (and $T_O$) can track each other over normal manufacturing process and operating variations. Description for utilizing the SCC, of FIG. 1D in TiADC illustrated in FIG. 3A, will be provided later.

FIG. 1D' is a schematic circuit diagram of another embodiment illustrating a SCC, which has one output terminals, $A_P$, one digital output terminal, $T_O$, and one analog input terminal, $A_I$. The SCC embodiment in FIG. 1D' is similar to that of FIG. 1D, but without the $P_{1D}$ FET and no $A_N$ terminal. Note that the two FET amplifier (comprised of $P_{2D'}$ and current source $N_{2D'}$ biased via $V_{1D'}$), with the steering FET $N_{1D'}$ configured in its negative feed-back loop, form a current input amplifier with $A_I$ as its input.

In FIG. 1D', when $I_{A_I} > I_R/m$ then the net of $I_{A_I} - I_R/m$ flows through $N_{1D'}$ and out of $A_P$ terminal where $I_{A_P} \cong I_{A_I} - I_R/m$. Here also, $T_O = 0$.

When $I_{A_I} < I_R/m$ then the $A_I$ terminal voltage is lifted, causing $P_{2D'}$ current to decline. Thus, $N_{2D'}$ pulls down on the gate terminal of $N_{1D'}$ and $P_{4D'}$, which turns $N_{1D'}$ off ($I_{A_P} \cong 0$). Here, $T_O = 1$. Description for utilizing the SCC, of FIG. 1D' in TiADCs will be provided later.

Figure 1E:
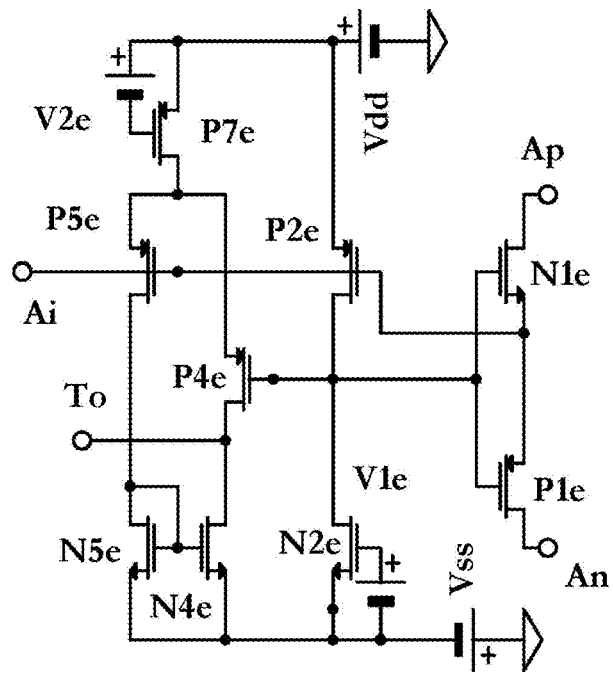
FIG. 1E is a schematic circuit diagram of another embodiment illustrating a SCC that utilizes FIG. 1C.
Figure 1E:
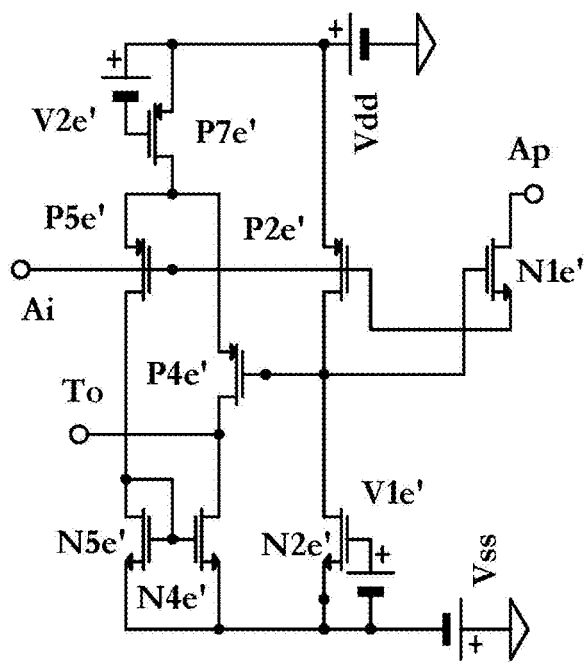

Description of FIGS. 1E and 1E'

FIG. 1E is a schematic circuit diagram of another embodiment illustrating a SCC, which also has two analog output terminals, $A_P$ and $A_N$, one digital output terminal, $T_O$, and one analog input terminal, $A_I$.

Here, there is a two FET inverting common source amplifier ($A_{1E}$) composed of $P_{2E}$ and current source $N_{2E}$ (biased with $V_{1E}$ which can be share among plurality of SCCs that could be utilized in a TiADC). Note that $A_{1E}$ is an embodiment of $A_{1C}$ depicted in FIG. 1C. Also in FIG. 1E, the output of $A_{1E}$ amplifier drives a five FET inverting comparator ($A_{2E}$), comprising of $P_{4E}$ $P_{5E}$ $N_{4E}$, $N_{5E}$, and current source $P_{7E}$ (biased with $V_{2E}$ which can also be share among plurality of SCCs) to generate the digital $T_O$ signal. Also, note that $A_{2E}$ is an embodiment of $A_{2C}$ depicted in FIG. 1C.

Smaller geometry FETs (e.g., $P_{2E}$, $P_{4E}$, $P_{5E}$, $N_{4E}$, $N_{5E}$) can be utilized in $A_{1E}$ and $A_{2E}$ to reduce cost and enhanced dynamic performance, since $A_{1E}$ and $A_{2E}$ are not critical for the accuracy of SCC.

Note that differential inputs of comparator $A_{2E}$ are driven from the input and output of amplifier $A_{1E}$, which provides a wider voltage swing as input over-drive for comparator $A_{2E}$ and helps with power supply rejection.

Also, the steering FETs $P_{1E}$ and $N_{1E}$ with amplifier $A_{1D}$ form the current input feedback amplifier. Note that the near steady-state $V_{A_I} \cong Vgs_{P_{2E}}$ provides some head-room for $I_{A_I}$ (current source) terminal voltage.

Systematic offset between plurality of $I_R/m$ (segmented reference) current sources is reduced when their $V_{DS}$ is equalized by matched $Vgs_{P_{2E}}$ among plurality of SCCs (that could be utilized in a TiADC).

In FIG. 1E, when $I_{A_I} > I_R/m$, then $V_{A_I}$ is pulled down, which turns $P_{2E}$ more on, that pulls up the gate terminals of steering FETs $P_{1E}$ and $N_{1E}$. Hence, $P_{1E}$ turns off more, and $I_{A_N} \cong 0$ while $N_{1E}$ turns on more, and $I_{A_P} \cong I_1 - I_R/m$. Accordingly, $T_O = 0$.

When $I_{A_I} < I_R/m$, then the net $I_R/m - I_{A_I}$ that is applied to the $A_I$ terminal of SCC, causes $P_{2E}$ to starve from current. Hence, $N_{2D}$ pulls down on the gate terminal of $P_{1E}$ and $N_{1E}$, which turns $P_{1E}$ on and $N_{1E}$ off. Thus, $I_R/m - I_{A_I} \cong I_{A_N}$ is steered through $P_{1E}$, and $N_{1E}$ stays off with $I_{A_P} \cong 0$. Accordingly, the $T_O = 1$.

Additional benefits of SCC illustrated in FIG. 1E are:

First, terminal voltages for input and plurality of segmented reference current sources can be set at $V_{A_I}$. Ability to program $V_{A_I}$ by $V_{GS}$ of $P_{2E}$ via its' W/L and $I_{DS}$ provides some flexibility for head-room needed for the input signal current source, $I_{A_I}$.

Second, matched $V_{GS}$ of $P_{2E}$ in plurality of SCC (utilized in TiADC), lowers systematic $V_{DS}$ induced mismatch between plurality of segmented reference current signals, $I_R/m$, which helps with TiADC linearity Third, and as expressed earlier near steady-state, the $V_{GS}$ of $P_{2E}$ sets $V_{A_I}$ that is $V_{1_-}$ of comparator $A_{2E}$. The $V_O$ of $A_{1E}$ drives the $V_{1+}$ of comparator $A_{2E}$. As such, the output of amplifier $A_{1E}$ provides the comparator $A_{2E}$ with wider voltage over-drive at its inputs, which helps $T_O$'s signal response.

Fourth, utilizing a comparator $A_{2E}$ with differential inputs also improves its power supply noise rejection.

Fifth, by programming the scaling of W/L and $I_{DS}$ of $P_{2E}$, the matching and tracking among plurality of SCCs utilized in a TiADC are improved, over normal manufacturing process and operating variations. Hence, for the $A_{2E}$ comparators and the $T_O$ output signals, a more matched response profile can be achieved among plurality of SCCs. The description for utilizing the SCC illustrated in FIG. 1E that is utilized in TiADC illustrated in FIG. 3A will be provided later.

FIG. 1E' is a schematic circuit diagram of another embodiment illustrating a SCC, which has one output terminals, $A_P$, one digital output terminal, $T_O$, and one analog input terminal, $A_I$. The SCC embodiment in FIG. 1E' is similar to that of FIG. 1E, but without the $P_{1E}$ FET and no $A_N$ terminal.

Here, the two FET amplifier, $A_{1E'}$ (comprised of $P_{2E'}$ and current source $N_{2E'}$ biased via $V_{1E'}$), with the $N_{1E'}$ configured in negative feed-back loop of $A_{1E'}$ form a current input amplifier with $A_I$ as its input.

In FIG. 1E', when $I_{A_I} > I_R/m$ then the net of $I_{A_I} - I_R/m$ flows through $N_{1E'}$ and out of $A_P$ terminal where $I_{A_P} \cong I_{A_I} - I_R/m$. Here also, the $T_O = 0$.

When $I_{A_I} < I_R/m$ then the $A_I$ terminal voltage rises, causing $P_{2E'}$ to starve from current. Thus, $N_{2E'}$ pulls down on the gate terminal of $N_{1E'}$ and $P_{4E'}$ (one of the inputs of comparator $A_{2E'}$) which turns $N_{1E'}$ off ($I_{A_P} \cong 0$) and causes $T_O = 1$. Description for utilizing the SCC illustrated in FIG. 1E' that is utilized in TiADCs will be provided later.

Figure 1F:
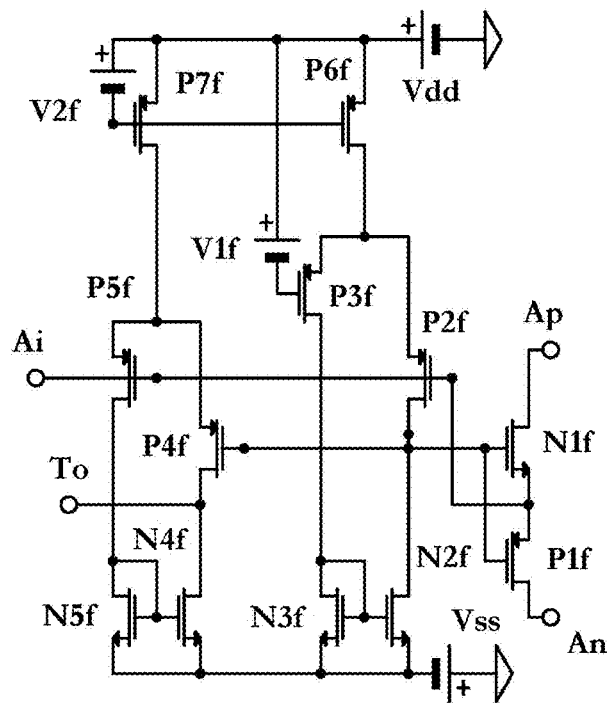
FIG. 1F is a schematic circuit diagram of another embodiment illustrating a SCC that utilizes FIG. 1C.
Figure 1F:
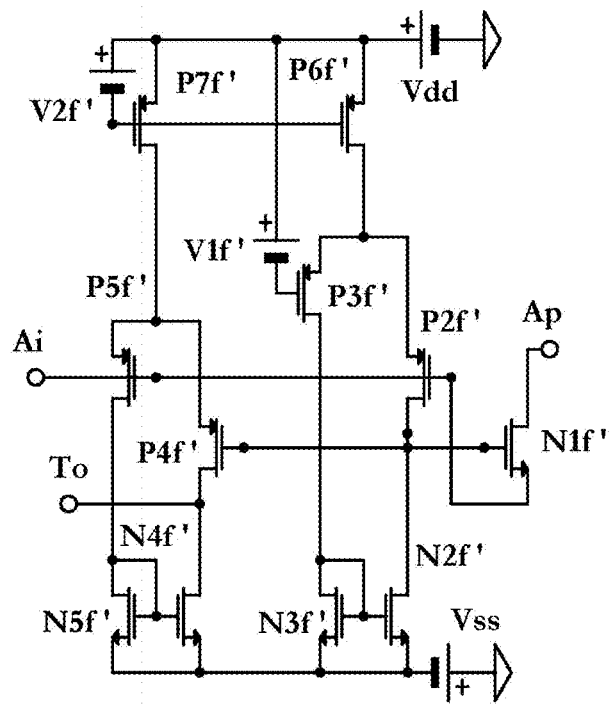

Description of FIGS. 1F and 1F'

FIG. 1F is a schematic circuit diagram of another embodiment illustrating a SCC, similar to FIG. 1C, comprising of transistor level implementation of the amplifier and comparator. FIG. 1F also has two analog output terminals, $A_P$ and $A_N$, one digital output terminal, $T_O$, and one analog input terminal, $A_I$.

Amplifier $A_{1F}$ is comprised of $P_{2F}$, $P_{3F}$, $N_{2F}$, $N_{3F}$, and current source $P_{6F}$ (biased with $V_{2F}$ that can be generated by a diode connected PMOSFET, which can also be share among plurality of SCCs). Amplifier $A_{1F}$ in FIG. 1F is an embodiment of Amplifier $A_{1C}$ in FIG. 1C.

Comparator $A_{2F}$ is comprised of $P_{4F}$, $P_{5F}$, $N_{4F}$, $N_{5F}$, and current source $P_{7F}$ (also biased of the same $V_{2F}$). Comparator $A_{2F}$ in FIG. 1F is an embodiment of comparator $A_{2C}$ in FIG. 1C.

The $V_{I-}$ of $A_{1F}$ is connected to node $A_I$, and in steady state tracks $V_{I+}$ of $A_{1F}$ that is biased at $V_{iF}=V_{DD}-V_{1F}$. Accordingly, $V_{iF}$ can be programmed to set the voltages at the terminals of $I_{A_I}$ and $I_R/m$, which provides them with some voltage head-room flexibility. Moreover, matched $V_{iF}$ equalizes the steady state $V_{DS}$ among plurality of reference current source segments $I_R/m$ (and SCCs utilized in a TiADC) which reduces their systemic mismatch which helps TiADC's linearity.

The differential inputs of comparator $A_{2F}$ receive the output signal of $A_{1F}$, and the $V_{A_I}=V_{1-}$ of $A_{1F}$ which tracks $V_{1F}$ in steady state. Likewise, by programming $V_{1F}$ (for example, set by scaling of W/L and $I_{DS}$ of a diode connected FET shared among plurality of SCCs) a more consistent output response for the SCC's $A_{2F}$ comparators and the $T_O$ output signals can be achieved, over normal manufacturing process and operating variations.

Also, as stated before, given that the accuracy of $A_{1F}$ and $A_{2F}$ are not critical to SCC's accuracy, FETs utilized in $A_{1F}$ and $A_{2F}$ can be sized with smaller geometries in order to reduce cost, increase speed at current consumption.

In FIG. 1F, employing a five FET (differential input) amplifier $A_{1F}$ and (differential input) comparator $A_{2F}$ improves SCC's power supply noise rejection.

The operations and summary of some of the benefits of the embodiment pertaining to FIG. 1C are applicable to FIG. 1F also. Description for utilizing FIG. 1F's SCC in TiADCs will be provided later.

FIG. 1F' is a schematic circuit diagram of another embodiment illustrating a SCC, similar to that illustrated in FIG. 1C', with transistor level implementation of the amplifier and comparator.

The SCC embodiment in FIG. 1F' is similar to that of FIG. 1F, but without the $P_{1F}$ FET and no $A_N$ terminal. FIG. 1F', similar to FIG. 1C', also has one analog output terminals, $A_P$, one digital output terminal, $T_O$, and one analog input terminal, $A_I$.

Amplifier $A_{1F'}$ is comprised of FETs $P_{2F'}$, $P_{3F'}$, $N_{2F'}$, $N_{3F'}$, and current source FET $P_{6F'}$ (biased with $V_{2F'}$, that can for example be made of diode connected PMOSFET, which can also be shared among plurality of SCCs in a TiADC). Amplifier $A_{1F'}$ in FIG. 1F' is an embodiment of $A_{1C'}$ in FIG. 1C'.

Comparator $A_{2F'}$ is comprised of FETs $P_{4F'}$, $P_{5F'}$, $N_{4F'}$, $N_{5F'}$, and current source FET $P_{7F'}$ (also biased of the same $V_{2F'}$). Comparator $A_{2F'}$ in FIG. 1F' is an embodiment of $A_{2C'}$ in FIG. 1C'.

The operations and summary of some of the benefits of the embodiment disclosed in FIG. 1C' are applicable to that of FIG. 1F' also. Description of FIG. 1F' SCC utilized in TiADCs will be provided later.

Figure 1G:
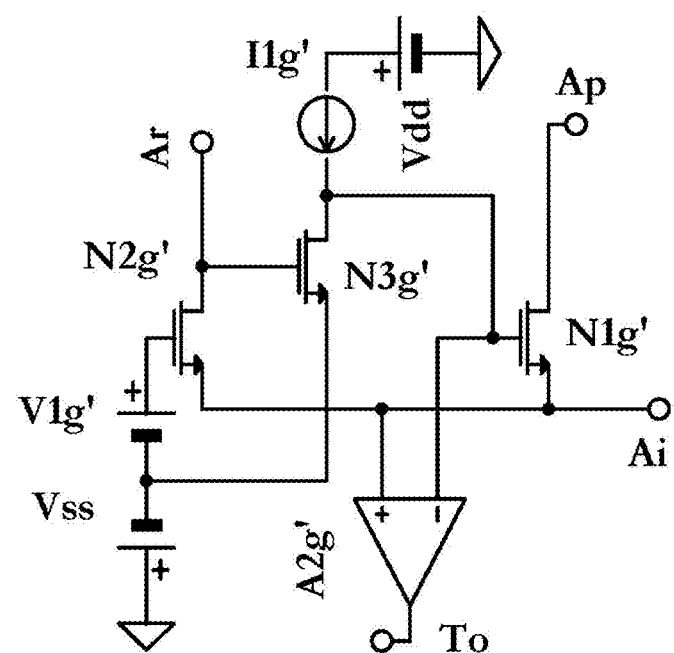
FIG. 1G' is a schematic circuit diagram of another embodiment illustrating a SCC

Description of FIG. 1G'

FIG. 1G' is a schematic circuit diagram of another embodiment illustrating a SCC, which also has one analog output terminal, $A_P$, two analog input terminals, $A_I$ and $A_R$, one digital output terminal, $T_O$. In FIG. 1G', the input current signal $I_{A_I}$ and the segmented reference current signal operating at $I_R/m$, that feed the SCC, are de-coupled from one other by the FET $N_{2G'}$.

The SCC here has two separate analog input ports. The input current signal running at $I_I$ flows out of the $A_I$ terminal. The segmented reference current source (running at $I_R/m$) flow into a separate terminal, $A_R$.

Here, $N_{3G'}$ and $I_{1G'}$ form an inverting (common source amplifier) $A_{1G'}$. The $I_{A_I}$ flows through the source node of $N_{2G'}$. The $I_{A_R}=I_R/m$ flows through the drain node of $N_{2G'}$, where $I_{A_I}$ and $I_R/m$ signals are compared, and the resulting comparison is gained up by amplifier $A_{1G'}$. Note that $N_{2G'}$ together with $A_{1G'}$ perform the function of current input feedback amplifier with steering FET $N_{1G'}$ that is placed in $A_{1G'}$'s negative feedback loop. As such, the output of $A_{1G'}$ amplifier drives the gates terminals of $N_{1G'}$, which helps steer $I_{A_P}$ signal with a sharper zero-crossing profile (when $I_{A_I}$ and $I_R/m$ are near balance), due in-part to $A_{1G'}$ gain.

Note that $V_{A_I}$ is biased near steady-state at (and clamped by $N_{2G'}$ below) $V_{SS}+V_{1G'}-Vgs_{N_{2G'}}=V_{tG'}$, where $V_{1G'}$ can for example be made of diode connected NMOS to track $Vgs_{N_{2G'}}$. Moreover, $V_{A_R}$ is biased at $Vgs_{N_{3G'}}$ which can be programmed by operating current and W/L of $N_{3G'}$. As such, the voltage at input terminal (near steady-state) of current sources, running at $I_{A_I}$ and $I_R/m$, can be programmed at different voltages, $V_{A_I}$ and $V_{A_R}$, respectively.

The differential inputs of $A_{2G'}$ comparator are driven by $V_{A_I}$ (at $V_{tG'}$ near steady-state) and output of $A_{1G'}$ amplifier. This provides comparator $A_{2G'}$ with wider input voltage over-drive, and a more consistent comparator output response (around same $V_{tG'}$ supplied) among plurality of SCC s (utilized in a TiADC) to generate the $T_O$ signals.

As stated earlier, $A_{1G'}$ and $A_{2G'}$ can be sized with smaller geometry FETs to optimize for lower cost, low current, low capacitance, and high-speed since neither the gain nor the accuracy are critical for SCC's precision.

In FIG. 1G', when $I_{A_I}>I_R/m$, then the gate voltage $N_{3G'}$ falls, which causes $N_{3G'}$ to conduct less and, that results in $A_{1G'}$ to lift the gate voltage of $N_{1G'}$ and turn it on harder. Thus, the net of $I_{A_I}-I_R/m$ flows through $N_{1G'}$ and out of $A_P$ terminal where $I_{A_P} \cong I_{A_I}-I_R/m$. Here, the $T_O=0$.

When $I_{A_I}<I_R/m$ then the $A_I$ terminal voltage rises above $V_{tG'}$. Accordingly, the amplifier $A_{1G'}$ output voltage falls, which turns $N_{1G'}$ off ($I_{A_P} \cong 0$). Thus, the $T_O=1$.

Additional benefits of this SCC to those described earlier are:

First, near steady-state, the $V_{A_R}$ is biased at $Vgs_{N_{3G'}}$ and $V_{A_I}$ is biased at $V_{tG'}$, which can be programmed by scaling the operating current and size of FETs. It is beneficial to have flexibility in setting the terminal voltages of current sources, $I_R/m$ and $I_{A_I}$, with $V_{A_R}$ and $V_{A_I}$.

Second, systematic mismatch between plurality of reference current source segments $I_R/m$ (when cascade of successive SCCs are utilized in TiADC) is minimized when their $V_{DS}$ is matched and stabilized at $V_{A_R}$ near steady-state.

Third, as explained earlier, equally sized currents and FETs in amplifier $A_{1G'}$ drives the input of comparator $A_{2G'}$ whose other input is biased at $V_{tG'}$ near-steady state, which are shared among cascade of SCCs. Hence, among plurality of SCCs, more consistent output response profile for the $A_{2G'}$ comparator and the $T_O$ output signals are achieved. Description for utilizing the SCC, of FIG. 1G' in TiADC disclosed in FIG. 3A, will be provided later.

Description of FIGS. 1H, 1I, 1J, and 1Q

Figure 1H:
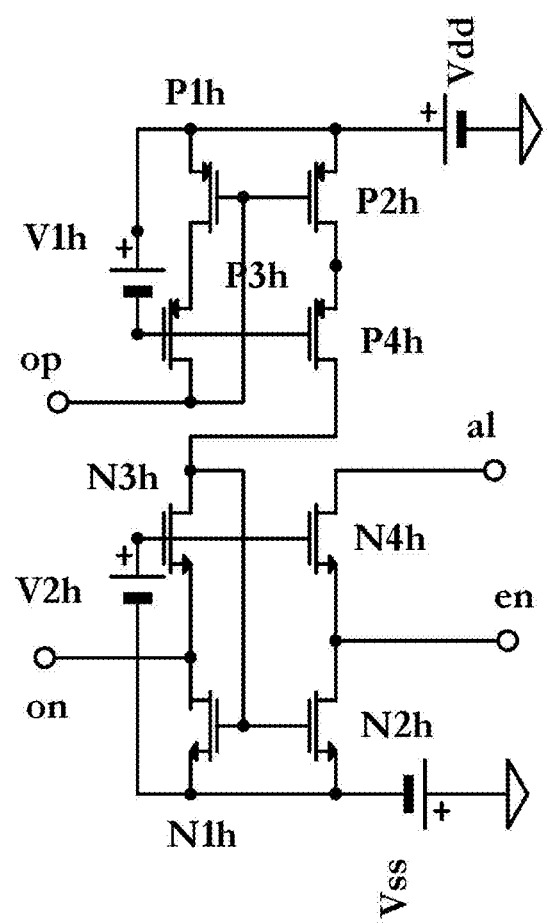
FIG. 1H is a schematic circuit diagram of a the RALSP circuit
Figure 1I:
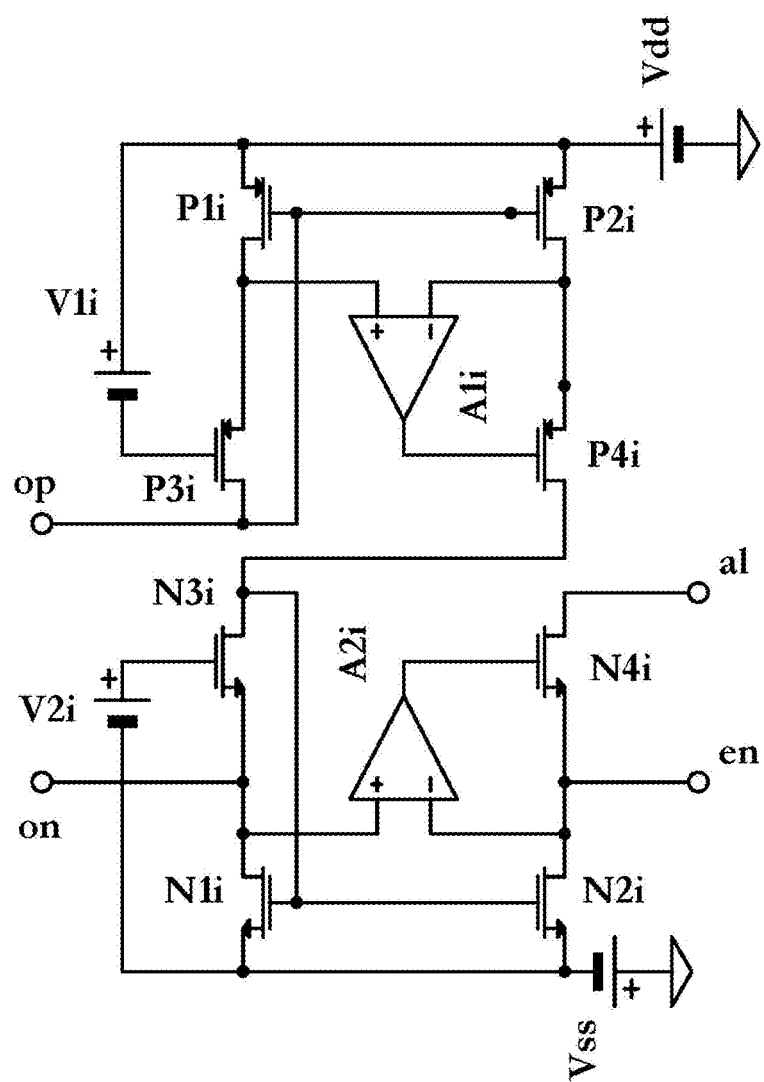
FIG. 1I is a schematic circuit diagram of another RALSP circuit.
Figure 1J:
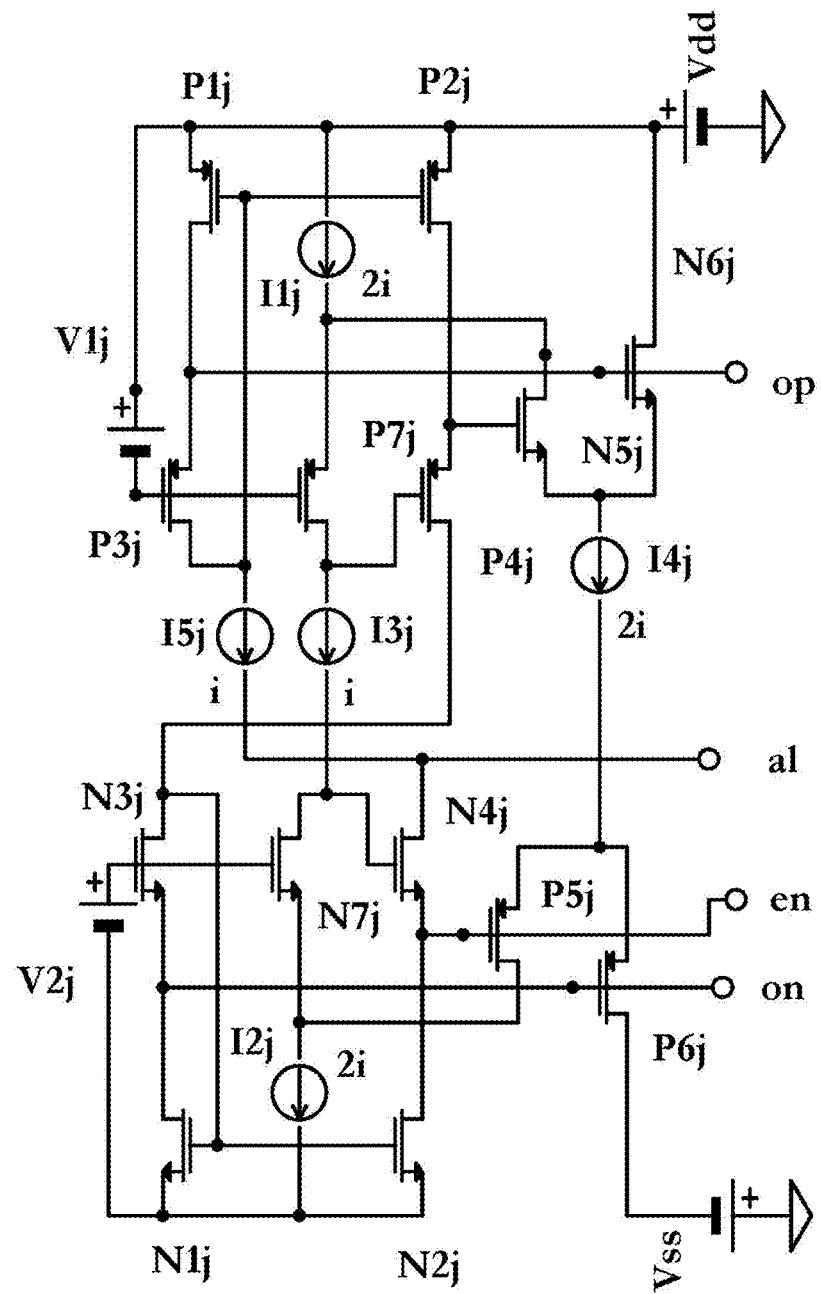
FIG. 1J is a schematic circuit diagram of another RALSP circuit.

FIGS. 1H, 1I, and 1J are schematic circuit diagrams of embodiments illustrating, the RALSP circuits that generate the Residual Analog Least Significant Portion (RALSP) of a TiADC's input signal. Each of the disclosed RALSP's circuits in FIGS. 1H, 1I, and 1J have three analog current input terminals, $O_P$, $E_N$, $O_N$, and one analog current output terminal, $A_L$. Here, the letter 'O' represent the 'Odd' current input node, and the letter 'E' represent the 'Even' current input node.

The net current flowing out of $O_P$ terminal is $I_{O_P}$, the net current flowing into $E_N$ terminal is $I_{E_N}$, and the net current flowing into $O_N$ terminal is $I_{O_N}$. The resultant output current flowing into the $A_L$ terminal is $I_{A_L} \cong I_{E_N} - I_{O_N} - I_{O_P}$. It would be obvious to one skilled in the art that the RALSP circuit's outflow or inflow of currents can be different than described above, depending on different embodiments of SCC (e.g., complementary versions of SCC) and the direction of SCC's current signal.

In FIG. 1H, $I_{O_P}$ can be inputted to the $O_P$ terminal of the PMOS current mirror, $CM_{PH}$, comprising $P_{1H}$, $P_{2H}$ cascoded (to increase the output impedance of $CM_{PH}$) by $P_{3H}$, $P_{4H}$ (biased by $V_{1H}$ which can be made of a scaled long channel length diode connected PMOS, accessible for sharing by other SCCs utilized in a TiADC). The output current of $CM_{PH}$ through the drain terminal of $P_{4H}$ is then fed onto the NMOS current mirror, $CM_{NH}$, comprising $N_{1H}$, $N_{2H}$ cascoded (to increase the output impedance of $CM_{NH}$) by $N_{3H}$, $N_{4H}$ (biased by $V_{2H}$ which can be made of a scaled long channel length diode connected NMOS, accessible for sharing by other SCCs utilized in a TiADC).

The $I_{E_N}$ can be inputted to $E_N$ port, which can be the secondary input terminal of $CM_{NH}$. The $I_{O_N}$ can also be inputted to $O_N$ port, which can be the secondary output terminal of $CM_{NH}$. As a result, $A_L$ port that is the primary output terminal of $CM_{NH}$ provides the $I_{A_L} \cong I_{E_N} - I_{O_N} - I_{O_P}$.

The illustration in FIG. 1I is functionally similar to that of FIG. 1H, but includes additional amplifiers $A_{1I}$ and $A_{2I}$ to increase the output impedance and improve the accuracy of the upper PMOS current mirror $CM_{PI}$ and the lower NMOS current mirror $CM_{NI}$, while $I_{O_P}$, $I_{E_N}$, $I_{O_N}$ values span between full scale and zero scale.

The $V_{1I} - V_{sg_{P_{3I}}}$ biases $V_{I+}$ of $A_{1I}$, which also establishes the $V_{DS}$ of $P_{1I}$. The $V_{DS}$ of $P_{2I}$ is established by $V_{I-}$ of $A_{1I}$ that is substantially equalized with $V_{1+}$ considering that $P_{4I}$ is arranged with $A_{1I}$ negative feedback loop. Thus, $P_{1I}$, $P_{2I}$ systematic current matching in $CM_{PI}$ is improved by $A_{1I}$ for equalizing the $V_{DS}$ of $P_{1I}$, $P_{2I}$. Note also that $P_{2I}$, $P_{4I}$ cascode's output impedance is increased due to gain of $A_{1I}$ as is the case in a regulated cascode current mirrors (RGC).

Similarly, in the lower NMOS current mirror $CM_{NI}$ side, $V_{2I} - V_{gs_{N_{3I}}}$ biases $V_{I+}$ of $A_{2I}$, which establishes the $V_{DS}$ of $N_{1I}$. The $V_{DS}$ of $N_{2I}$, established by $V_{I-}$ of $A_{2I}$, is substantially equalized with $V_{O+}$ considering that $N_{4I}$ is arranged with $A_{2I}$ negative feedback loop. Thus, $N_{1I}$, $N_{2I}$ systematic current matching in $CM_{NI}$ is improved by $A_{2I}$ for equalizing their $V_{DS}$. Likewise, note that $N_{2I}$, $N_{4I}$ cascode's output impedance is increased due to gain of $A_{2I}$, utilized in a the RGC configuration.

In summary, RALSP circuit in FIG. 1I systematic errors are reduced. This is because the current signal that flows into the $A_L$ output terminal, $I_{A_L} \cong I_{E_N} - I_{O_N} - I_{O_P}$ carries less systematic inaccuracies associated with the upper and lower current mirrors, $CM_{PI}$ and $CM_{NI}$, because of their equalized $V_{DS}$ and higher output impedance of RGCs.

Illustration in FIG. 1J, is similar to that of FIG. 1I, but it is comprised of a transistor level implementation for amplifiers $A_{1J}$ and $A_{2J}$ (which are embodiments of $A_{1I}$ and $A_{2I}$ in FIG. 1H).

Amplifier $A_{1J}$ is a half folded cascode transconductance amplifier (FCTA) containing FETs $N_{5J}$, $N_{6J}$, $P_{7J}$ and current sources $I_{4J}$, $I_{3J}$, $I_{1J}$. Amplifier $A_{2J}$ is also a half FCTA containing FETs $P_{5J}$, $P_{6J}$, $N_{7J}$ and current sources $I_{4J}$, $I_{3J}$, $I_{2J}$.

FIG. 1J's $O_P$ terminal is inserted at the source terminal of $P_{3J}$, instead of it utilizing the gate-drain terminal as the $O_P$ terminal depicted in FIG. 1I.

The benefit of applying $I_{O_P}$, $I_{E_N}$, $I_{O_N}$ to the source terminals of $P_{3J}$, $N_{3J}$, $N_{4J}$ (respectively) is that it eases voltage head-room constraints for $I_{O_P}$, $I_{E_N}$, $I_{O_N}$ which (all else equal) helps the RALSP circuit to operate at lower power supply.

Additionally, FIG. 1J includes injection current sources $I_{5J}$, which is not shown in FIG. 1I. While $I_{O_P}$, $I_{E_N}$, $I_{O_N}$ span zero to full scale, $I_{5J}$ keeps $P_{1J}$, $P_{2J}$ in $CM_{PJ}$ conducting current the whole span, which supplies $N_{1J}$, $N_{2J}$ in $CM_{NJ}$ with operating current. Note that finally $I_{5J}$ is subtracted from the $A_L$ to keep the $I_{A_L} \cong I_{E_N} - I_{O_N} - I_{O_P}$ un-distracted.

The role of $I_{5J}$ is to prevent current mirrors FETs that are used in the RALSP circuit to completely turn off, while $I_{O_P}$, $I_{E_N}$, $I_{O_N}$ span their respective zero to full scale ranges, which also improves the RALSP circuits dynamic performance.

Figure 1K:
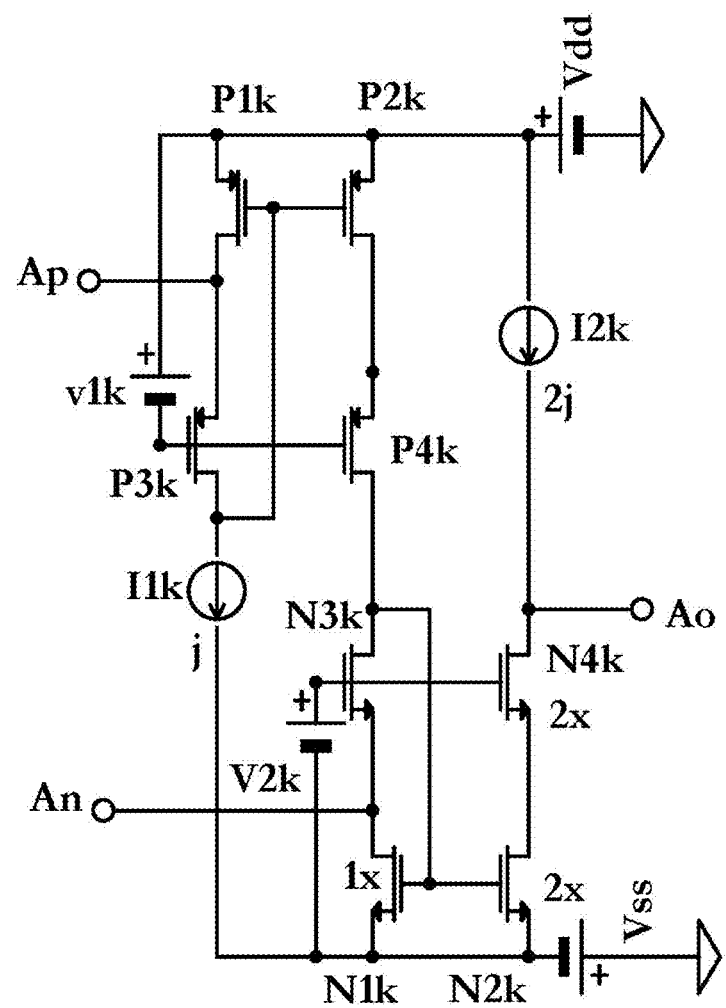
FIG. 1K is a schematic circuit diagram of a DIF2 circuit
Figure 1L:
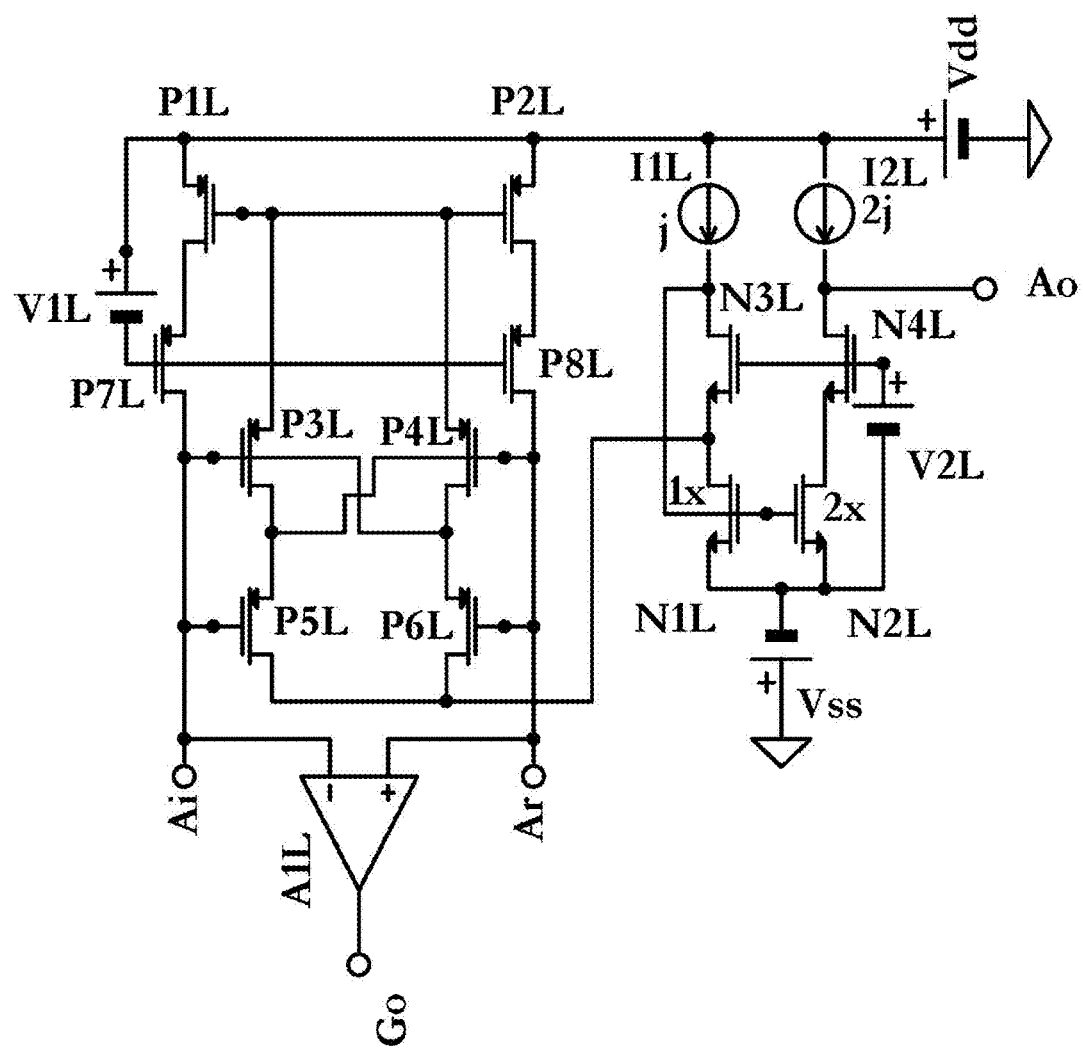
FIG. 1L is a schematic circuit diagram of a DABS2 circuit.
Figure 1M:
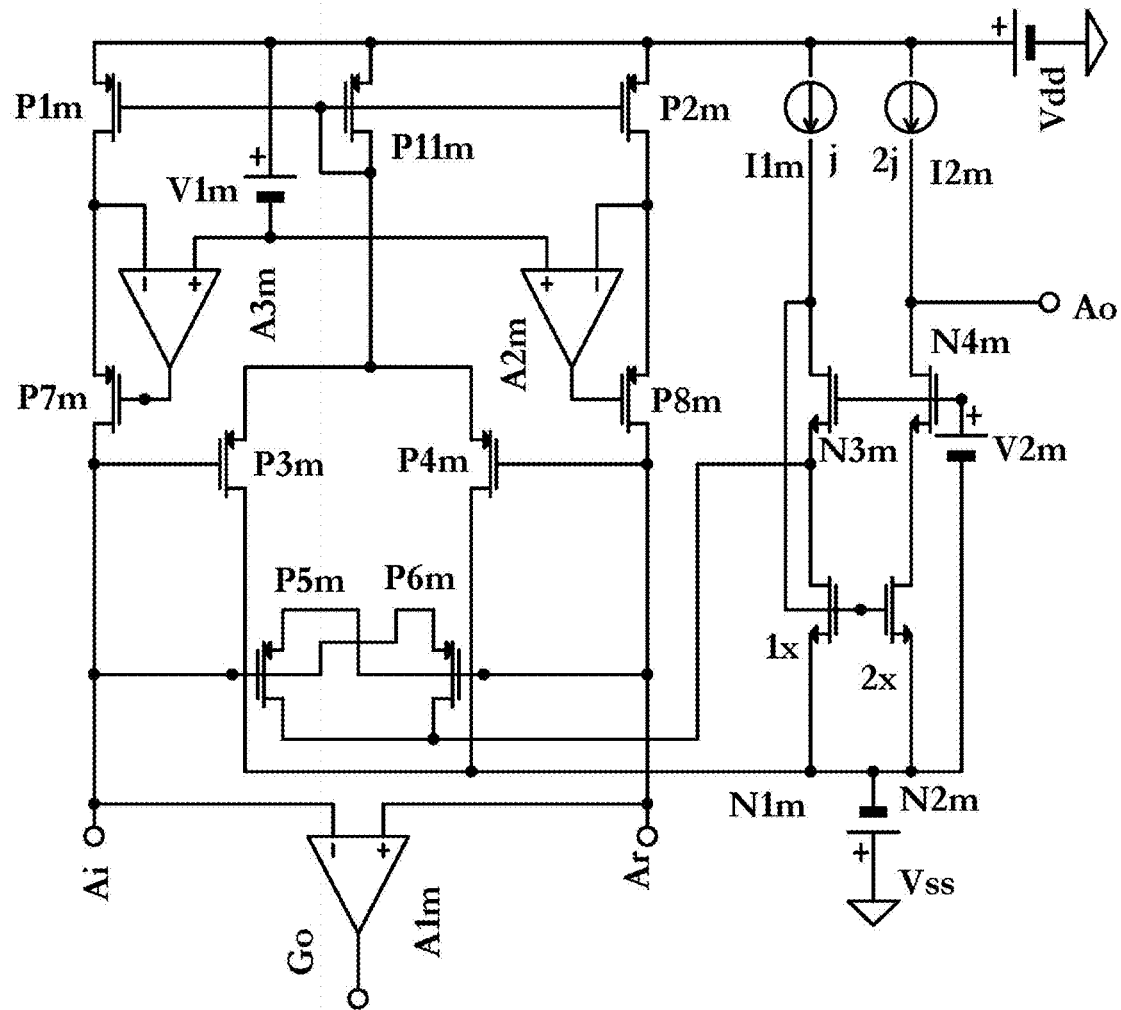
FIG. 1M is a schematic circuit diagram of another DABS2 circuit.
Figure 1N:
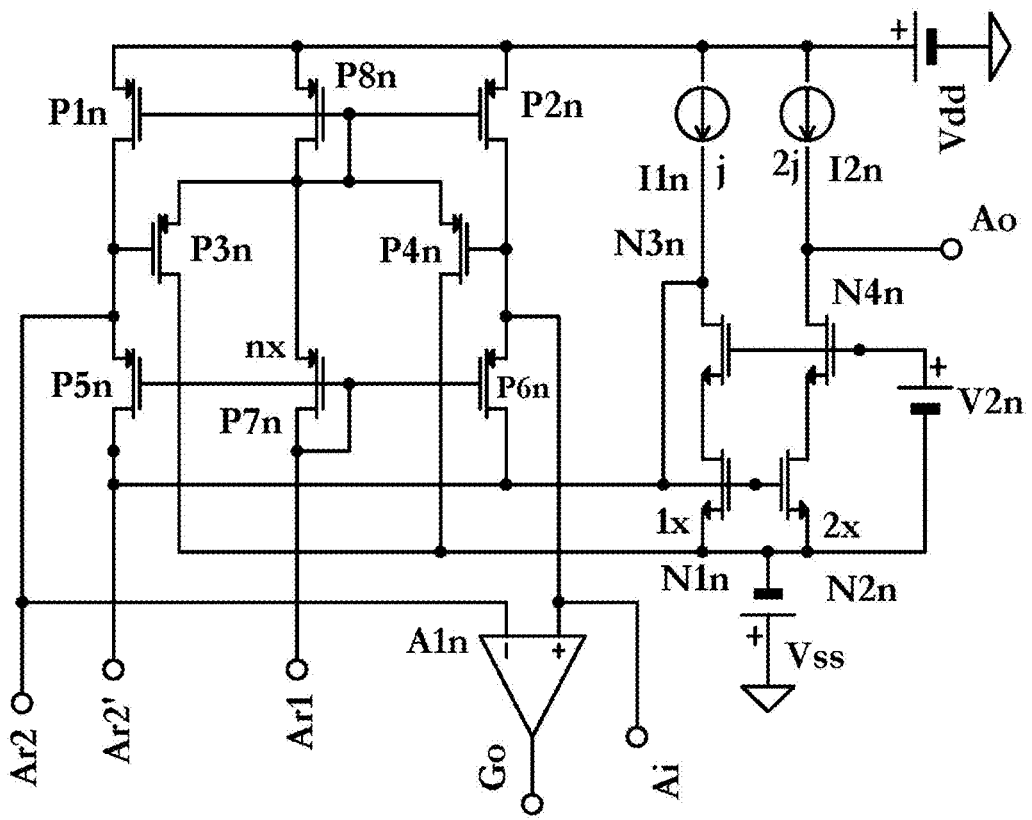
FIG. 1N is a schematic circuit diagram of another DABS2 circuit
Figure 1O:
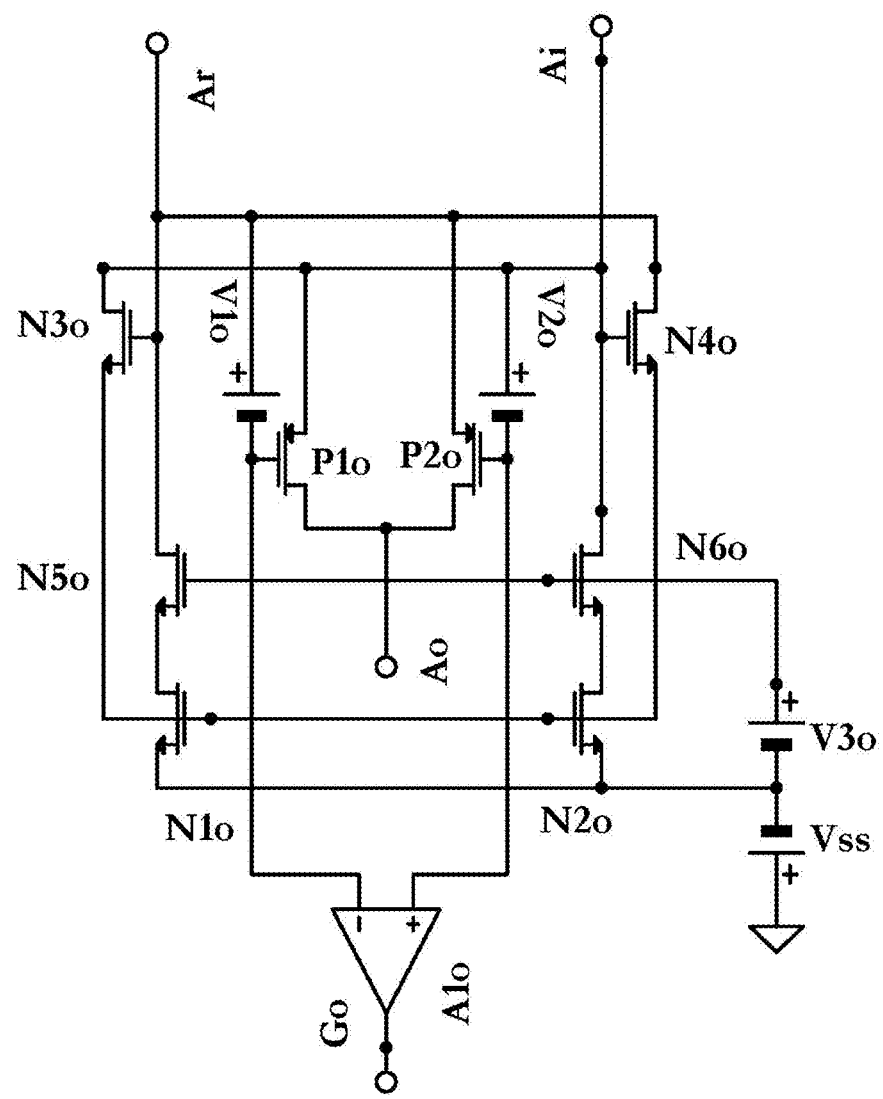
FIG. 1O is a schematic circuit diagram of a DABS circuit
Figure 1P:
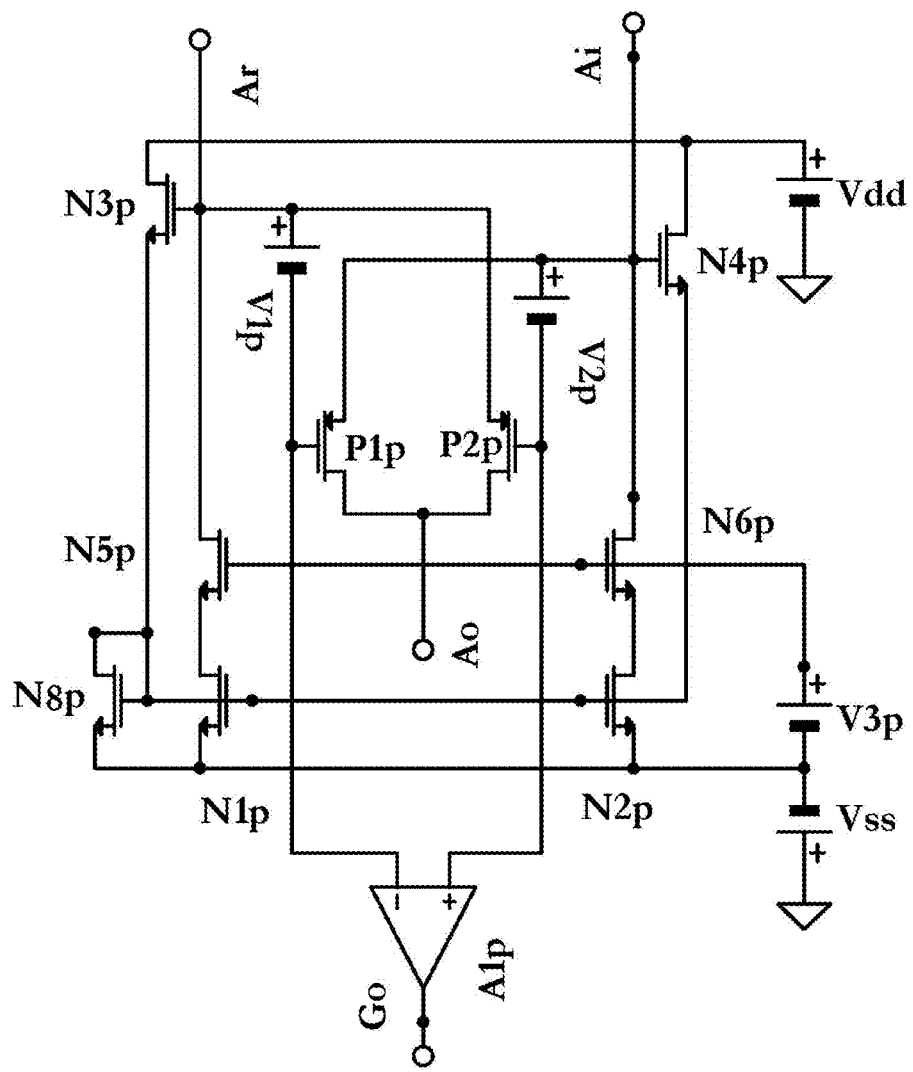
FIG. 1P is a schematic circuit diagram of another DABS circuit.
Figure 1Q:
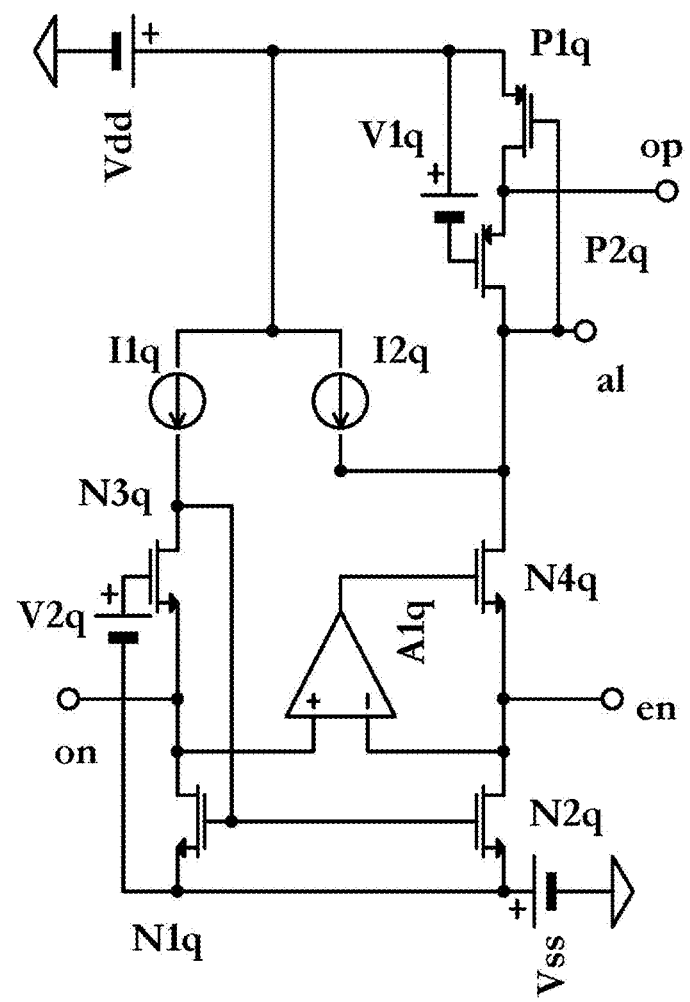
FIG. 1Q is a schematic circuit diagram of another RALSP circuit.

FIG. 1Q is a RALSP circuit similar to FIG. 1I, but includes the following features: The RALSP circuit of FIG. 1Q has the three analog current input terminals, $O_P$, $E_N$, $O_N$, but the analog output terminal $A_L$ generates an output voltage $V_{A_L}$ instead of $I_{A_L}$. Coupling $V_{A_L}$ with a scaled diode connected PMOS would enable mirroring $I_{A_L} = I_{E_N} - I_{O_N} - I_{O_P}$ onto a plurality $I_{A_L}$s to a secondary iADC, such as a current mode flash ADC (FiADC) that will be discussed in the FIG. 3H section.

In FIG. 1Q, the $N_{1q}$, $N_{2q}$, the systematic current matching (in $CM_{NQ}$) is improved by $A_{1Q}$ for equalizing the $V_{DS}$ of $N_{1q}$, $N_{2q}$. The $N_{2Q}$, $N_{4Q}$ cascode's output impedance is increased by $A_{2I}$ utilized in a RGC configuration.

Moreover, FIG. 1Q includes injection current sources $I_{1Q}$ and $I_{2Q}$ to keep the current mirrors, $CM_{PQ}$, $CM_{NQ}$, conducting while $I_{E_N}$, $I_{O_N}$, $I_{O_P}$ span their respective zero to full scale ranges, which improves the dynamic performance of RALSP circuit.

Description of FIG. 1K

FIG. 1K is a schematic circuit diagrams of embodiments illustrating a DIF2 circuit, which subtracts two current signals and multiplies the output current by gain of 2.

The DIF2 circuit has two analog current input terminals, $A_P$, $A_N$ and one analog current output terminal, $A_O$.

The current flowing out of $A_P$ terminal is $I_{A_P}$, the current flowing into $A_N$ terminal is $I_{A_N}$, and the net current flowing through and into $A_O$ terminal is $I_{A_O}$. The resultant output current flowing into the $A_O$ terminal is $I_{A_O} \cong 2 \times (I_{A_P} - I_{A_N})$.

In FIG. 1K, $I_{A_P}$ can be inputted to the $A_P$ terminal of the PMOS current mirror, $CM_{PK}$, comprising $P_{1K}$, $P_{2K}$ cascoded by $P_{3K}$, $P_{4K}$ (to increase the output impedance of $CM_{PK}$, and biased by $V_{1K}$ which can be made of a scaled long channel length diode connected PMOS, accessible for sharing). The output current of $CM_{PK}$ through the drain terminal of $P_{4K}$ is then fed onto the NMOS current mirror, $CM_{NK}$. The $CM_{NK}$ is comprising of $N_{1K}$, $N_{2K}$ cascoded by $N_{3K}$, $N_{4K}$ to increase the output impedance of $CM_{NK}$, and biased by $V_{2K}$, which can also be made of a scaled long channel length diode connected NMOS, accessible for sharing. Note that $N_{2K}$, $N_{4K}$ are scaled twice the size of $N_{1K}$, $N_{3K}$ to provide the current gain of 2 for $CM_{NK}$.

To ease the input current source head-room (voltage) constraint, $I_{A_P}$ and $I_{A_P}$ are fed onto (secondary current input terminals of $CM_{PK}$ and $CM_{NK}$ which can be) the source terminals of $P_{3K}$, $N_{3K}$ instead to their (primary current input terminal which are the) gate-drain terminals. As such and all else equal, DIF2 circuit can operate with lower power supply voltages.

Also note that FIG. 1K includes injection current sources $I_{1K}$. As explained earlier, $I_{1K}$ keeps the current mirror FETs in $CM_{PK}$ and $CM_{NK}$ alive, to help their performance while $I_A$, $I_{A_P}$ span through their respective zero to full scale ranges.

As it will be described later, the DIF2 circuit disclosed in FIG. 1K may be coupled with SCCs such as the ones disclosed in FIG. 1A, FIG. 1B, FIG. 1C, FIG. 1D, FIG. 1E, and FIG. 1F. The resultant pairing of SCC and DIF2 circuits provides a DABS2 circuit that that generates absolute value of the difference between two current signals and multiply the said output current by gain of 2. A DABS2 circuit may be utilized in AiADCs such as the one illustrated in FIG. 3E, which will be discussed later.

The next three sections pertain to FIGS. 1L, 1M, 1N that describe DABS2 circuits, which generate twice the absolute value of the difference between two input currents, and having the following benefits:

First, the absolute value of the difference between two signals are processed in current mode, which is inherently fast and capable of operating at lower voltage.

Second, but for FETs in the current mirror sections, other FETs utilized in DABS2 circuit can be sized with smaller geometries that helps with saving area, lower capacitance, and faster speed.

Third, twice the absolute value of the difference between two analog current signals is generated plus a digital $G_O$ bit is produced (that is the digital result of comparison between two analog current signal). This function is performed asynchronously (clock free) which saves on complexity and power consumption. Also, the feature of performing both analog and digital computation is one circuit (DABS2) helps dynamic response of higher order functions such as AiADC that utilize the DABS2 circuit.

Fourth, cascading the current mirrors or utilizing RGC helps sharpen the DABS2 circuit's zero-crossing profile when input current values cross over.

Fifth, the symmetric and differential arrangement of DABS2 (e.g., inputs feeding the same kind FETs and in the same direction) helps with power supply and common input current signal rejection ratio.

Description of FIG. 1L

FIG. 1L is a schematic circuit diagrams of an embodiment illustrating a DABS2 circuit, which generates twice the absolute value of the difference between two current signals. The DABS2 circuit of FIG. 1L has two analog current input terminals, $A_I$, $A_R$ and one analog current output terminal, $A_O$, and one digital output terminal, $G_O$ that is the digital results of the comparison between the input and reference currents.

The current flowing out of $A_I$ terminal is the input current signal $I_{A_I}$, the current also flowing out of $A_R$ terminal is the input reference signal $I_{A_R}$, and the net current flowing into the $A_O$ terminal is $I_{A_O}$ that is twice the absolute value difference between $I_{A_I}$ and $I_{A_R}$. In other words, the output current flowing into the $A_O$ terminal is $I_{A_O} \cong 2 \times |I_{A_I} - I_{A_R}|$.

In part, $P_{1L}$, $P_{2L}$ function as current mirror cascoded by $P_{7L}$, $P_{8L}$ to increase the $CM_{PL}$ current mirror's output impedance which also improves their systematic matching.

Let's first consider the case when $I_{A_I} = 0$ and $I_{A_R} = I_R$. Here, $V_{A_I}$ rises while $V_{A_R}$ falls, which turns $P_{4L}$ on and turns $P_{3L}$ off. With $P_{4L}$ on, the drain node of $P_{4L}$ (which is the $A_I$ terminal) is linked with gate nodes of $P_{1L}$ and $P_{2L}$, which configures $P_{1L}$ as a diode connected FET. With $I_{A_I} = 0$, the diode connected $P_{1L}$ can receive its current ($Id_{P_{1L}}$) through $P_{6L}$ current ($Id_{P_{6L}}$). The gate node of $P_{6L}$ rises as $V_{A_R}$ falls, until $P_{6L}$ conducts enough current such that the operating current through $P_{1L}$, $P_{2L}$ (which are configured as current mirrors) are equalized, which is when $Id_{P_{6L}} \cong Id_{P_{1L}} \cong Id_{P_{2L}} \cong I_R - 0 \cong I_{A_R} - I_{A_I}$.

Conversely, Let's now consider the case when $I_{A_I} = 0$ and $I_{A_I} = I_R$. Here, $V_{A_I}$ is pulled down while $V_{A_R}$ is lifted, which turns $P_{4L}$ off and turns $P_{3L}$ on. With $P_{3L}$ on, the drain node of $P_{3L}$ (which is the $A_R$ terminal) is linked with gate nodes of $P_{1L}$ and $P_{2L}$, which configures $P_{2L}$ as a diode connected FET. With $I_{A_R} = 0$, the diode connected $P_{2L}$ can receive its current ($Id_{P_{2L}}$) through $P_{5L}$ current ($Id_{P_{5L}}$). The gate node of $P_{5L}$ is pulled down as $V_{A_I}$ is pulled down, until $P_{5L}$ conducts enough current such that the operating current through $P_{1L}$, $P_{2L}$ (which are configured as current mirrors) are equalized, which is when $Id_{P_{5L}} \cong Id_{P_{2L}} \cong Id_{P_{1L}} \cong I_R - 0 \cong I_{A_I} - I_{A_R}$.

In summary, as $I_{A_I}$ span from zero scale to full scale with respect to $I_{A_R}$, their net difference is channeled either through current steering FETs $P_{5L}$ or $P_{6L}$, whose drain currents are lumped together and sent to, a CM2 circuit, which is a current mirror with a gain of 2. The $Id_{P_{5L}} + Id_{P_{6L}}$ is then fed onto the NMOS current mirror, $CM_{NL}$, comprising of $N_{1L}$, $N_{2L}$ cascoded by $N_{3L}$, $N_{4L}$ (to increase the output impedance of $CM_{NL}$, and biased by $V_{2L}$ which can also be made of a scaled long channel length diode connected NMOS, accessible for sharing).

Note that $N_{2L}$, $N_{4L}$ are scaled twice the size of $N_{1L}$, $N_{3L}$ to provide the current gain of 2 for $CM_{NL}$.

To ease the voltage head-room constraint for the current sources, the $Id_{P_{5L}}$ $Id_{P_{6L}}$ is fed onto (secondary current input terminals of $CM_{NL}$) the source terminal $N_{3L}$ instead to its (primary current input terminal which are the) gate-drain terminals. As such and all else equal, CM2 circuit can operate with lower power supply voltages.

Also note that FIG. 1L includes injection current sources $I_{1L}$. As explained earlier, $I_{1L}$ keeps the current mirror FETs in $CM_{NL}$ on, which improves their dynamic performance while $Id_{P_{5L}}$ $Id_{P_{6L}}$ values span through zero to full scale ranges.

Note that $I_{A_R}$ here can be fixed, at for example $I_R$, while the input current signal, $I_{A_I}$, spans from zero to full scale at for example $2I_R$.

In summary, the output current flowing into the $A_O$ terminal is $I_{A_O} \cong 2 \times |I_{A_I} - I_{A_R}|$. Concurrently, the imbalance between $I_{A_I}$ and $I_{A_R}$, generates a voltage difference between the $V_{A_I}$ and $V_{A_R}$ which is fed onto the inputs of comparator, $A_{1L}$, that generates the digital $G_O$ signal. Utilizing the DABS2 (illustrated in FIG. 1L) in a gray-code AiADC (illustrated in FIG. 3F) will be discussed later.

Description of FIG. 1M

FIG. 1M is a schematic circuit diagrams of another embodiment illustrating a DABS2 circuit with two analog current input terminals, $A_I$, $A_R$ and one analog current output terminal, $A_O$, whose output current is $I_{A_O} \cong 2 \times |I_{A_I} - I_{A_R}|$, and one digital output terminal, $G_O$ signaling the sign of comparison between $I_{A_I}$ and $I_{A_R}$.

In part, $P_{1M}$, $P_{11M}$, $P_{2M}$ function as current mirrors in a RGC form with $P_{7M}$, $P_{8M}$ placed in the negative feedback loops of amplifiers $A_{3M}$, $A_{2M}$ to increase the $CM_{PM}$ output impedance.

Let's consider the case when $I_{A_I} = 0$ and $I_{A_R} = I_R$. Here, $V_{A_I}$ is lifted while $V_{A_R}$ is pulled down, which turns $P_{4M}$ on and turns $P_{3M}$ off. With $P_{4M}$ on, then $Id_{P_{4M}}$ flows in $P_{11M}$ which is mirrored onto $P_{1M}$, $P_{2M}$. Given that in this case, $I_{A_I} = 0$ and $P_{1M}$ is conducting current, then $V_{A_I}$ which is the source node of $P_{6M}$ is lifted more, until $P_{6M}$ conducts enough current such that the operating current through $P_{1M}$, $P_{2M}$ (which are configured as current mirrors) are equalized, which is when $Id_{P_{6M}} \cong Id_{P_{1M}} \cong Id_{P_{2M}} \cong I_R - 0 \cong I_{A_I} - I_{A_I}$.

Conversely, let's now consider the case when $I_{A_R} = 0$ and $I_{A_I} = I_R$. Here, $V_{A_I}$ is pulled down while $V_{A_R}$ is lifted, which turns $P_{4M}$ off and turns $P_{3M}$ on. With $P_{3M}$ on, then $Id_{P_{3M}}$ flows in $P_{11M}$ which is mirrored onto $P_{1M}$, $P_{2M}$. Given that in this case, $I_{A_R} = 0$ and $P_{2M}$ is conducting current, then $V_{A_R}$ which is the source node of $P_{5M}$ is lifted more, until $P_{5M}$ conducts enough current such that the operating current through $P_{1M}$, $P_{2M}$ (which are configured as current mirrors) are equalized, which is when $Id_{P_{5M}} \cong Id_{P_{2M}} \cong Id_{P_{1M}} \cong I_R - 0 \cong I_{A_I} - I_{A_R}$. As $I_{A_I}$ span zero scale to full scale, around $I_{A_R}$, their net difference is channeled through either of the current steering FETs ($P_{5M}$ or $P_{6M}$) whose drain currents are lumped ($Id_{P_{5M}}$, $Id_{P_{6M}}$) together and sent to a current mirror, $CM_{NM}$, circuit (comprising of $N_{1M}$, $N_{2M}$, $N_{3M}$, $N_{4M}$, $I_{1M}$, $I_{2M}$, and $V_{2M}$) with a gain of 2.

Also, note that $I_{A_R}$ here can be fixed, at for example to a value of $I_R$, while the input current signal, $I_{A_I}$, spans zero to full scale for example at a value of $2I_R$. The output current flowing into the $A_O$ terminal of FIG. 1M is $I_{A_O} \cong 2 \times |I_{A_I} - I_{A_R}|$. Concurrently, the imbalance between $I_{A_I}$ and $I_{A_R}$ generates a voltage difference between the $V_{A_I}$ and $V_{A_R}$ which is fed onto the inputs of comparator, $A_{1M}$, that generates the digital $G_O$ signal. Utilizing the DABS2 circuit of FIG. 1M in AiADC (illustrated in FIG. 3F) will be discussed later.

Description of FIG. 1N

FIG. 1N is a schematic circuit diagram of another embodiment illustrating a DABS2 circuit. The DABS2 circuit here discloses a method with mean to keep its current steering FETs less off, in order to improve the DABS2 dynamic response when its input currents cross each other.

In FIG. 1N, the DABS2 circuit has one digital output terminal $G_O$ (comparison sign of $I_{A_I}$ and $I_{A_R}$), one analog current output terminal $A_O$, one analog current input terminals $A_I$, a first analog current reference terminals $A_{R1}$, and a second analog current reference terminals which can be selected as either (not both) of $A_{R2}$ or $A_{R2'}$.

Here, let $A_{R2}$ be the second analog reference input port. The analog current through the output terminal $A_O$ in FIG. 1N is $I_{A_O} \cong 2 \times |I_{A_I} - I_{A_R}|$.

Note that in part, $P_{1N}$, $P_{8N}$, $P_{2N}$ function as current mirror, while the current steering FETs $P_{5N}$, $P_{6N}$ (biased by diode connected $P_{7N}$) steer the difference between $I_{A_I}$, $I_{A_R}$ onto the current mirror, $CM_{NN}$, as well as increase the $CM_{PN}$ output impedance that can help sharpen the zero cross-over transition.

For DABS2 of FIG. 1N, let's consider $I_{A_{R1}} = I_{A_{R2}} = I_R$, and let $I_{A_I}$ span between $2I_R \geq I_{A_I} \geq 0$.

Let's first discuss the case when $I_{A_I} = 0$ and $I_{A_{R1}} = I_{A_{R2}} = I_R$. Here, $V_{A_I}$ is lifted while $V_{A_{R2}}$ and $V_{A_{R1}}$ are pulled down, which turns $P_{3N}$ on and turns $P_{4N}$ off. With $P_{3N}$ on, then $Id_{P_{3N}}$ also flows in $P_{8N}$ which is mirrored onto $P_{1N}$, $P_{2N}$. Given that first, $I_{A_I} = 0$ and $P_{2N}$ is conducting current, then $V_{A_I}$ which is the source node of $P_{6N}$ is lifted more, until $P_{6N}$ conducts enough current such that the operating current through $P_{1N}$, $P_{2N}$ are equalized, which is when $Id_{P_{6N}} \cong Id_{P_{1N}} \cong Id_{P_{2N}} \cong I_R - 0 \cong I_{A_{R2}} - I_{A_I}$.

Conversely, Let's now consider the case when $I_{A_{R2}} = I_{A_{R1}} = I_R$ and $I_{A_I} = 2I_R$. Here, $V_{A_I}$ is pulled down while $V_{A_{R2}}$ and $V_{A_{R1}}$ are lifted, which tends to turn $P_{3N}$ off and turns $P_{4N}$ on more. With $P_{4N}$ on, then $Id_{P_{4N}}$ also flows in $P_{8N}$ which is mirrored onto $P_{1N}$, $P_{2N}$. Given that in this case, $I_{A_{R2}} = I_{A_{R1}} = I_R$ and $P_{2N}$ is conducting current, then $V_{A_{R2}}$ which is the source node of $P_{5N}$ is lifted more, until $P_{5N}$ conducts enough current such that the operating current through $P_{1N}$, $P_{2N}$ (which are configured as current mirrors) are equalized, which is when $Id_{P_{5N}} \cong Id_{P_{2N}} \cong Id_{P_{1N}} \cong 2I_R - I_R \cong I_{A_I} - I_{A_{R2}}$. As such, when $I_{A_I}$ span from zero scale to full scale, around $I_{A_{R2}}$, their net difference is channeled through either of the current steering FETs ($P_{5N}$ or $P_{6N}$) whose drain currents are lumped ($Id_{P_{5N}}$, $Id_{P_{6N}}$) together.

This current is then sent to a current mirror, $CM_{NN}$, circuit (comprising of $N_{1N}$, $N_{2N}$, $N_{3N}$, $N_{4N}$, $I_{1N}$, $I_{2N}$, and $V_{2N}$) with a gain of 2. The output current flowing into the $A_O$ terminal of FIG. 1N is also $I_{A_O} \cong 2 \times |I_{A_I} - I_{A_R}|$.

Concurrently, the imbalance between $I_{A_I}$ and $I_{A_{R2}}$, generates a difference between the $V_{A_I}$ and $V_{A_{R2}}$ which is fed onto the inputs of comparator, $A_{1N}$, that generates the digital $G_O$ signal.

The DABS2 circuit here could function without $P_{3N}$ in case where $I_{A_{R1}} = I_{A_{R2}} = I_R$, and $2I_R \geq I_{A_I} \geq 0$.

Also note that in FIG. 1N, by biasing the current steering FETs $P_{5N}$, $P_{6N}$ with the (scaled) diode connected $P_{7N}$ (that is biased from the gate node of $P_{1N}$, $P_{8N}$, $P_{2N}$), the zero-crossing dynamic response of in the current steering FETs, $P_{5N}$, $P_{6N}$ is improved, by speeding up their on-off transitions. Moreover, the alternative of supplying $I_R$ to the $A_{R2'}$ port can speed up the current flow in $P_{5N}$, $P_{6N}$ on-off transitions, and improve DABS2 circuits zero-crossing dynamic response.

Additional benefit of the DABS2 circuit, illustrated in FIG. 1N, is faster zero-crossing dynamic response that can be traded off with one extra $I_{A_{R2}}$ and the DABS2 added inaccuracy due to mismatch between $I_{A_{R1}}$, $I_{A_{R2}}$. Utilizing the DABS2 circuit of FIG. 1N in AiADC, such as the one disclosed in a circuit similar to FIG. 3G, will be discussed later.

Next two section pertaining to illustrations in FIG. 1O and FIG. 1P describe DABS circuits, which are differential absolute value circuits, with the following benefits:

First, the gain of 2 current mirror that was needed in DABS2 disclosed earlier, is eliminated FIG. 1O and FIG. 1P DABS circuits which saves on area.

Second, the speed delay and inaccuracy associated with the gain of 2 current mirror is eliminated from the DABS circuit transfer function.

Third, faster zero-crossing dynamic response that can be traded off with and DABS2 associated inaccuracy due to constraining the on-off conditions of $P_{1P}$, $P_{2P}$.

Fourth, the absolute value of the difference between two signals are processed in current mode, which is inherently fast and capable of operating at low voltage.

Fifth, but for FETs in the current mirrors, other FETs in the DABS circuit can be made with small geometries that helps with smaller size, lower capacitance, and faster speed.

Sixth, the absolute value of the difference between two analog current signals is generated plus a digital $B_O$ bit, representing the comparison of the two analog current signals, which helps dynamic response of higher order blocks that could use DABS such as in iADCs.

Seventh, the symmetric and differential arrangement of DABS (e.g., inputs feeding the same kind FETs from the same side) helps with power supply and common input current signal rejection ratio.

Description of FIG. 1O

FIG. 1O is a schematic circuit diagram of an embodiment illustrating a DABS circuit with one digital output terminal $G_O$ that delivers the sign of the difference between the input and reference current signals, one analog current output terminal $A_O$, and two analog current input terminals: the input signal port $A_I$ and the reference signal port $A_R$.

Here $I_{A_I}$, $I_{A_R}$ flow into $A_I$, $A_R$ terminals, respectively, and $I_{A_O}$ flows out of $A_O$ terminal. The analog current through the output terminal $A_O$ in FIG. 1O is $I_{A_O} \cong |I_{A_I} - I_{A_R}|$.

The aim of the embodiment in this disclosure is to provide the means for keeping the current steering FETs from becoming deeply off as the DABS circuit's input values cross each other.

For clarity of describing the operations of DABS circuit, let's first set the DC shift bias voltages $V_{1O} = V_{2O} = 0$.

Note that in part, $N_{1O}$, $N_{2O}$ function as current mirrors, with $N_{5O}$, $N_{6O}$ (biased by $V_{3O}$ that can be generated with a diode connected long channel length NMOS) to increase the $CM_{NO}$ output impedance and help sharpen the DABS circuit's zero-crossing transition.

For DABS circuit of FIG. 1O, let $I_{A_R} = I_R$, and $I_{A_I}$ span between $2I_R \geq I_{A_I} \geq 0$.

Let's first consider the case when $I_{A_I} = 0$ and $I_{A_R} = I_R$. Here, $V_{A_I}$ is pulled down while $V_{A_R}$ is lifted, which turns $N_{3O}$ on and turns $N_{4O}$ off. With $N_{3O}$ on, the drain node of $N_{3O}$ is (which is the $A_I$ terminal) links with gate nodes of current mirrors $N_{1O}$ and $N_{2O}$, which configures $N_{2O}$ as a diode connected FET in the mirror. Note also that as $V_{A_I}$ rises, also the voltages at the source node of $P_{1O}$ and gate node of $P_{2O}$ fall. While $V_{A_R}$ rises also the voltages at the gate node of $P_{1O}$ and source node of $P_{2O}$ rise. Therefore, $P_{1O}$ turns off and $P_{2O}$ turn on. With $I_{A_I} = 0$ and $I_{A_R} = I_R$, $P_{2O}$ steers away the $I_{A_R} = I_R$ current so that the operating current through $N_{1O}$ and $N_{2O}$ (which are configured as current mirrors) are equalized near or at zero (since in this condition the current in the $N_{1O}$ and $N_{2O}$ mirror is set by $I_{A_I} = 0$) which is when $Id_{P_{2O}} \cong I_R - 0 \cong I_{A_R} - I_{A_I}$.

Conversely, let's now consider the case when $I_{A_R} = I_R$ and $I_{A_I} = 2I_R$. Here, $V_{A_I}$ rises while $V_{A_R}$ falls, which turns $N_{3O}$ off and turns $N_{4O}$ on. With $N_{4O}$ on, the drain node of $N_{4O}$ is (which is the $A_R$ terminal) is linked-up with gate nodes of current mirrors $N_{1O}$ and $N_{2O}$, which configures $N_{1O}$ as a diode connected FET in the mirror. Note also that as $V_{A_I}$ is lifted, also the voltages at the source node of $P_{1O}$ and gate node of $P_{2O}$ are lifted. While $V_{A_R}$ is pulled down, also the voltages at the gate node of $P_{1O}$ and source node of $P_{2O}$ are pulled down. Therefore, $P_{1O}$ turns on and $P_{2O}$ turn off. With $I_{A_I} = 2I_R$ and $I_{A_R} = I_R$, $P_{1O}$ steers away enough current from $I_{A_I} = 2I_R$ in order for the operating current through $N_{1O}$ and $N_{2O}$ (that are current mirrors with their operating currents, in this condition, set by $I_{A_R} = I_R$) are equalized, which is when $Id_{P_{1O}} \cong 2I_R - I_R \cong I_R \cong I_{A_R} - I_{A_I}$.

In summary, as $I_{A_I}$ span from zero scale to full scale, when nearing $I_{A_R}$, the net difference $(I_{A_R} - I_{A_I})$ is channeled through current steering FETs, $P_{1O}$ or $P_{2O}$, whose drain currents are lumped as $(Id_{P_{1O} + P_{2O}})$. Accordingly, the output current flowing into the $A_O$ terminal of FIG. 1O is $I_{A_O} \cong |I_{A_I} - I_{A_R}|$.

Concurrently, the difference between $I_{A_I}$ and $I_{A_R}$ generates a difference between the $V_{A_I}$ and $V_{A_R}$ which is fed onto the inputs of comparator $A_{1O}$ that generates the digital $G_O$ signal.

In FIG. 1O, by inserting DC shift bias voltages $V_{1O}$, $V_{2O}$ around the steering FETs $P_{1O}$, $P_{2O}$ then the said FETs are kept from falling deep into the off state as the DABS's inputs traverse around zero-crossing, which in turn improves the DABS' dynamic response by speeding up the $P_{1O}$, $P_{2O}$ on-off transitions. Note that the DC shift bias voltages $V_{1O}$, $V_{2O}$ can be generated with scaled PMOSFETs, whose $V_{GS}$ would track that of the $P_{1O}$, $P_{2O}$ over normal manufacturing and operating variations.

Depending on the application of DABS, the embodiment of FIG. 1O can provide a faster zero-crossing dynamic response. However, there is a trade-off with some zero-crossing and DABS inaccuracy (over operating and manufacturing variations) associated with constraining the on-off conditions of $P_{1O}$, $P_{2O}$. Also, note that the DABS circuit of FIG. 1O does not require a current mirror with gain of 2.

Description of FIG. 1P

FIG. 1P is a schematic circuit diagram of another embodiment illustrating a DABS circuit. The DABS circuit of FIG. 1P has two outputs, digital $G_O$ and analog $A_O$, and two analog inputs $A_I$ and $A_R$.

Here also $I_{A_I}$, $I_{A_R}$ flow into $A_I$, $A_R$ terminals and $I_{A_O}$ flow out of $A_O$ terminal, and $I_{A_O} \cong |I_{A_I} - I_{A_R}|$.

The aim of the embodiment in this disclosure is also to provide the means for keeping the current steering FETs from becoming deeply off as the DABS circuit's input values cross each other.

Note that in part, $N_{1P}$, $N_{2P}$, $N_{8P}$ function as current mirror, with $N_{5P}$, $N_{6P}$ (biased by $V_{3P}$ that can be generated with a diode connected long channel length NMOS) increase the $CM_{NP}$ output impedance that can also help sharpen the DABS circuit's zero cross-over transition.

First let's set $V_{1P} = V_{2P} = 0$, and consider $I_{A_R} = I_R$, and let $I_{A_I}$ span between $2I_R \geq I_{A_I} \geq 0$.

Let's first consider the case when $I_{A_I} = 0$ and $I_{A_R} = I_R$. Here, $V_{A_I}$ is pulled down while $V_{A_R}$ is lifted, which turns $N_{3P}$ on and turns $N_{4P}$ off. With $N_{3P}$ on, $Id_{N_{3P}}$ flows in, $N_{8P}$ which is mirrored onto $N_{1P}$, $N_{2P}$. As $V_{A_I}$ is pulled down, also the voltages at the source node of $P_{1P}$ and gate node of $P_{2P}$ go down. While $V_{A_R}$ is pulled up also the voltages at the gate node of $P_{1P}$ and source node of $P_{2P}$ are lifted. Therefore, $P_{1P}$ turns off and $P_{2P}$ turn on. With $I_{A_I} = 0$ and $I_{A_R} = I_R$, $P_{2P}$ steers away the $I_{A_R} = I_R$ current so that the operating current through $N_{1P}$ and $N_{2P}$ (which are configured as current mirrors) are equalized which is when $Id_{P_{2P}} \cong I_R - 0 \cong I_{A_R} - I_{A_I}$.

Conversely, let's now consider the case when $I_{A_R} = I_R$ and $I_{A_I} = 2I_R$. Here, $V_{A_I}$ is lifted while $V_{A_R}$ is pulled down, which turns $N_{3P}$ off and turns $N_{4P}$ on. With $N_{4P}$ on, $Id_{N_{4P}}$ flows in, $N_{8P}$ which is mirrored onto $N_{1P}$, $N_{2P}$. Note also that as $V_{A_I}$ is lifted, also the voltages at the source node of $P_{1P}$ and gate node of $P_{2P}$ are lifted. While $V_{A_R}$ is pulled down, also the voltages at the gate node of $P_{1P}$ and source node of $P_{2P}$ are pulled down. Therefore, $P_{1P}$ turns on and $P_{2P}$ turn off. With $I_{A_I} = 2I_R$ and $I_{A_R} = I_R$, $P_{1P}$ steers away enough current from $I_{A_I} = 2I_R$ in order for $N_{1P}$ and $N_{2P}$ currents to equalize which is when $Id_{P_{1P}} \cong 2I_R - I_R \cong I_R \cong I_{A_R} - I_{A_I}$.

In summary, when $I_{A_I}$ span from zero scale to full scale, around $I_{A_R}$, their net difference $(I_{A_R} - I_{A_I})$ is channeled through current steering FETs, $P_{1P}$ or P, whose drain currents are lumped $(Id_{P_{1P}} + Id_{P_{2P}})$. Accordingly, the output current flowing into the $A_O$ terminal of FIG. 1P is $I_{A_O} \cong |I_{A_I} - I_{A_R}|$.

Concurrently, the difference between $I_{A_I}$ and $I_{A_R}$ generates a difference between the $V_{A_I}$ and $V_{A_R}$ which is fed onto the inputs of comparator, $A_{1O}$, that initiates the digital $G_O$ signal.

In FIG. 1P, by inserting DC shift bias voltages $V_{1P}$, $V_{2P}$ around the steering FETs $P_{1P}$, $P_{2P}$ then the said FETs are kept from entering the deep off state while DABS input's difference traverse around the zero-crossing. Hence, the dynamic response of steering FETs, $P_{1P}$, $P_{2P}$ can be improved via speeding up their on-off transitions. Note that the DC shift bias voltages $V_{1P}$, $V_{2P}$ can be generated with scaled PMOSFETs, whose $V_{GS}$ would track that of the $P_{1P}$, $P_{2P}$ over normal manufacturing and operating variations. Depending on the application of DABS, the embodiment of FIG. 1O can provide a faster zero-crossing dynamic response, which can be traded off with the introduced inaccuracy associated with constraining the on-off conditions of $P_{1P}$, $P_{2P}$.

Also note that the DABS circuit of FIG. 1P does not require a gain of 2 current mirror, to for example facilitate cascading plurality of DABS circuits for use in AiADC.

Figure 2A:
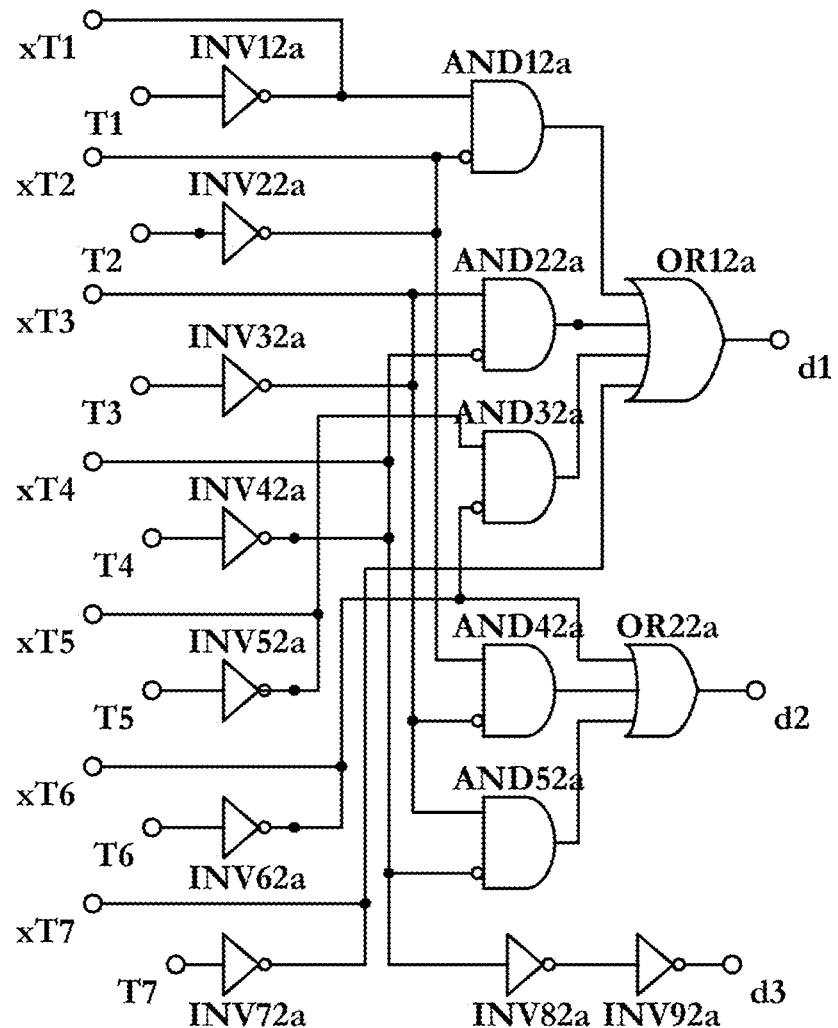
FIG. 2A is a logic circuit diagram illustrating a logic encoder.

Description of FIGS. 2A and 2A'

FIG. 2A is a schematic logic diagrams of a thermometer code (with 7-inputs) to binary code (with 3-outputs) encoder. It has 7 inputs, $T_7$, $T_6$, $T_5$, $T_4$, $T_3$, $T_2$, $T_1$ (or opposite polarity inputs $\overline{T_7}$, $\overline{T_6}$, $\overline{T_5}$, $\overline{T_4}$, $\overline{T_3}$, $\overline{T_2}$, $\overline{T_1}$) and 3 outputs $D_3$, $D_2$, $D_1$, where for 3-bits $D_3$ is the MSB and $D_1$ is the LSB. Note that for example $\overline{T_7}$ are $xT_7$ through $\overline{T_1}$ are $xT_1$ terminologies are the same and interchangeable.

The encoder contains 5 two input NAND gates $NAND_{1_{2A}}$ to $NAND_{7_{2A}}$; nine inverters $INV_{1_{2A}}$ to $INV_{9_{2A}}$; and two OR gates $OR_{1_{2A}}$, $OR_{2_{2A}}$.

FIG. 2A' is a truth table of the encoder disclosed in FIG. 2A. The section of the table on the left side depicts the inputs' thermometer code combinations, and the section of the table on the right-hand side is the corresponding binary code outputs of the encoder.

This encoder is utilized in iADC embodiments of FIGS. 3A, 3B, 3C, 3D, 3H, 3I, and 3J which will be described later. Other implementations of encoders (in higher resolution ADCs) with wider thermometer-input to binary-output digital bit sizes (e.g., 15-input to 4-output, 255-input to 8-output, etc.) would be obvious to those skilled in the art.

Figure 2B:
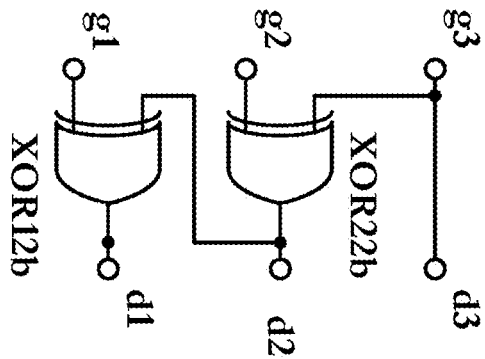
FIG. 2B is a logic circuit diagram illustrating a logic decoder

Description of FIGS. 2B and 2B'

FIG. 2B is a schematic logic diagrams of a gray code (with 3-inputs) to binary code (with 3-outputs) decoder. It has 3 inputs, $G_3$, $G_2$, $G_1$ and 3 outputs $D_3$, $D_2$, $D_1$, where for 3-bits $D_3$ is the MSB and $D_1$ is the LSB.

The decoder contains 2 two input exclusive or (XOR) gates $XOR_{1_{2B}}$, $XOR_{2_{2B}}$. FIG. 2B' is a truth table of the decoder disclosed in FIG. 2A. The section of the table on the left side depicts the inputs' gray code combinations, and the section of the table on the right-hand side is the corresponding binary code outputs of the decoder.

The decoder is utilized in iADC embodiments of FIG. 3E, 3F, 3G, which will be described later. Other implementations of decoders (in higher resolution iADCs) with wider gray-input to binary-output bit sizes (e.g., 8-input to 8-output, 16-input to 16-output, etc.) would be obvious to those skilled in the art.

Figure 2C:
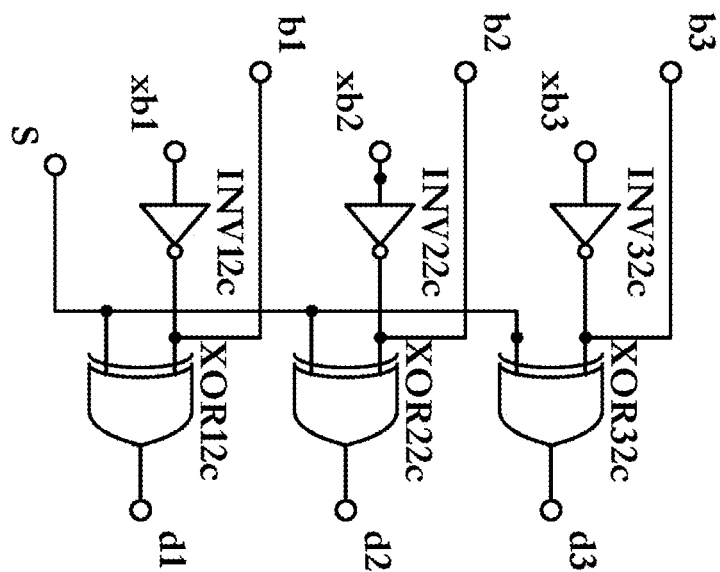
FIG. 2C is a logic circuit diagram illustrating logic flip.

Description of FIGS. 2C and 2C'

FIG. 2C is a schematic logic diagrams of a flip logic with 3-input and 3-outputs. It has 4 inputs comprising three binary input $B_3$, $B_2$, $B_1$ (or 3 opposite polarity input $\overline{B_3}$, $\overline{B_2}$, $\overline{B_1}$), and one sign control input S. It has 3 binary outputs $D_3$, $D_2$, $D_1$, where for 3-bits $D_3$ is the MSB and $D_1$ is the LSB.

The flip logic contains 3 two input exclusive or (XOR) gates $XOR_{1_{2C}}$ to $XOR_{2_{3C}}$, and 3 inverters $INV_{1_{2C}}$ to $INV_{2_{3C}}$.

FIG. 2C' is a truth table of the flip logic disclosed in FIG. 2C. Note that, for example, $\overline{B_3}$ and $xB_3$ through $\overline{B_1}$ and $xB_1$ can be used interchangeably in this disclosure. The section of the table on the left side depicts the inputs' binary code combinations, and the section of the table on the right-hand side is the corresponding flipped binary code outputs.

The flip logic is utilized in ADC embodiments of FIGS. 4A, 4B, and 4C which will be described later. Other implementations of flip logic (used in higher resolution ADCs) with wider binary-input to flipped binary-output bit sizes (e.g., 8-input to 8-output, 16-input to 16-output, etc.) would be obvious to those skilled in the art.

The description provided in the next four sections are applicable to FIGS. 3A, 3B, 3C, 3D, 3I, and 3J which are thermometer current mode ADCs (TiADC). Moreover, the descriptions provided about the FIG. 3 series is also applicable to the FIG. 4 series, which are multi-stage iADCs that utilize TiADCs. For clarity and continuity of discussion, the resolutions of TiADC and each stage in multi-stage iADC are chosen to be equal at 3-bits each for clarity of illustration and not due to a limitation. The benefits of TiADC (utilizing SCM) are:

First, cascade of successive SCCs utilizing SCM successively in TiADC, improve the linearity of TiADC by lowering the sensitivity of the TiADC's reference network to normal and random (non-systematic) mismatch errors in manufacturing, and this is how: The Random (non-systematic) but normal component mismatch in silicon manufacturing (e.g., between FETs, resistors, capacitors, etc.) cause linearity errors in the ADC due to the non-linearity in the reference network of an ADC that utilize such components. This application discloses a method (SCM) that effectuates a thermometer current reference network for a TiADC, that operates based on the mathematical function of 'summation'. Each incremental increase (or decrease) in the input signal of a TiADC, in effect, causes an equally weighted reference current segment to be added (or subtracted) to (and from) the previous cumulative reference current weight. A TiADC's non-linearity due to the statistical contributions of random (non-systematic) mismatches, between the segments of a thermometer reference current network, amount to the square root of the sum of the squares of such the random mismatches. As such the accumulated statistical contributions of random mismatches between the thermometer current reference segments is reduced by about $\sqrt{2^D}$, where the number of reference segments of a thermometer network are $2^D-1=T-1$. Let's for example, consider a normal manufacturing process where random mismatch between FETs could exhibit $\sigma=2\%$, and that such FETs are utilized in a making the segmented current sources of the thermometer current reference segments. For example, in a 3-bit TiADC there would be cascade of $2^3-1$ or seven SCCs that utilize the SCM seven successive instances. There would also be seven segmented reference current sources, each with equal values of $I_R/2^3$. As such, the statistical contribution of non-linearity of the 3-bit TiADC is reduced to about $\sigma/\sqrt{2^D}=2\%/\sqrt{8}=0.7\%$ that is attributed to the random mismatch between FETs in the in the 7 current reference segments of the thermometer reference current network.

Second, the disclosed TiADC is inherently monatomic (e.g., to the degree of precision attained by the MSBs) since at every bit transition, either a current segment is added or subtracted to the previous one. This is again, due to the inherent benefit of the disclosed TiADC's code transitions that operate based on the function of summation.

Third, SCM can be implemented on multi-stage iADCs which can be arranged by utilizing a more accurate current reference network for the MSB TiADC that is followed by a smaller, faster, and less accurate LSB (subsequent) iADC that can afford to be less accurate. For example, for a 9-bit iADC, the first stage 3-bit TiADC need to be 9 bits accurate or 0.19% accurate. A second stage 6-bit iADC need only be 6-bit accurate or 1.5%, and accordingly the whole 9-bit iADC would still be about 9-bit accurate or to about 0.19%. Therefore, the first stage can utilize a TiADC that is inherently more accurate because SCM makes the TiADC less sensitive to random mismatches in manufacturing. The second stage iADC can be made with smaller FETs, for example, to optimize for dynamic performance and speed instead of accuracy.

Fourth, in applying the SCM successively which requires cascading T-1 SCCs in TiADC, the accuracy of TiADC is dominated by the matching of the segmented reference currents. In part, because both the reference signal and the input signal are current signals that act on SCC, the offset or mismatches errors in SCC contribute minimally to the accuracy of the overall iADC.

Fifth, the SCC in TiADC operates in current mode, which is inherently fast and can operate with low supply voltages. The overall iADC can operate in subthreshold, which enables the ADC to operate at ultra low current and lower power supply voltages.

Sixth, the point of slowest comparison time ($\tau_s$) within a TiADC, is at a SCC whose input current signal and (segmented) reference current signal are near balance. The larger the difference between input and reference currents, the larger the current overdrive to charge and discharge the input capacitance of SCC, and thus the faster the SCC in performing its differencing and comparison functions. In other words, although the SCCs are cascaded in TiADC, the delay contributions of each SCC in the cascade are not equal. Although the dynamic response time of the TiADC is dominated by one SCC with the slowest response time whose input signal and reference signal are near balance, the remaining SCC whose input signal and reference signal are not near balance have sufficient over drive to generate the proper code fast. Also note that it would be obvious to those skilled in the art to utilize digital techniques to improve the dynamic accuracy of the disclosed ADC, including but not limited to bubble error correction circuit in conjunction with the ADC's encoder logic.

Seventh, as explained earlier, the SCC concurrently performs analog differencing and digital comparison between its analog input and a reference current signal. This trait provides asynchronous clock free operations that lower power consumption, when compared to clocked ADCs whose free running clock and the ADC's associated digital logic draw dynamic power from the power supplies. Therefore, the dynamic accuracy of TiADC deteriorates gradually, and not abruptly with increased frequency of the TiADC's input (current) signal.

Eighth, TiADC with non-linear transfer function can be arranged based on this disclosure. This is accomplished by programming (by different scaling of) the segmented reference current sources inputted to each SCC along the cascade of SCCs, utilized in TiADC, according to an objective non-linear transfer function.

Ninth, as mentioned earlier, the TiADC is clock free (asynchronous), which reduces dynamic power consumption and eliminates the need for clock.

Tenth, the SCC can utilize differential circuitry (such as differential amplifier and comparator) which can improve iADC's power supply and noise rejection.

Eleventh, the disclosed TiADC are relatively analog heavy and digital light. Combination of digital light TiADC that needs no clock, further reduces the dynamic power consumption of the disclosed iADC.

Twelfth, TiADC is based on standard CMOS technology that can be made low cost and high reliability since it is manufacturable with standard digital fabrication that is widely available.

Thirteenth, the TiADC requires no resistors nor any capacitors, which saves additional manufacturing cost.

Figure 3A:
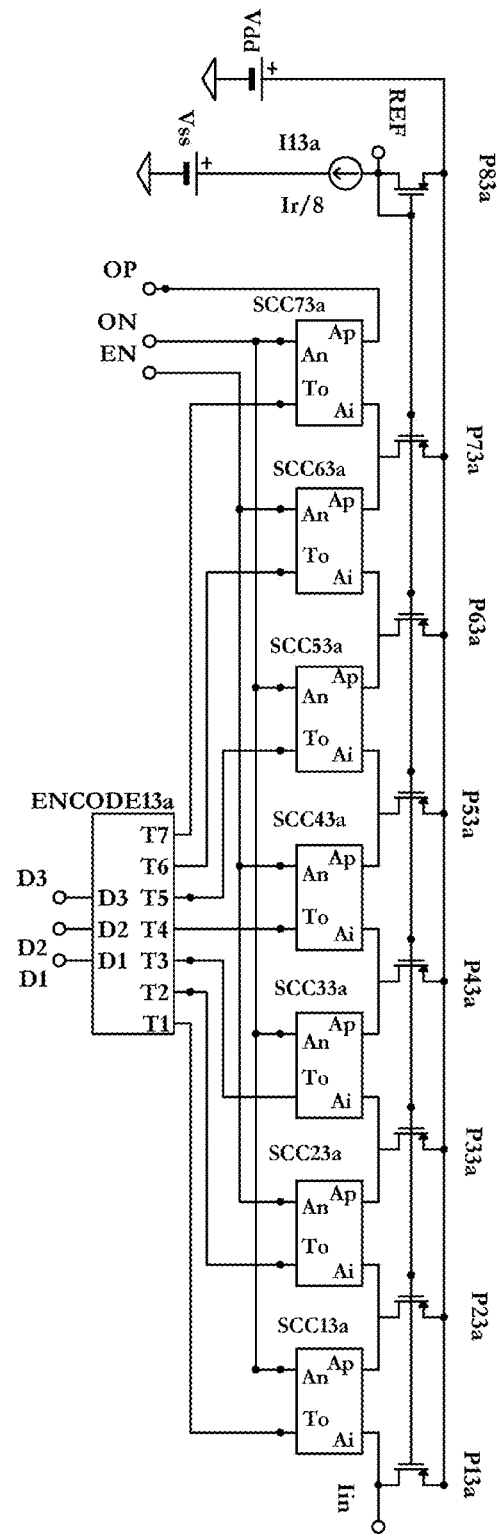
FIG. 3A is a circuit block diagram of an embodiment illustrating a TiADC.

Description of FIG. 3A

FIG. 3A illustrates a circuit block diagram of an embodiment illustrating a TiADC that successively utilizes the disclosed SCM illustrated in FIG. 6B. For sake of clarity and brevity, the TiADC with 3-bits of resolution is described here. In applying the disclosed SCM here though, it would be obvious for one skilled in the art that the TiADC can be arranged having different resolutions.

This TiADC has one analog input port $I_{IN}$, one analog reference input port REF, three analog output ports $O_N$, $E_N$, $O_P$, and 3-bit digital binary outputs $D_3$, $D_2$, $D_1$, where $D_3$ is the MSB and $D_1$ is the LSB. As described earlier, note that TiADC's internal (digital outputs of cascade of SCCs are the) thermometer codes ($T_1$ through $T_7$) are mapped into a binary format output code ($D_1$ through $D_3$) utilizing a logic encoder (ENCODE).

Applying the SCM method illustrated in FIG. 6B, the ADC of FIG. 3A is comprising of a cascade of seven SCCs, which are arranged successively with the first $SCC_{1_{3A}}$, $SCC_{2_{3A}}$, $SCC_{3_{3A}}$, $SCC_{4_{3A}}$, $SCC_{5_{3A}}$, $SCC_{6_{3A}}$, and the seventh $SCC_{7_{3A}}$. These SCCs can utilize similar SCC embodiments such as the ones illustrated in FIG. 1A, 1B, 1C, 1D, 1E, or 1F.

A reference current with value $I_R/8$ is fed onto the REF port that is coupled with a diode connected $P_{8_{3A}}$. The segmented reference current sources are generated by mirroring REF current onto $P_{1_{3A}}$, $P_{2_{3A}}$, $P_{3_{3A}}$, $P_{4_{3A}}$, $I_{5_{3A}}$, $P_{6_{3A}}$, $P_{7_{3A}}$ (that can be cascoded for increased output impedance) operating at reference current segment values $I_{R_1}/8$, $I_{R_2}/8$, $I_{R_3}/8$, $I_{R_4}/8$, $I_{R_5}/8$, $I_{R_6}/8$, $I_{R_7}/8$, respectively. Here, the $I_{R_1}/8$ to $I_{R_7}/8$ values are all set to be equal to $I_R/8$. As a reminder, $2^D-1=T-1=m-1=7$.

It is of note that, for example, in the case of non-linear ADCs having a non-linear transfer functions, different $I_{R_1}/8$ to $I_{R_7}/8$ values may be programmed.

The SCM enables multi-staging a TiADC by re-directing the current signals that are available through $O_N$, $E_N$, $O_P$ ports onto a RALSP circuit (whose output feeds a subsequent iADC that facilitates expanding the ADC's overall resolution at low cost and low currents), which will be discussed later.

As explained earlier, by applying the SCM of FIG. 6B, when comparing $I_{A_I}$ and $I_R/m$ if $I_{A_I}-I_R/m<0$, then $I_{A_P}=0$, $I_{A_N}=I_R/m-I_{A_I}$, $T_O=1$; and if $I_{A_I}-I_R/m>0$, then $I_{A_P}=I_{A_I}-I_R/m$, $I_{A_N}=0$, $T_O=0$.

To describe the implementation of SCM (illustrated in FIG. 6B) and its operation on TiADC of FIG. 3A, let $I_{IN}=2.5I_R/8$.

For the first SCC, since for the first $SCC_{1_{3A}}$ the $I_{A_I}=I_{IN}-I_{R_1}/8\cong2.5I_R/8-I_R/8>0$, where first segment current value of $I_{R_1}/8$ is supplied via $P_{1_{3A}}$. Thus, for $SCC_{1_{3A}}$ the $I_{A_P}\cong I_{IN}-(I_{R_1}/8)\cong1.5I_R/8$, and $I_{A_N}\cong0$, and $T_O=T_{O1}=0$.

For the second $SCC_{2_{3A}}$ the $I_{A_I}=I_{A_P}-I_{R_2}/8\cong1.5I_R/8-I_R/8>0$, where the second segment current value of $I_{R_2}/8$ is supplied via $P_{2_{3A}}$. Thus, for $SCC_{2_{3A}}$ the $I_{A_P}\cong I_{IN}-(I_{R_1}/8\ I_{R_2}/8)=0.5I_R/8$, and $I_{A_N}\cong0$, and $T_O=T_{O2}=0$.

At this point, the SCM's transition occurs for the third $SCC_{3_{3A}}$ with $I_{A_I}=I_{A_P}-I_{R_3}/8\cong0.5I_R/8-I_R/8<0$, and where the third segment current value of $I_{R_3}/8$ is supplied via $P_{3_{3A}}$. Thus, for $SCC_{3_{3A}}$ the $I_{A_P}\cong0$. Also, for $SCC_{3_{3A}}$ the $I_{A_N}\cong I_{R_3}/8-[I_{IN}-(I_{R_1}/8+I_{R_2}/8)]\cong(I_{R_1}/8+I_{R_2}/8+I_{R_3}/8)-I_{IN}\cong0.5I_R/8$. Moreover, for $SCC_{3_{3A}}$ the $T_O=T_{O3}=1$.

For the fourth $SCC_{4_{3A}}$ the $I_{A_I}=0-I_{R_4}/8<0$, where the fourth segment current value of $I_{R_4}/8$ is supplied via $P_{4_{3A}}$. Thus for $SCC_{4_{3A}}$ the $I_{A_P}\cong0$, and $I_{A_N}\cong I_{R_4}/8\cong I_R/8$, and $T_O=T_{O4}=1$.

For fifth $SCC_{5_{3A}}$ the $I_{A_I}=0-I_{R_5}/8<0$, where the fifth segment current value of $I_{R_5}/8$ is supplied via $P_{5_{3A}}$. Thus, for $SCC_{5_{3A}}$ the $I_{A_P}\cong0$, and $I_{A_N}\cong I_{R_5}/8\cong I_R/8$, and $T_O=T_{O5}=1$.

The sixth $SCC_{6_{3A}}$ the $I_{A_I}=0-I_{R_6}/8<0$, where the sixth segment current reference value of $I_{R_6}/8$ is supplied via $P_{6_{3A}}$. Thus, for $SCC_{6_{3A}}$ the $I_{A_P}\cong0$, and $I_{A_N}\cong I_{R_6}/8\cong I_R/8$, and $T_O=T_{O6}=1$.

Lastly, for the seventh $SCC_{7_{3A}}$ the $I_{A_I}=0-I_{R_7}/8<0$, where the seventh segment current reference value of $I_{R_7}/8$ is supplied via $P_{7_{3A}}$. Thus, for $SCC_{7_{3A}}$ the $I_{A_P}\cong0$, and $I_{A_N}\cong I_{R_7}/8\cong I_R/8$, and $T_O=T_7=0$.

As a reminder, for example the term $SCC_{7_{3A}}|I_{A_N}$ means the $I_{A_N}$ of $SCC_{7_{3A}}$. Also, for example, the term $SCC_{7_{3A}}|I_{A_P}$ means $I_{A_P}$ of $SCC_{7_{3A}}$.

Note that the current flowing through $O_N$ port, $I_{O_N}\cong SCC_{7_{3A}}|I_{A_N}+SCC_{5_{3A}}|I_{A_N}+SCC_{3_{3A}}|I_{A_N}+SCC_{1_{3A}}|I_{A_N}\cong I_R/8+I_{R_5}/8+0.5I_{R_3}/8+0I_{R_1}/8\cong2.5I_R/8$.

Also, the current flowing through $O_P$ port, $I_{E_P}\cong SCC_{6_{3A}}|I_{A_N}+SCC_{4_{3A}}|I_{A_N}+SCC_{2_{3A}}|I_{A_N}\cong I_{R_6}/8 \quad I_{R_4}/8+0I_{R_2}/8\cong2I_{R_3}/8$.

Lastly, the current flowing through $O_P$ port, $I_{O_P}\cong SCC_{7_{3A}}|I_{A_P}\cong0$.

As discussed in sections pertaining to FIGS. 1H, 1I, 1J, and 1Q, the $O_N$, $E_N$, $O_P$ signals are fed onto a RALSP circuit to generate $I_{A_L}$. The $I_{A_L}$ represents the residual analog least significant portion (RALSP) of $I_{IN}$.

To explain $I_{A_L}$ differently, consider an iADC with analog input signal $I_{IN}$, analog reference signal $I_R$, and $D_O$ being the digital output of the MSB bank having D bits. Then consider feeding the iADC's $D_O$s to an ideal digital to analog converter (DAC) to generate $I_{IN_{msb}}$ that is the analog most significant portion (MSP) of $I_{IN}$. The RALSP signal $I_{A_L}$ can be reproduced by subtracting $I_{IN_{msb}}$ from $I_{IN}$:

$$I_{IN_{msb}} = \frac{I_R}{2^D}\left[\sum_{O=1}^{D} D_O \times 2^{D-O}\right]$$

$$I_{A_L} = I_{IN} - I_{IN_{msb}}$$

For example, when $I_{IN}=2.5I_R/8$ then the 3-MSBs bank (D=3) would be $D_3=0$, $D_2=1$, $D_1=1$. If these 3-MSBs are applied onto a hypothetical DAC (with same full scale $I_R$), then the said DAC output current $I_{IN_{msb}}=2I_R/8$. Accordingly, $I_{A_L}=I_{IN}-I_{IN_{msb}}=0.5I_R/8$.

Note that by utilizing the RALSP circuit in this example, if $I_{IN}=2.5I_R/8$, then $I_{A_L}=I_{O_N}-I_{E_N}-I_{O_P}\cong(I_R/8+I_{R_5}/8+0.5I_{R_3}/8+0I_{R_1}/8)$ $(I_{R_6}/8+I_{R_4}/8+0I_{R_2}/8)-0\cong0.5I_R/8$.

In summary, the analog input $I_{IN}=2.5I_R/8$ corresponds to thermometer codes $xT_7=0$, $xT_6=0$, $xT_5=0$, $xT_4=0$, $xT_3=0$, $xT_2=1$, $xT_1=1$ that equates to binary format $D_3=0$, $D_2=1$, $D_1=1$, as depicted in FIG. 2A', and the $I_{IN}$'s residual analog least significant portion is $I_{A_L}\cong0.5I_R/8$.

As discussed earlier, applying the SCM successively, effectuates 'summation' to operate on the segmented current reference network of iADC to function like a thermometer network (e.g., having $I_{R_1}/8$ to $I_{R_7}/8$ values). This is shown in the FIG. 3A example, wherein successive application of SCM provides for $I_{IN}$ to be compared with incremental 'summation' of segments of reference currents $I_{R_1}/8$ to $I_{R_7}/8$ (in a thermometer current fashion), starting with first $SCC_{1_{3A}}$ with $I_{A_I}=I_{IN}-I_{R_1}/8$ through the second $SCC_{2_{3A}}$ with $I_{A_P}\cong I_{IN}-(I_{R_1}/8+I_{R_2}/8)$.

Accordingly, linearity of the 3-bit ADC (with $2^D-1=T-1$ reference segments of a thermometer current network) in the example of FIG. 3A is improved. By utilizing the SCM, (the impact on TiADC's non-linearity attributed to) the statistical contribution of average of the normal and random manufacturing mismatches of $\sigma$ % between segmented reference current sources is attenuated by about $\sqrt{2^D}=\sqrt{8}$ times.

To expand the resolution of an iADC, one of the benefits of pairing up a TiADC (illustrated in FIG. 3A) with a RALSP circuit (illustrated in FIG. 1I) is that the generated $I_{A_L}$ would follow an equilateral triangular waveform profile. This feature smoothes the signal transitions for $I_{A_L}$ and avoids zero-scale to full-scale transition impulses from being fed onto the next stage iADC, which improves the overall dynamic performance of the multi-stage iADC. Also, this arrangement is logic light, which is small and consumes lower dynamic power consumption. However, the TiADC illustrated in FIG. 3A has trade off. The low power, low cost, and better dynamic performance are traded off here with a drag on high accuracy due to the way of the RALSP functioning. As explained earlier, the $I_{A_L}$ (that is generated by the RALSP circuit) would be the difference between sum of many odd and sum of many even $I_{A_N}$ of successive SCCs. This difference between two large sums (of odd and even $I_{A_N}$s) would contribute a non-linearity, which negatively impacts the higher accuracy of the overall multi-staged iADC.

On a separate note, for mid-resolution TiADC, the FIG. 3A embodiment (coupled with a RALSP circuit) has enhanced dynamic performance for another reason, which is the transient smoothing of $I_{A_N}$ associated with averaging the difference between sum of multiple odd and even $I_{A_N}$s. Again, the embodiment disclosed above provides the option of choosing enhanced dynamic response over normal precision. Later, alternative embodiments are provided that offer higher precision over normal dynamic response.

Figure 3B:
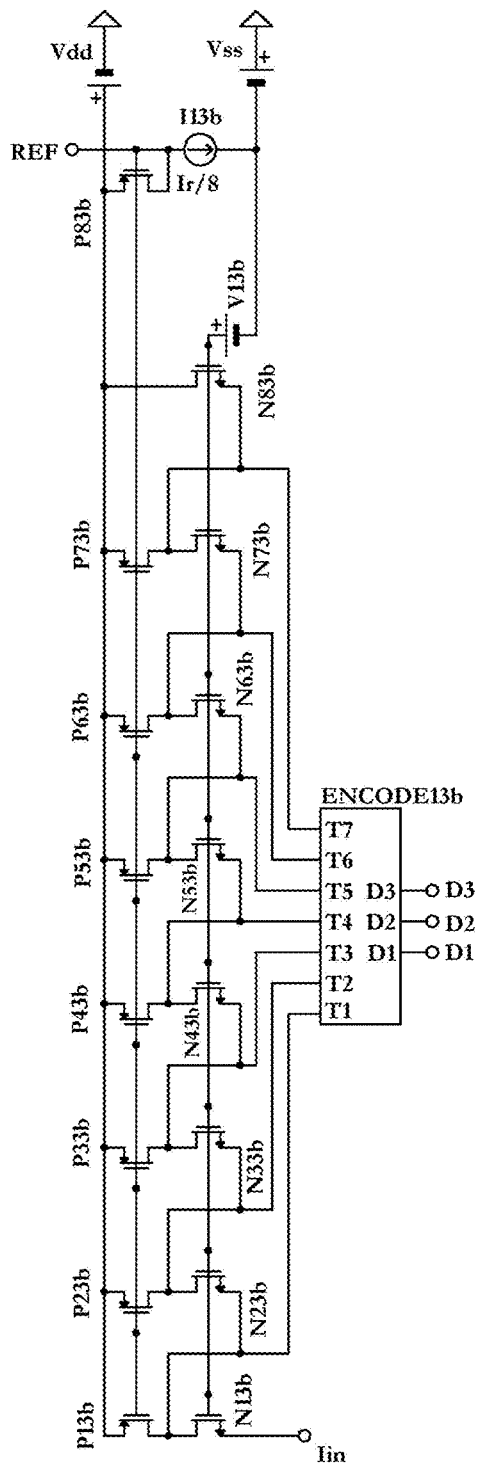
FIG. 3B is a circuit block diagram of another embodiment illustrating a TiADC that utilizes FIG. 3A.

Description of FIG. 3B

Figure 3C:
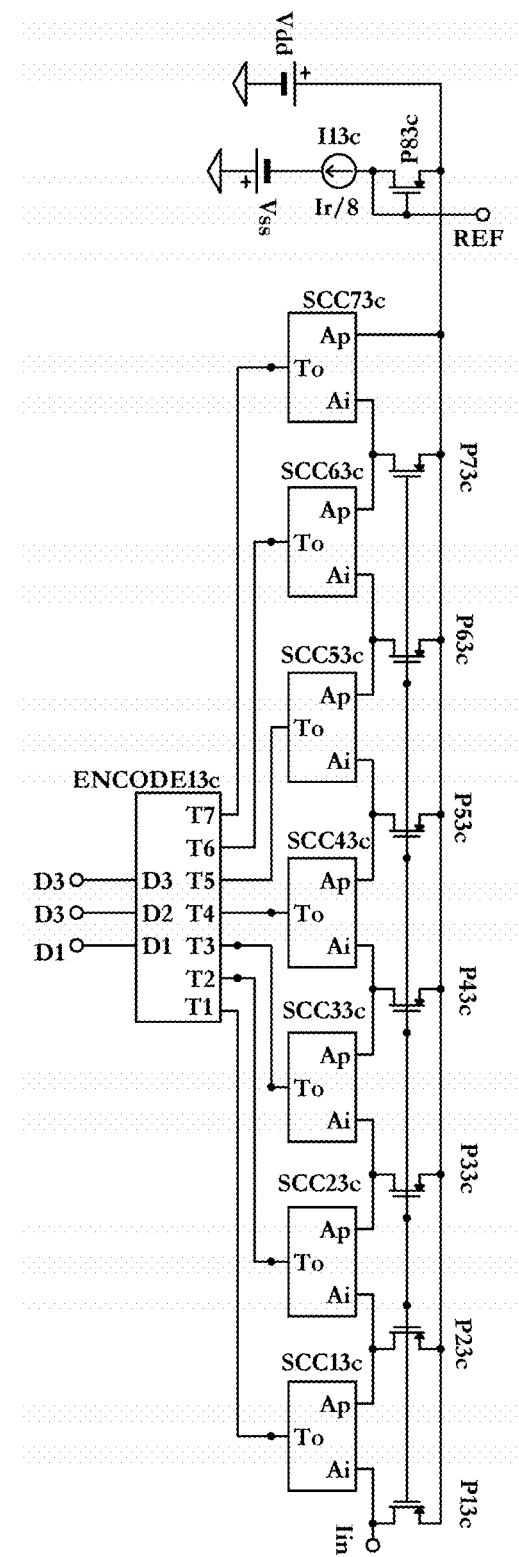
FIG. 3C is a circuit block diagram of another embodiment illustrating a TiADC.

FIG. 3B is a circuit block diagram depicting a TiADC of FIG. 3C that can utilize SCC of FIG. 1A' or FIG. 1B'. Here, the TiADC is depicted with 3-bits of resolution, has one analog input $I_{IN}$, one reference input REF, and 3 digital outputs $D_3$, $D_2$, $D_1$. As described earlier, note that TiADC's internal (digital outputs of successive SCCs are the) thermometer codes ($T_1$ through $T_7$) are mapped into a binary format output code ($D_1$ through $D_3$) utilizing a logic encoder (ENCODE).

Again, for sake of descriptive clarity and brevity (but not limitation of) the TiADC with 3-bits of resolution is described here. In applying SCM here, it would be obvious for one skilled in the art that the iADC can be arranged with different resolutions.

The TiADC's REF input feeds the diode connected $P_{8_{3B}}$ with $I_R/8$, which is mirrored across the iADC's thermometer current reference segment network. The TiADC's segmented reference current network is comprising of seven FETs which are $P_{1_{3B}}$, $P_{2_{3B}}$, $P_{3_{3B}}$, $P_{4_{3B}}$, $P_{5_{3B}}$, $P_{6_{3B}}$, $P_{7_{3B}}$ running at current segment values of $I_{R_1}/8$, $I_{R_2}/8$, $I_{R_3}/8$, $I_{R_4}/8$, $I_{R_5}/8$, $I_{R_6}/8$, $I_{R_7}/8$, respectively.

Here, the values of $I_{R_1}/8$ to $I_{R_7}/8$ are all set to be equal to $I_R/8$, but they can be set to other values. For example, in the case of non-linear TiADC, a non-linear transfer function may be programmable by providing different $I_{R_1}/8$ to $I_{R_7}/8$ values.

The FETs in the segmented current reference network (current mirrors) can be cascaded to increase the output impedance of the current source segments.

The SCC illustrated in FIG. 1A' is utilized successively here $2^D-1=T-1=m-1=2^3-1=7$ times in a cascaded fashion from first $N_{1_{3B}}$ to seventh $N_{7_{3B}}$ whose gate nodes is biased by $V_{1_{3B}}$.

Note that $N_{8_{3B}}$ function as a low clamp for the drain node of $N_{7_{3B}}$. The bias voltage $V_{SS}+V_{1_{3B}}-Vgs_{N1_{3B}} \cong V_{TL_{3B}}$ can be programmed to set the lower voltage limit for $I_{IN}$'s input terminal and also provides a low clamp voltage for the source nodes of $N_{1_{3B}}$ to $N_{7_{3B}}$, which are the corresponding $A_I/T_O$ terminal of FIG. 1A's SCC.

As stated earlier, the $A_I/T_O$ node is an input current node (where input and reference currents are sensed by the SCC) and an output voltage node (where $T_O$ is generated by SCC).

The source nodes of $N_{1_{3B}}$ to $N_{7_{3B}}$ can swing between low of $V_{TL_{3B}}$ and high of near $V_{DD}$, which establishes the $T_O$ signal voltage span. An added $T_O$ signal buffer (not shown) can provide the rail-to-rail digital voltage swing before $T_O$ signal is fed onto the encoder circuit.

The source nodes of $N_{1_{3B}}$ to $N_{7_{3B}}$ are also the $A_I$ terminals of the SCCs.

In a SCC, when $I_{A_I} < I_R/m$, then $I_{A_P}=0$ and $T_O=1$ and if $I_{A_I} > I_R/m$, then $I_{A_P}=I_{A_I}-I_R/m$, $T_O=0$.

Let's run through the case where TiADC's input current signal $I_{IN}=6.5I_R/8$.

Since $I_{IN}=6.5I_R/8 > I_{P1_{3B}}=I_{R_1}/8=I_R/8$, then $I_{IN}$ flows through $N_{1_{3B}}$ and pulls down on its drain node (which is also the source node of $N_{2_{3B}}$). Accordingly, $T_O=T_{O1}=0$ for $N_{1_{3B}}$. Also, $I_{N2_{3B}}=I_{IN}-I_{R_1}/8 \cong 6.5I_R/8-I_R/8 \cong 5.5I_R/8$.

Considering $I_{N2_{3B}} \cong 5.5I_R/8 > I_{P2_{3B}}=I_{R_2}/8=I_R/8$, then $I_{N2_{3B}}$ pulls down on its drain node (which is also the source node of $N_{3_{3B}}$). Thus, $T_O=T_{O2}=0$ for $N_{2_{3B}}$. Also, $I_{N3_{3B}}=I_{IN}-(I_{R_1}/8+I_{R_2}/8) \cong 4.5I_R/8$.

With $I_{N3_{3B}} \cong 4.5I_R/8 > I_{P3_{3B}}=I_{R_3}/8$, then $I_{N3_{3B}}$ pulls down on its drain node (which is also the source node of $N_{4_{3B}}$). Thus, $T_O=T_{O3}=0$ for $N_{3_{3B}}$. Also, $I_{N4_{3B}}=I_{IN}-(I_{R_1}/8+I_{R_2}/8+I_{R_3}/8) \cong 3.5I_R/8$.

Given that $I_{N4_{3B}} \cong 3.5I_R/8 > I_{P4_{3B}}=I_{R_4}/8$, then $I_{N4_{3B}}$ pulls down on its drain node (which is also the source node of $N_{5_{3B}}$). Thus, $T_O=T_{O4}=0$ for $N_{4_{3B}}$. Also, $I_{N5_{3B}}=I_{IN}-(I_{R_1}/8+I_{R_2}/8+I_{R_3}/8+I_{R_4}/8) \cong 2.5I_R/8$.

Again, since $I_{N5_{3B}} \cong 2.5I_R/8 > I_{P5_{3B}}=I_{R_5}/8$, then $I_{N5_{3B}}$ pulls down on its drain node (which is also the source node of $N_{6_{3B}}$). Thus, $T_O=T_{O5}=0$ for $N_{5_{3B}}$. Also, $I_{N6_{3B}}=I_{IN}-(I_{R_1}/8+I_{R_2}/8+I_{R_3}/8+I_{R_4}/8+I_{R_5}/8)=1.5I_R/8$.

Lastly, considering $I_{N6_{3B}} \cong 1.5I_R/8 > I_{P6_{3B}}=I_{R_6}/8$, then $I_{N6_{3B}}$ pulls down on its drain node (which is also the source node of $N_{7_{3B}}$). Thus, $T_O=T_{O6}=0$ for $N_{6_{3B}}$. Also, $I_{N7_{3B}}=I_{IN}-(I_{R_1}/8+I_{R_2}/8+I_{R_3}/8+I_{R_4}/8+I_{R_5}/8+I_{R_6}/8) \cong 0.5I_R/8$.

A transition occurs here, considering $I_{N7_{3B}} \cong 0.5I_R/8 < I_{P7_{3B}}=I_R/8$, then $I_{P7_{3B}}$ pulls up on its drain node, and $T_O=T_{O7}=1$ for $N_{7_{3B}}$.

In summary, the TiADC's analog input $I_{IN}=6.5I_R/8$ corresponds to thermometer codes (with an inverter inserted between SCC's digital output and encoder's digital input) $xT_7=0$, $xT_6=1$, $xT_5=1$, $xT_4=1$, $xT_3=1$, $xT_2=1$, $xT_1=1$ which corresponds to binary format $D_3=1$, $D_2=1$, $D_1=0$, as depicted in FIG. 2A'.

As discussed earlier, applying the SCM successively in a TiADC is founded on 'summation' that operates on the segmented reference currents of TiADC to function like a thermometer network (e.g., $I_{R_1}/8$ to $I_{R_7}/8$). This is illustrated in the FIG. 3B example, wherein SCM arranges for $I_{IN}$ to be compared with incremental (accumulation or) 'summation' of reference current segments at value of $I_R/8$, that are added per increments of $I_{R_1}/8$ to $I_{R_7}/8$ (for a 3-bit TiADC example) in a thermometer fashion.

In FIG. 3B, the starting point of comparison is $I_{N2_{3B}}=I_{IN}-I_{R_1}/8$ and with incremental 'summation' of reference current segment values ($I_R/8$) until the end comparison is $I_{N7_{3B}}=I_{IN}-(I_{R_1}/8+I_{R_2}/8+I_{R_3}/8+I_{R_4}/8+I_{R_5}/8+I_{R_6}/8)$.

Accordingly, linearity of the 3-bit ADC (with $2^D-1=T-1$ reference segments of a thermometer current network) in the illustration of FIG. 3B is improved. By utilizing the SCM, (the impact on TiADC's non-linearity attributed to) the average statistical contribution of normal and random manufacturing mismatches of a % attributed to the segmented reference current sources is attenuated by about $\sqrt{2^D}=\sqrt{8}$ times.

Description of FIG. 3C

FIG. 3C is a circuit block diagram of other embodiments illustrating a TiADC that utilizes the disclosed SCM (illustrated in FIG. 6A).

For sake of clarity and brevity, a TiADC with 3-bits of resolution is described here. In applying the disclosed SCM here, it would be obvious for one skilled in the art that the TiADC can be made with different resolutions.

The 3-bit (D-bits) TiADC of FIG. 3C has one analog input port $I_{IN}$ one analog reference input port REF, and 3-bit digital binary outputs $D_3$, $D_2$, $D_1$, where $D_3$ is the MSB and $D_1$ is the LSB. As described earlier, note that TiADC's internal (digital outputs of successive SCCs, which are the) thermometer code ($T_1$ through $T_7$) are mapped into a binary format output code ($D_1$ through $D_3$) utilizing a logic encoder (ENCODE).

The REF port is supplied with a reference current value of $I_R/m$ where $m=T=2^D=2^3=8$. Note that $I_{IN}$ spans from zero to full scale, where full scale is the value $I_R$.

The $I_R/8$ is fed onto the diode connected $P_{8_{3C}}$, which is mirrored onto seven reference current segments, considering the 7-thermometer current reference segment count is calculated by $m-1=2^D-1=T-1=2^3-1=7$.

The TiADC's current reference segment network is comprising of current mirrors running at equal currents ($I_R/8$ in this example) and equally scaled FETs $P_{1_{3C}}$, $P_{2_{3C}}$, $P_{3_{3C}}$, $P_{4_{3C}}$, $P_{5_{3C}}$, $P_{6_{3C}}$, $P_{7_{3C}}$, which mirror the diode connected $P_{8_{3C}}$, that runs at $I_R/8$.

Note that the current reference segment mirrors can be cascoded to increase their output impedance.

The TiADC in FIG. 3C is also comprising of cascade of successive SCCs, were seven of them are cascaded including $SCC_{1_{3C}}$, $SCC_{2_{3C}}$, $SCC_{3_{3C}}$, $SCC_{4_{3C}}$, $SCC_{5_{3C}}$, $SCC_{6_{3C}}$, $SCC_{7_{3C}}$ (to the seventh SCC). Alternative SCC embodiments, which can be utilized in TiADC similar in principal to that of FIG. 3A are illustrated in FIG. 1A', 1B', 1C', 1D', 1E', or 1F'.

The description of TiADC, based on applying the SCM successively by utilizing cascade of SCCs, is as follows: when comparing TiADC's $I_I$ and (the segmented reference signal) $I_R/m$, if $I_{A_I} < I_R/m$, then $I_{A_P}=0$, $T_O=1$; and if $I_{A_I} > I_R/m$, then $I_{A_P}=I_{A_I}-I_R/m$, $T_O=0$.

The TiADC's segmented reference network in FIG. 3C is comprising of seven FETs $P_{1_{3C}}$, $P_{2_{3C}}$, $P_{3_{3C}}$, $P_{4_{3C}}$, $P_{5_{3C}}$, $P_{6_{3C}}$, $P_{7_{3C}}$, running at current segment values $I_{R_1}/8$, $I_{R_2}/8$, $I_{R_3}/8$, $I_{R_4}/8$, $I_{R_5}/8$, $I_{R_6}/8$, $I_{R_7}/8$, respectively. Here, the $I_{R_1}/8$ to $I_{R_7}/8$ values are all equal to $I_R/8$.

Note however that, for example in the case of non-linear converters having a non-linear transfer functions, different $I_{R_1}/8$ to $I_{R_7}/8$ values may be programmed.

Let's now run through the case where TiADC's input current signal $I_{IN}=3.5I_R/8$.

Here, the first $SCC_{1_{3C}}$ compares the input signal $I_{IN}$ and its reference signal ($I_{R_1}/8$ segment supplied via $P_{1_{3C}}$). Since $I_{IN}=3.5I_R/8>I_R/8$, then $I_{A_P}\cong I_{IN}-I_{R_1}/8\cong 3.5I_R/8-(I_{R_1}/8)\cong 2.5I_R/8$ and $T_O=T_{O1}=0$. Accordingly, $2.5I_R/8$ flows in the first $SCC_{1_{3C}}$'s $A_P$ terminal, which becomes the current input signal applied to the second $SCC_{2_{3C}}$.

Then, $I_{A_P}$ of $SCC_{2_{3C}}$ is $I_{IN}-I_{R_1}/8\cong 2.5I_R/8$ which is also greater than its reference signal ($I_{R_2}/8$ segment supplied via $P_{2_{3C}}$). Thus, for the second $SCC_{2_{3C}}$, $I_{A_P}\cong I_{IN}-(I_{R_1}/8+I_{R_2}/8)\cong 3.5I_R/8-2I_R/8\cong 1.5I_R/8$ and $T_O=T_{O2}=0$. Accordingly, $1.5 I_R$ flows in the $SCC_{2_{3C}}$'s $A_P$ terminal, which becomes the current input signal applied to the third $SCC_{3_{3C}}$.

Next, $I_{A_P}$ of $SCC_{2_{3C}}$ is $I_{IN}-I_{R_1}/8-I_{R_2}/8\cong 1.5I_R/8$ which is also greater than its reference signal ($I_{R_3}/8$ segment supplied via $P_{3_{3C}}$). Thus, for $SCC_{3_{3C}}$, $I_{A_P}\cong I_{IN}-(I_{R_1}/8+I_{R_2}/8\ I_{R_3}/8)\cong 3.5I_R/8-3I_R/8\cong 0.5I_R/8$, and $T_O=T_{O3}=0$. Accordingly, $0.5\ I_R$ flows in the $SCC_{3_{3C}}$'s $A_P$ terminal, which becomes the current input signal applied to the fourth $SCC_{4_{3C}}$.

Here, a transition occurs through $SCC_{4_{3C}}$, given that $I_I<I_R/8$, then $I_{A_P}=0$, $T_O=T_{O4}=1$. Here $I_{A_P}$ of $SCC_{3_{3C}}$, is $I_{A_P}\cong I_{IN}-(I_{R_1}/8\ I_{R_2}/8\ I_{R_3}/8)\cong 3.5I_R/8-3I_R/8\cong 0.5I_R/8$ which is less than its reference signal ($I_{R_4}/8$ segment supplied via $P_{4_{3C}}$). Thus, for $SCC_{4_{3C}}$, $I_{A_P}\cong 0$ and $T_O=T_{O4}=1$. Accordingly, no current flows in the $SCC_{4_{3C}}$'s $A_P$ terminal, which becomes the current input signal (zero) applied to the fifth $SCC_{5_{3C}}$.

Next, $I_{A_P}\cong 0$ of $SCC_{4_{3C}}$ (becomes current input signal for $SCC_{5_{3C}}$) is less than ($I_{R_5}/8$ segment supplied via $P_{5_{3C}}$) and thus $T_O=T_{O5}=1$.

Then, $I_{A_P}\cong 0$ of $SCC_{5_{3C}}$ (that becomes current input signal for the sixth $SCC_{6_{3C}}$) is less than ($I_{R_6}/8$ segment supplied via $P_{6_{3C}}$) and thus $T_O=T_{O6}=0$.

Lastly, $I_{A_P}\cong 0$ for $SCC_{6_{3C}}$ (that becomes current input signal for the seventh $SCC_{7_{3C}}$) is less than ($I_{R_7}/8$ current segment supplied via $P_{7_{3C}}$) and thus $T_O=T_{O7}=1$.

In summary, the analog input $I_{IN}=3.5I_R/8$ corresponds to thermometer codes $xT_7=0$, $xT_6=0$, $xT_5=0$, $xT_4=0$, $xT_3=1$, $xT_2=1$, $xT_1=1$ (or $T_7=1$, $T_6=1$, $T_5=1$, $T_4=1$, $T_3=0$, $T_2=0$, $xT_1=0$) that equates to binary format $D_3=0$, $D_2=1$, $D_1=1$, as depicted in FIG. 2A'.

As discussed earlier, applying the SCM successively effectuates the function of (accumulation or) 'summation' to operate on the current reference segments and enable the TiADC's current reference network to function like a thermometer network. This is illustrated in the FIG. 3C example, wherein by applying successive SCM, $I_{IN}$ is compared with cumulative reference current segments, one increment at a time. As such SCM effectuate the function of 'summation' to operate on the TiADC's reference current segment values $I_{R_1}/8$ to $I_{R_7}/8$ in a thermometer fashion, starting with $I_{A_P}\cong I_{IN}-(I_{R_1}/8)$ through $I_{A_P}\cong I_{IN}-(I_{R_1}/8\ I_{R_2}/8\ I_{R_3}/8)$. Accordingly, linearity of the 3-bit TiADC (with $2^D-1$ reference segments of a thermometer network) is improved. By utilizing the SCM, (the impact on TiADC's non-linearity attributed to) the average cumulative statistical contribution of normal and random manufacturing mismatches of $\sigma$ % attributed to the segmented reference current sources is attenuated by about $\sqrt{2^D}=\sqrt{8}$ times. Note that TiADC illustrated in FIG. 3A can be configured to function like TiADC of FIG. 3C where the $A_N$ terminal can be connected to $V_{SS}$ with one of its benefit being that $P_{1_A}$ (biased via $V_{1_A}$) clamps to limit the voltage swing at $A_I/T_O$ terminal when $I_I<I_R/m$, thus enhancing the SCC's speed.

Figure 3D:
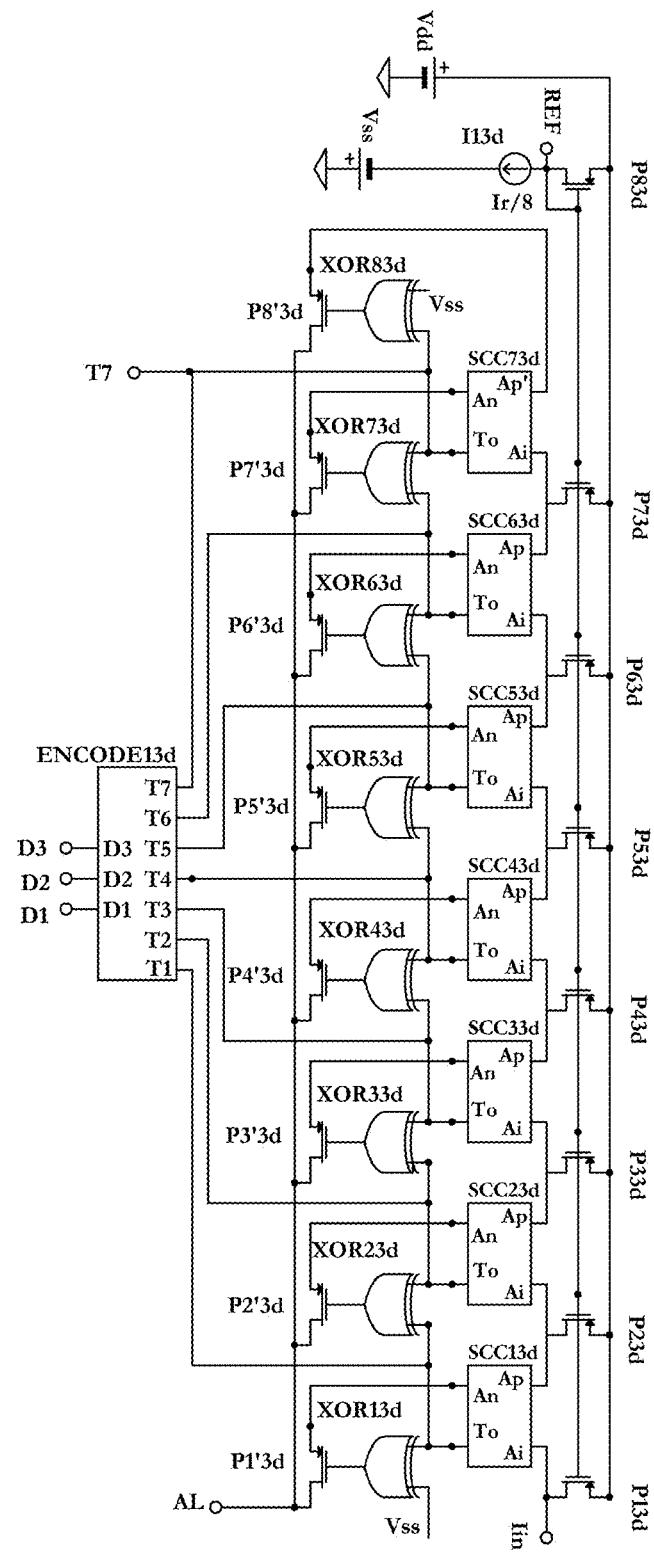
FIG. 3D is a circuit block diagram of another embodiment illustrating a TiADC.

Description of FIG. 3D

FIG. 3D is a circuit block diagram of another embodiment illustrating a TiADC utilizing the disclosed SCM of FIG. 6B.

Again, for sake of descriptive clarity and brevity and not for limitation, the TiADC with 3-bits of resolution is described here. Applying the disclosed SCM here, it would be obvious for one skilled in the art that the TiADC can be made with different resolutions.

Similar to the TiADC described in FIG. 3C, the TiADC disclosed in FIG. 3D has one analog input port $I_{IN}$ one analog reference input port REF, and 3-bit digital binary outputs $D_3$, $D_2$, $D_1$, where $D_3$ is the MSB and $D_1$ is the LSB, plus one optional digital output $T_{O7}$ (which provides the seventh thermometer code). Also, the ADC of FIG. 3D only has one analog output $A_L$, which will be explained shortly.

As described earlier, note that TiADC's internal (digital outputs of successive SCCs are the) thermometer codes ($T_1$ through $T_7$) are mapped into a binary format output code ($D_1$ through $D_3$) utilizing a logic encoder (ENCODE).

Applying the SCM successively (illustrated in FIG. 6B, the ADC of FIG. 3D) is comprising of cascade of seven SCCs which are $SCC_{1_{3D}}$, $SCC_{2_{3D}}$, $SCC_{3_{3D}}$, $SCC_{4_{3D}}$, $SCC_{5_{3D}}$, $SCC_{6_{3D}}$, $SCC_{7_{3D}}$. The SCC can for example utilize similar embodiments illustrated in FIG. 1A, 1B, 1C, 1D, 1E, or 1F.

A current with value $I_R/8$ is fed onto the REF port that is coupled with a diode connected $P_{8_{3D}}$. The REF current is mirrored onto seven segments utilizing FETs $P_{1_{3D}}$, $P_{2_{3D}}$, $P_{3_{3D}}$, $P_{4_{3D}}$, $P_{5_{3D}}$, $P_{6_{3D}}$, $P_{7_{3D}}$ (that can be cascoded for increased output impedance) operating at current segment values $I_{R_1}/8$, $I_{R_2}/8$, $I_{R_3}/8$, $I_{R_4}/8$, $I_{R_5}/8$, $I_{R_6}/8$, $I_{R_7}/8$, respectively. Here, the $I_{R_1}/8$ to $I_{R_7}/8$ values are all set to be equal to $I_R/8$. As a reminder, note here that $m-1=2^D-1=T-1=2^3-1=7$.

However, for example, in the case of non-linear converters having a non-linear transfer functions, different $I_{R_1}/8$ to $I_{R_7}/8$ values may be programmed.

Note also that the SCM enables multi-staging a TiADC by feeding $A_L$ signal to a subsequent iADC to expand the overall resolution at low cost and low currents.

The TiADC of FIG. 3D generates $I_{A_L}$ in a fashion different from that of pairing up TiADC of FIG. 3A with likes of RALSP circuits that was illustrated in FIG. 1H, 1I, 1J, 1Q.

In the embodiment illustrated in FIG. 3D (instead of utilizing a RALSP circuit), the $A_L$ is generated from one $I_{A_N}$ of a digitally selected SCC where $T_0$ transition (along the SCC's cascade chain) occurs.

Figure 5A:
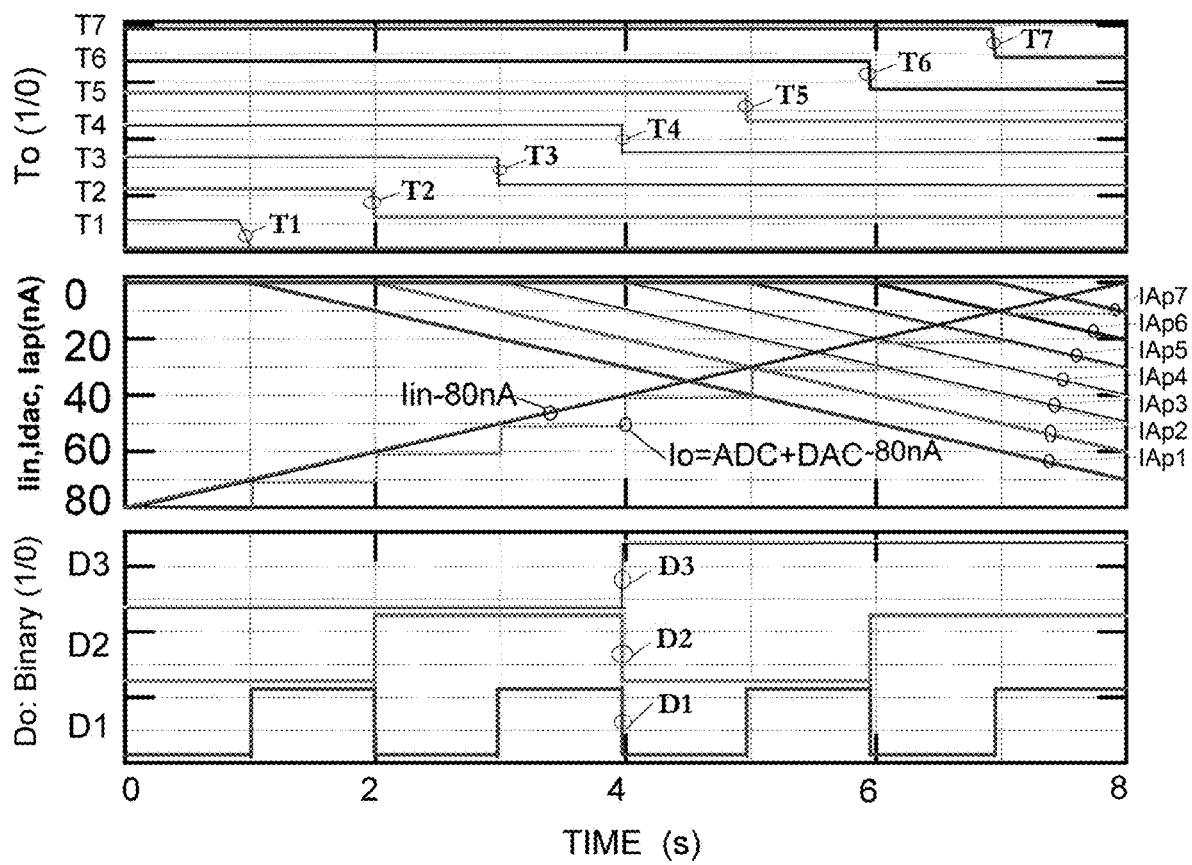
FIG. 5A is a circuit simulation showing waveforms of the TiADC illustrated in FIG. 3A
Figure 5B:
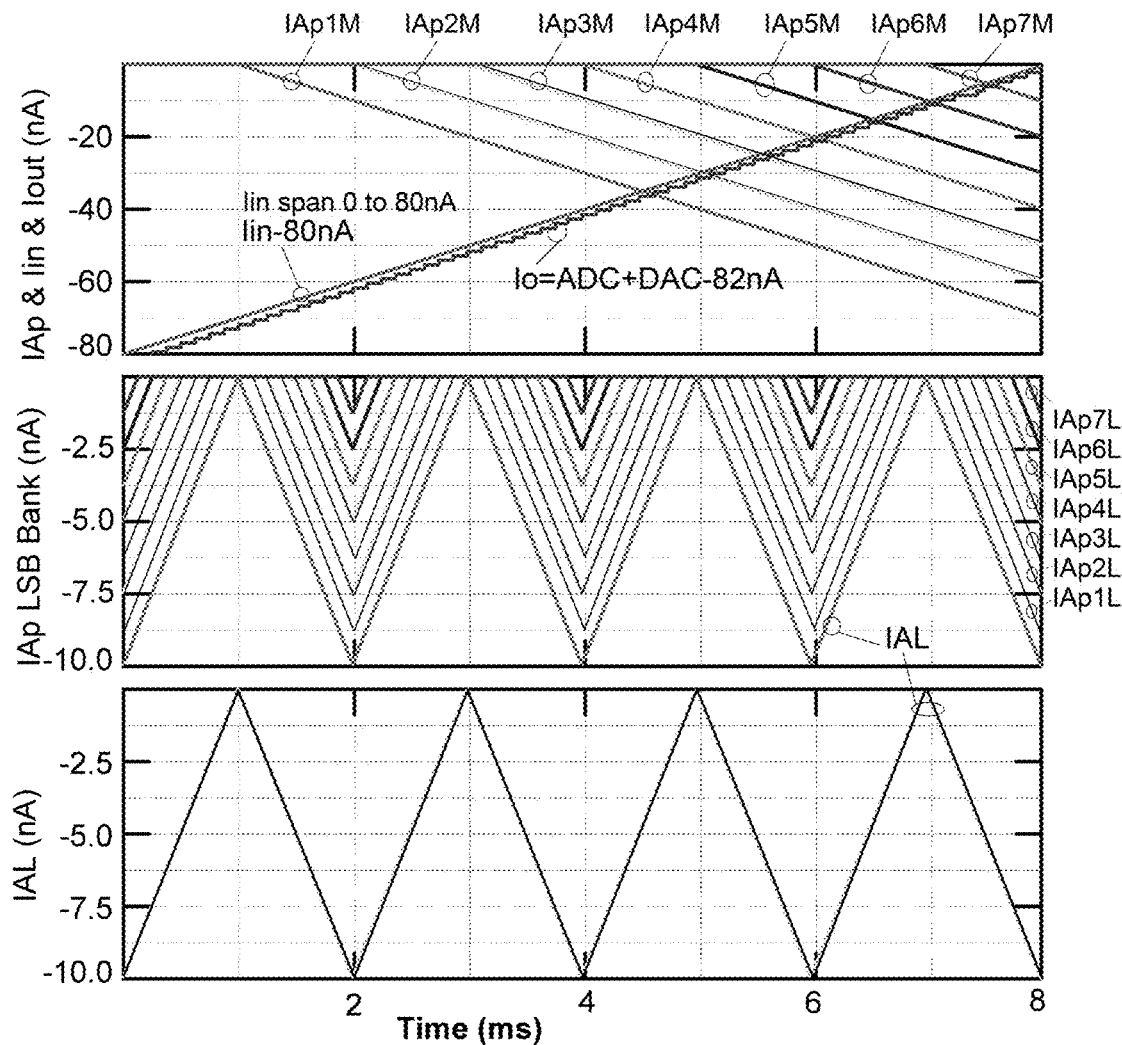
FIG. 5B is a circuit simulation showing waveforms of the iADC illustrated in FIG. 4A wherein $ADC1_{4A}$ and $ADC1_{4B}$ are of the kind illustrated in FIG. 3A.
Figure 5C:
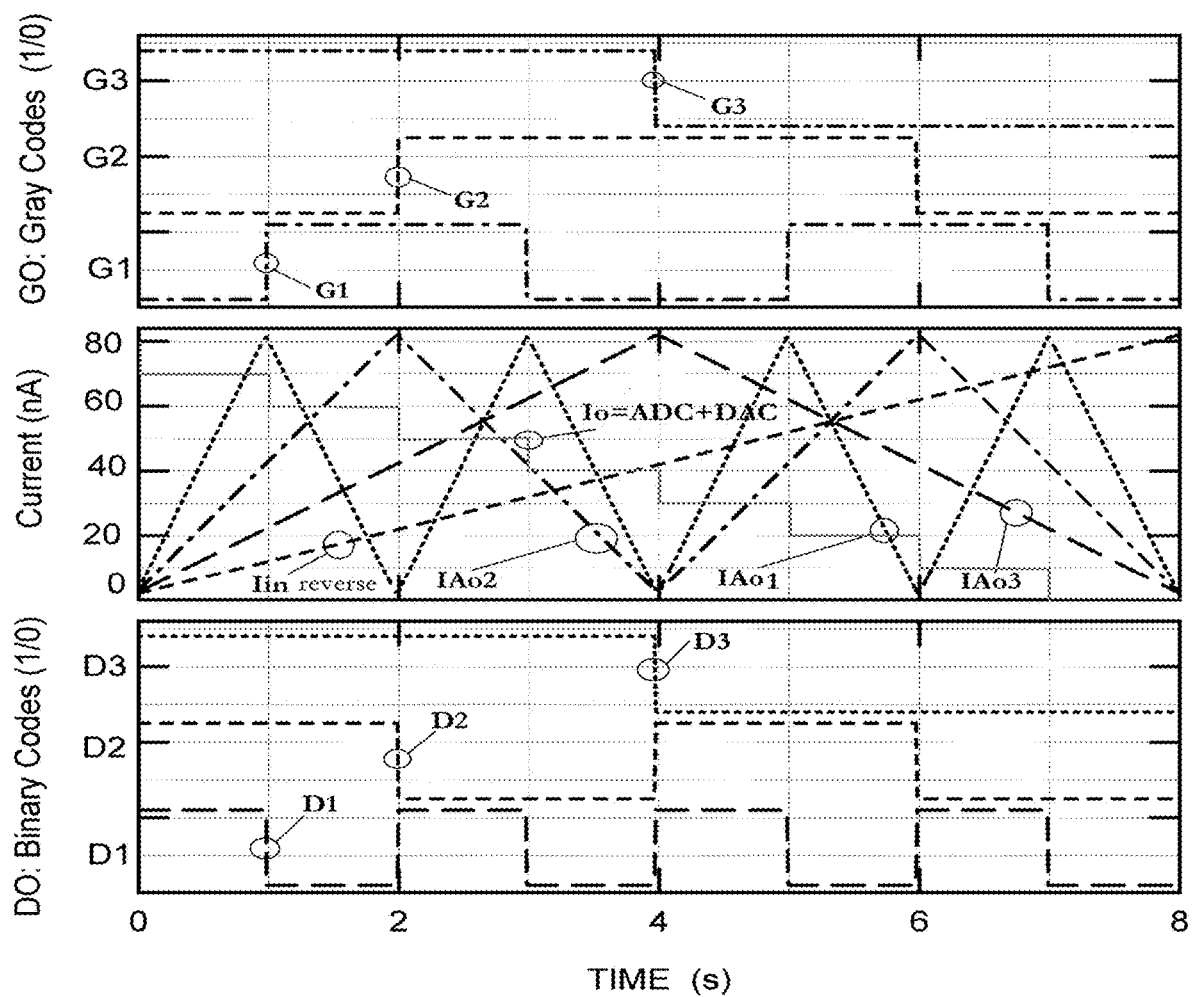
FIG. 5C is a circuit simulation showing waveforms of the AiADC illustrated in FIG. 3E

As a reminder, SCC is a transistor level embodiment of SCB. To select a SCC (or SCB) in transition $SCC_t$ (or $SCB_t$), the digital output signal $T_O$ of all SCCs (or SCBs) preceding the $SCC_t$ (or $SCB_t$) exhibits a polarity opposite to the polarity of the digital output signal $T_O$ of all SCCs (or SCBs) including and succeeding the $SCC_t$ (or $SCB_t$). Note that there are alternative (digital selection) embodiments that would be obvious to those skilled in the art. FIG. 5F depicts a simulated example of FIG. 3D's $I_{A_L}$ plot as a function of $I_{IN}$, appearing as a series of right triangular waveform (but for the last equilateral triangular waveform, which will be explained later) with the peak-trough value of zero to $I_R/8$, as TiADC's $I_{IN}$ spans from zero to full scale.

As an example, with $I_{IN}=2.5I_R/8$ condition for FIG. 3A, the thermometer output bit of FIG. 3D are $T_7=0$, $T_6=0$, $T_5=0$, $T_4=0$, $T_3=0$, $T_2=1$, $T_1=1$.

In such example, the output of the Exclusive OR gate $XOR_{3_{3D}}$ goes low, which turns $P_{3'_{3D}}$ on, which in turn steers $I_{A_N}$ of $SCC_{3_{3D}}$ through to the $A_L$ port.

As described in FIG. 3A, when $I_{IN}=2.5I_R/8$ condition, for $SCC_{3_{3D}}$ the $I_{A_N} \cong I_{R3}/8 - [(I_{IN}-(I_{R_1}/8\ I_{R_2}/8)] \cong (I_{R_1}/8\ I_{R_2}/8\ I_{R_3}/8) - I_{IN} \cong 0.5I_R/8 \cong I_{A_L}$. Selected set of FETs ($P_{2'_{3D}}$ and $P_{4'_{3D}}$ through $P_{8'_{3D}}$) are off and block $I_{A_N}$ of other SCCs (non-transitioning ones) from feeding their respective $I_{A_N}$ currents onto the $A_L$ port. Note that when, for example, $I_{IN}=2.5I_R/8$, then there is no transition in the respective SCC's $T_O$ s that is applied to the inputs of $XOR_{2_{3D}}$ to $XOR_{8_{3D}}$. The first $XOR_{1_{3D}}$ output is zero, which leaves $P_{1'_{3D}}$ on but for $SCC_{1_{3D}}$ the $I_{A_N} \cong 0$ which leaves flow of $I_{A_N}$ from $SCC_{3_{3D}}$ that is $0.5I_R/8 \cong I_{A_L}$ intact.

Note also that for proper sign/direction of current signals, the $I_{A_{P'}}$ of $SCC_{7_{3D}}$ is inverted via a current mirror (with proper reference current shifting) that is not shown.

Also, there are alternative embodiments knowable to those skilled in the art for (cost effectively) increasing the resolution of an ADC by multi-staging iADCs (based on the SCM).

Moreover, it would be obvious for those skilled in the art that for proper sign/direction of current signals, the $I_{A_L}$ would feed onto an iADC (for example) with a complementary SCC embodiment (e.g., to that of FIG. 3A, 3B, 3C, 3D utilizing NMOS reference currents segments biased from $V_{SS}$ and SCCs with NMOS input amplifier).

Figure 4A:
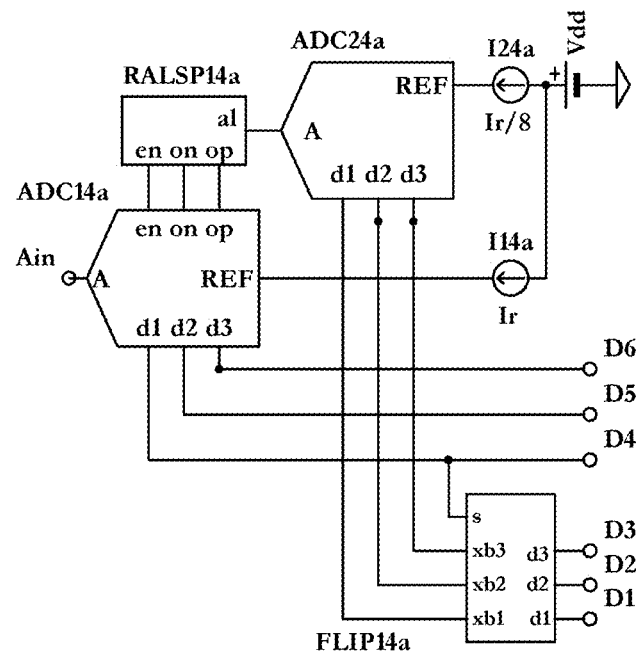
FIG. 4A is a functional block diagram of an embodiment illustrating a multi-stage iADC that combines a TiADC illustrated in FIG. 3A with a TiADC illustrated in FIG. 3C.
Figure 4B:
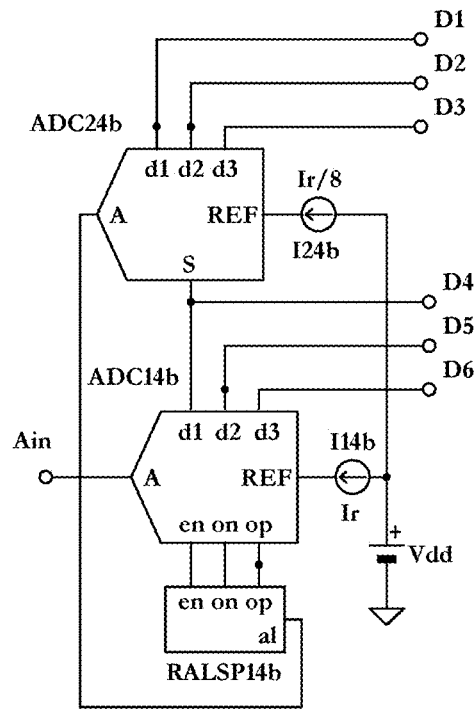
FIG. 4B is a functional block diagram of another embodiment illustrating a multi-stage iADC that combines a TiADC illustrated in FIG. 3A with an AiADC illustrated in FIG. 3E.
Figure 4C:
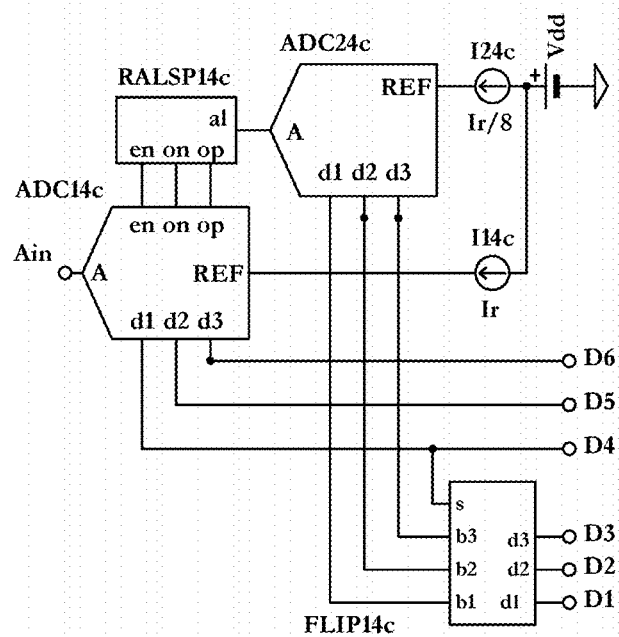
FIG. 4C is a functional block diagram of another embodiment illustrating a multi-stage iADC that combines a TiADC illustrated in FIG. 3A with another second FiADC illustrated in FIG. 3H.
Figure 4D:
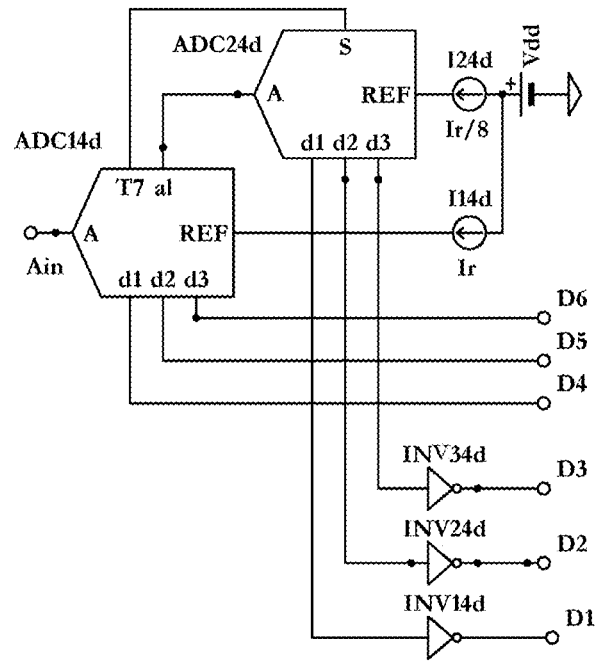
FIG. 4D is a functional block diagram of another embodiment illustrating another multi-stage iADC that combines a TiADC illustrated in FIG. 3D with an AiADC illustrated in FIG. 3E.

As illustrated in FIG. 4D for example, note that $T_7$ selects when to steer the mirrored $I_{A_{P'}}$ of $SCC_{7_{3D}}$ onto $I_{A_L}$.

In the example of $I_{IN}=2.5I_R/8$ for FIG. 3A (coupled with the RALSP circuit), $I_{A_L}$ is generated by subtracting the sum ($I'A_L$) of all odd from sum of all even numbered $I_{A_N}$S of SCCs, and then subtracting the $I_{A_O}$ of the last SCC from the subtraction of that sum ($I''_{A_L}$). That is $I_{A_L}=I_{O_N}-I_{E_N}-I_{O_P}\cong(I_R/8+I_{R_5}/8+0.5I_{R_3}/8+0I_{R_1}/8)-(I_{R_6}/8+I_{R_4}/8+0I_{R_2}/8)-0 \cong 0.5I_R/8$.

Note that in the example of $I_{IN}=2.5I_R/8$ for FIG. 3D, the $I_{A_L}$ is effectively generated from output of a selected single SCC that is in transition (or $SCC_t$). In this example, $SCC_t$ is $SCC_{3_{3D}}$ with $I_{A_N} \cong I_{R_3}/8 - [I_{IN}-(I_{R_1}/8+I_{R_2}/8)] \cong (I_{R_1}/8+I_{R_2}/8+I_{R_3}/8)-I_{IN} \cong 0.5I_R/8 \cong I_{A_L}$.

As mentioned earlier, for non-linear iADCs, one of the benefits of TiADC of FIG. 3D's manner of generating the $I_{A_L}$ signal, is that each current reference segment value can be programmed accordingly to an objective non-linear transfer function such as logarithmic or square. The $I_{A_L}$ of a non-linear thermometer current network, can then be fed onto a second stage linear iADC which can in effect linearly extrapolate from one non-linear segment to another non-linear segment (established by the first stage non-linear MSB iADC). In other words, an iADC with an approximate non-linear transfer function can be implemented by utilizing, for example, a 6-bit iADC comprising of a non-linear 3-MSB TiADC combined with a linear 3-LSB iADC that extrapolate between the non-linear 3-MSB TiADC.

Utilizing the TiADC illustrated in FIG. 3D to generate $I_{A_L}$, provides additional benefits for extending the resolution by multi-staging an iADC. The $I_{A_L}$, in TiADC of FIG. 3D, is generated by extracting residual segmented currents from $I_{A_N}$ of one SCC (as opposed to extracting $I_{A_L}$ from the difference between the sum of several odd and several even segment currents of SCC's $I_{A_N}$s). As such, a high-resolution first stage TiADC can still generate a quality $I_{A_L}$ that would not deter the linearity of the overall multi-stage iADC. The $I_{A_L}$ transitions would encompass zero-scale to full-scale that could take longer time to settle, which does not enhance the ADC's overall dynamic performance. As such, the embodiment described here provides a choice between attaining higher precision ADC and normal dynamic performance.

Other alternative TiADC embodiments to generate $I_{A_L}$ would be to combine the best of what both TiADCs of FIG. 3A and FIG. 3D have to offer, which will be described later in FIG. 3I and FIG. 3J.

Figure 3E:
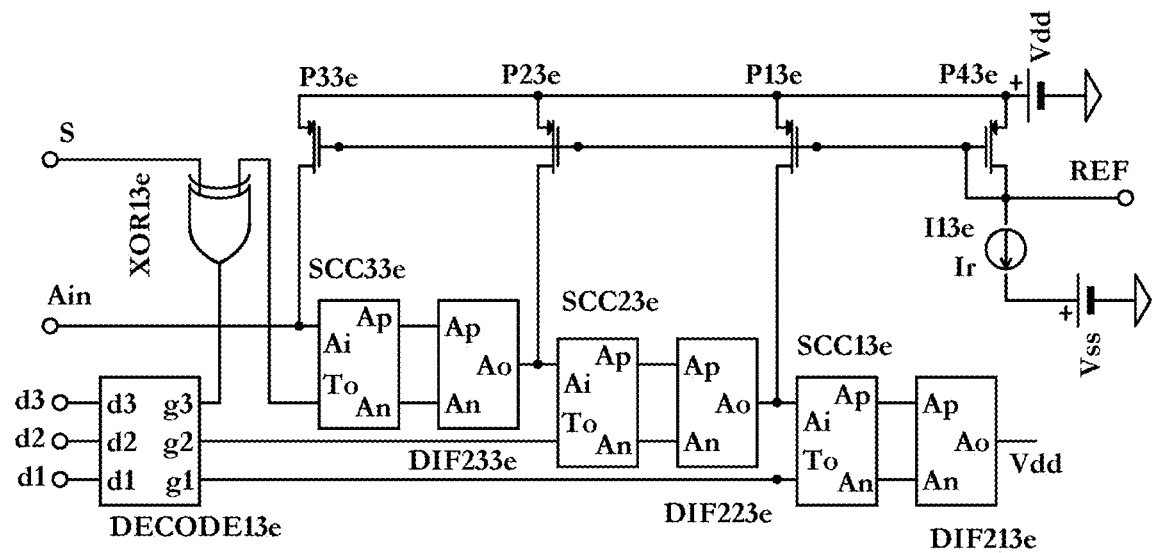
FIG. 3E is a circuit block diagram of an embodiment illustrating an AiADC.

Description of FIG. 3E

FIG. 3E is a circuit block diagram of an embodiment illustrating an algorithmic current mode analog to digital converter (AiADC). The AiADC disclosed in FIG. 3E has one analog input port $A_{IN}$ that receives the input current signal $I_{A_{IN}}$ one analog reference input port REF, and 3-bit digital binary outputs $D_3$, $D_2$, $D_1$, where $D_3$ is the MSB and $D_1$ is the LSB plus an optional S digital input that is useful for multi-staging the AiADC of FIG. 3E.

It would be obvious those skilled in the art that AiADC of FIG. 3E can be arranged with different resolutions than 3-bits.

Note that the full scale $I_{A_{IN}}$ spans from zero to $I_R$ here, where a reference current with value $0.5I_R$ is fed onto the REF port that is coupled with a diode connected $P_{4_{3E}}$. The REF current is mirrored equally onto $P_{1_{3E}}$, $P_{2_{3E}}$, $P_{3_{3E}}$ (that can be cascoded for increased output impedance).

There are three pairs of SCC & DIF2 circuits, including first $SCC_{1_{3E}}$ & $DIF2_{1_{3E}}$, second $SCC_{2_{3E}}$ & $DIF2_{2_{3E}}$, and third $SCC_{3_{3E}}$ & $DIF2_{3_{3E}}$.

The DIF2 circuit similar to the one disclosed in FIG. 1K may be coupled with SCCs similar to the ones illustrated in FIG. 1A, FIG. 1B, FIG. 1C, FIG. 1D, FIG. 1E, or FIG. 1F.

The paired-up SCC & DIF2 circuits perform the function of a DABS2 circuit that that generates that absolute value of the difference between two current signals and multiplies the output current results by gain of 2.

The $T_O$ ports of $SCC_{1_{3E}}$, $SCC_{2_{3E}}$, $SCC_{3_{3E}}$ generate the gray code representing $I_{A_{IN}}$, which are decoded by $DECODE_{1_{3E}}$ (depicted in an example by FIG. 2B) to convert the gray-codes initially generated by AiADC to the binary-code format representing $I_{A_I}$.

For an AiADC exemplified in FIG. 3E, for each SCC & DIF2 circuit pairs, if $I_{A_I}=I_{A_{IN}}-0.5I_R<0$, then $I_{A_O}=2|0.5I_R-I_{A_{IN}}|$, $T_O=1$; and if $I_{A_I}=I_{A_{IN}}-0.5I_R>0$, then $I_{A_O}=2|I_{A_{IN}}-0.5I_R|$, $T_O=0$.

In describing the operations of the AiADC of FIG. 3E, let $I_{A_{IN}}=3.5I_R/8$ and let $S=0$.

As stated earlier, $I_{A_{IN}}$'s full scale ranges from zero to $I_R$.

For $SCC_{3_{3E}}$, the $I_{A_I} \cong 3.5I_R/8-I_R/2 \cong -0.5I_R/8<0$, $T_{O3}=G_3=1$. Thus, for $SCC_{3_{3E}}$, the $I_{A_N} \cong 0.5I_R/8$, $I_{A_P} \cong 0$ where $DIF2_{3_{3E}}$ yields $I_{A_O} \cong 2 \times 0.5I_R/8 \cong I_R/8$. Then, $I_{A_O} \cong I_R/8$ of $DIF2_{3_{3E}}$ is fed onto the next DABS2 (paired-up $SCC_{2_{3E}}$ & $DIF2_{2_{3E}}$) circuits.

For $SCC_{2_{3E}}$, the $I_{A_I} \cong I_R/8-I_R/2 \cong -3I_R/8<0$, $T_{O2}=G_2=1$. Thus, for $SCC_{2_{3E}}$, the $I_{A_N} \cong 3I_R/8$, $I_{A_P} \cong 0$ where $DIF2_{2_{3E}}$ yields $I_{A_O} \cong 2 \times 3I_R/8 \cong 6I_R/8$. Then $I_{A_O} \cong 6I_R/8$ of $DIF2_{2_{3E}}$ is fed onto the next DABS2 (paired-up $SCC_{1_{3E}}$ & $DIF2_{1_{3E}}$) circuits.

For $SCC_{1_{3E}}$, the $I_{A_I} \cong 6I_R/8-I_R/2 \cong 2I_R/8>0$, $T_{O1}=G_1=0$. Thus, for $SCC_{1_{3E}}$, the $I_{A_P} \cong 2I_R/8$, $I_{A_N} \cong 0$ where $DIF2_{1_{3E}}$ yields $I_{A_O} \cong 2 \times 2I_R/8 \cong 4I_R/8$.

In summary, the analog input $I_{A_{IN}}=3.5I_R/8$ corresponds to gray codes $G_3=1$, $G_2=1$, $G_1=0$, that equates to binary format $D_3=0$, $D_2=1$, $D_1=0$, as depicted in table of FIG. 23. FIG. 5C illustrates plots for AiADC pertaining to FIG. 3E's, which will be described later.

Figure 3F:
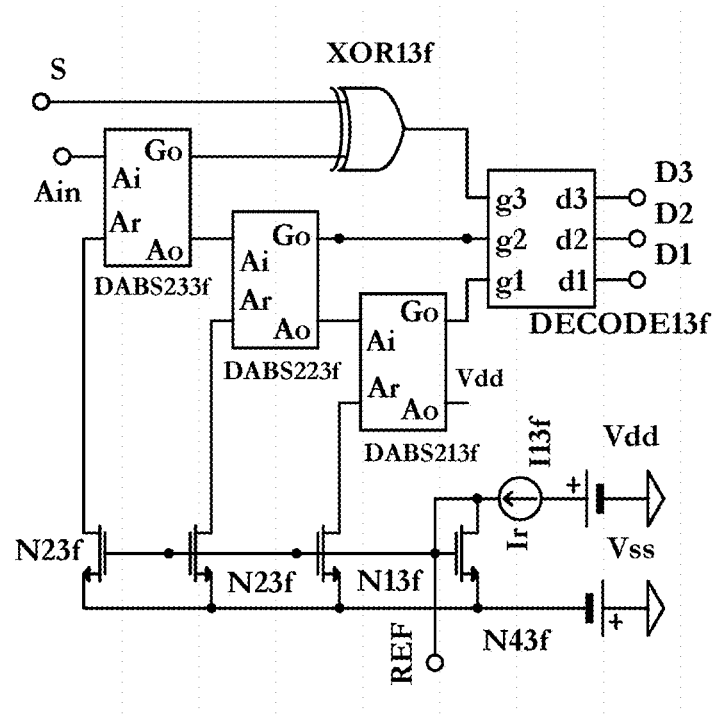
FIG. 3F is a circuit block diagram of another embodiment illustrating an AiADC.

Description of FIG. 3F

FIG. 3F is a circuit block diagram of another embodiment illustrating a AiADC. The AiADC disclosed in FIG. 3F has one analog input port $A_{IN}$ that receives the input current signal $I_{A_{IN}}$, one analog reference input port REF, and 3-bit digital binary outputs $D_3$, $D_2$, $D_1$, where $D_3$ is the MSB and $D_1$ is the LSB, plus an optional S digital input that helps with multi-staging the AiADC of FIG. 3F.

It would be obvious those skilled in the art that AiADC of FIG. 3F can be arranged with different resolutions than 3-bits.

The AiADC of FIG. 3F is similar but a complementary versions of FIG. 3E (e.g., with NMOS reference current network) that has a reference current with value $0.5I_R$ which is fed onto the REF port (coupled with a diode connected $N_{4_{3F}}$). The REF current is mirrored equally with value $0.5I_R$ onto $N_{1_{3F}}$, $N_{2_{3F}}$, $N_{3_{3F}}$ (that can be cascoded for increased output impedance).

The first $DABS2_{1_{3F}}$, second $DABS2_{2_{3F}}$, and third $DABS2_{3_{3F}}$ generates that absolute value of the difference between two input current signals and multiplies the output current result by gain of 2.

The $T_O$ ports of $DABS2_{1_{3F}}$, $DABS2_{2_{3F}}$, $DABS2_{3_{3F}}$ generate the gray code representing $I_{A_{IN}}$, which is decoded by $DECODE_{1_{3F}}$ (depicted in an example by FIG. 2B) to provide the binary-code format representing $I_{A_{IN}}$.

For iADC of FIG. 3F, the DABS2 circuits can utilize embodiments similar to those depicted in FIG. 1L, or FIG. 1M.

For an AiADC exemplified in FIG. 3F, for DABS2 circuits, when $I_{A_I} = I_{A_{IN}} - 0.5I_8 < 0$, then $I_{A_O} = 2|0.5I_R - I_{A_{IN}}|$, $T_O = 1$; and if $I_{A_I} = I_{A_{IN}} - 0.5I_R > 0$, then $I_{A_O} = 2|I_{A_{IN}} - 0.5I_R|$, $T_O = 0$.

Let's consider $I_{A_{IN}} = 3.5I_R/8$ and let $S = 0$.

Also, $I_{A_{IN}}$'s full scale ranges from zero to $I_R$.

For the third $DABS2_{3_{3F}}$, the $I_{A_I} \cong 3.5I_R/8 - I_R/2 \cong -0.5I_R/8 < 0$, and $T_{O3} = G_3 = 1$, and $I_{A_O} \cong 2 \times 0.5I_R/8 \cong I_R/8$ that is fed onto $DABS2_{2_{3F}}$.

For the second DABS2 circuit $DABS2_{2_{3F}}$, the $I_{A_I} \cong I_R/8 - I_R/2 \cong -3I_R/8 < 0$, and $T_{O2} = G_2 = 1$, and $I_{A_O} \cong 2 \times 3I_R/8 \cong 6I_R/8$ that is fed onto $DABS2_{1_{3F}}$.

For the first $DABS2_{1_{3F}}$, the $I_{A_I} \cong 6I_R/8 - I_R/2 \cong 2I_R/8 > 0$, and $T_{O1} = G_1 = 0$, and $I_{A_O} \cong 2 \times 2I_R/8 \cong 4I_R/8$.

In summary, the analog input $I_{IN} = 3.5I_R/8$ corresponds to gray codes $G_3 = 1$, $G_2 = 1$, $G_1 = 0$, that equates to binary format $D_3 = 0$, $D_2 = 1$, $D_1 = 0$, as depicted in table of FIG. 23.

Figure 3G:
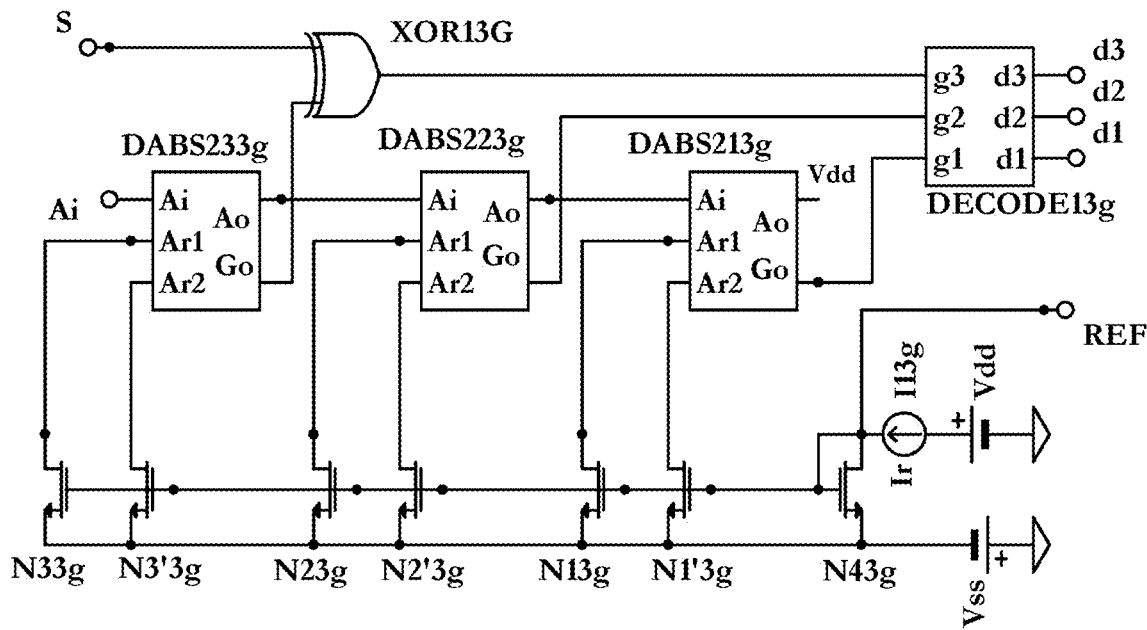
FIG. 3G is a circuit block diagram of another embodiment illustrating an AiADC.

Description of FIG. 3G

FIG. 3G is a circuit block diagram of another embodiment illustrating an AiADC. The AiADC disclosed in FIG. 3G has one analog input port $A_{IN}$ that receives the input current signal $I_{A_{IN}}$, one analog reference input port REF, and 3-bit digital binary outputs $D_3$, $D_2$, $D_1$, where $D_3$ is the MSB and $D_1$ is the LSB, plus an optional S digital input that helps with multi-staging the AiADC of FIG. 3G.

It would be obvious those skilled in the art that AiADC of FIG. 3G can be arranged with different resolutions than 3-bits.

The AiADC of FIG. 3G has a reference current with value $0.5I_R$, which is fed onto the REF port that is coupled with a diode connected $N_{4_{3G}}$.

The DABS2 circuits can utilize embodiments similar to the one depicted in FIG. 1N. As expressed earlier, the DABS2 circuit of FIG. 1N illustrates a mean to keep its current steering FETs from entering deep off state, in order to improve its dynamic response around zero-crossing, by using two reference inputs per DABS2 circuit. As such, the REF current is mirrored equally onto pairs of $N_{1_{3G}}-N_{1'_{3G}}$, $N_{2_{3G}}-N_{2'_{3G}}$, $N_{3_{3G}}-N_{3'_{3G}}$ (each of which can be cascoded for increased output impedance). The $DABS2_{1_{3G}}$ to $DABS2_{3_{3G}}$ generates the absolute value of the difference between two current signals and multiplies the output current result by gain of 2.

The $T_O$ ports of $DABS2_{1_{3G}}$ to $DABS2_{3_{3G}}$ generate the gray code representing $I_{A_{IN}}$, which is decoded by $DECODE_{1_{3F}}$ (depicted in an example by FIG. 2B) to provide the binary-code format representing $I_{A_I}$.

For an AiADC exemplified in FIG. 3G, for the DABS2 circuits, if $I_{A_I} = I_{A_{IN}} - 0.5I_R < 0$, then $I_{A_O} = 2|0.5I_R - I_{A_{IN}}|$, $T_O = 1$; and if $I_{A_I} = I_{A_{IN}} - 0.5I_R > 0$, then $I_{A_O} = 2|I_{A_{IN}} - 0.5I_R|$, $T_O = 0$.

Let's $I_{A_{IN}} = 3.5I_R/8$ and let $S = 0$.

Also, note that $I_{A_{IN}}$'s full scale ranges from zero to $I_R$.

For the third DABS2 circuits $X_{3_{3G}}$, the $I_{A_I} \cong 3.5I_R/8 - I_R/2 \cong -0.5I_R/8 < 0$, and $T_{O3} = G_3 = 1$, and $I_{A_O} \cong 2 \times 0.5I_R/8 \cong I_R/8$ that is fed onto $X_{2_{3G}}$.

For the second DABS2 circuit $X_{2_{3G}}$, the $I_{A_I} \cong I_R/8 - I_R/2 \cong -3I_R/8 < 0$, and $T_{O2} = G_2 = 1$, and $I_{A_O} \cong 2 \times 3I_R/8 \cong 6I_R/8$ that is fed onto $X_{1_{3G}}$.

For the first $X_{1_{3G}}$, the $I_{A_I} \cong 6I_R/8 - I_R/2 \cong 2I_R/8 > 0$, and $T_{O1} = G_1 = 0$, and $I_{A_O} \cong 2 \times 2I_R/8 \cong 4I_R/8$.

In summary, the analog input $I_{A_{IN}} = 3.5I_R/8$ corresponds to gray codes $G_3 = 1$, $G_2 = 1$, $G_1 = 0$, that equates to binary format $D_3 = 0$, $D_2 = 1$, $D_1 = 0$, as depicted in table of FIG. 2B'.

Figure 3H:
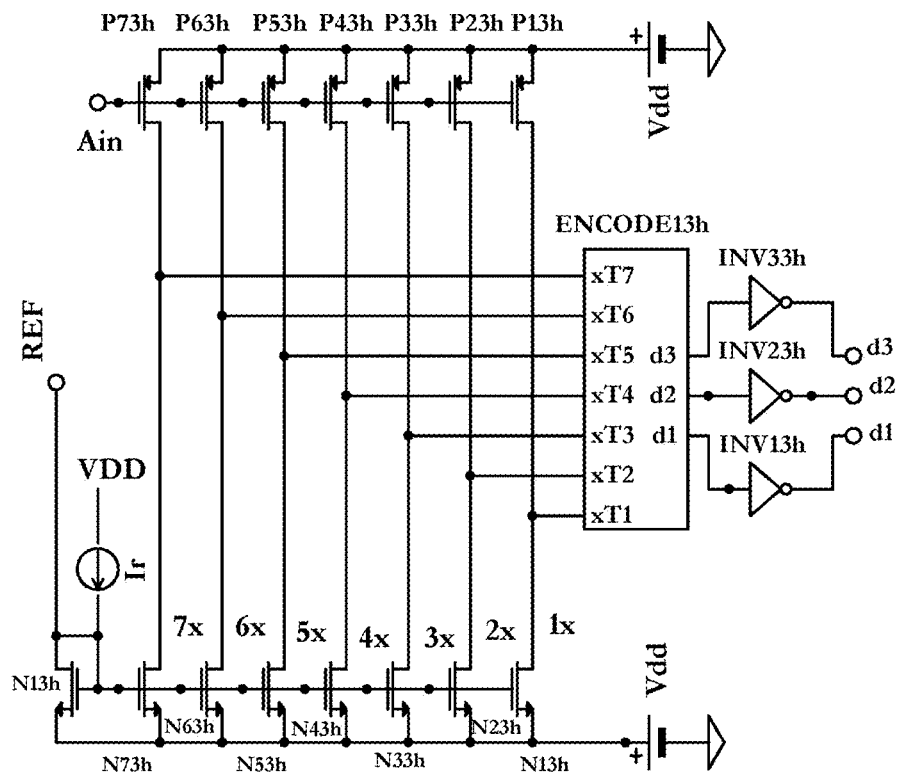
FIG. 3H is a circuit block diagram of an embodiment illustrating a FiADC

Description of FIG. 3H

FIG. 3H is a circuit block diagram depicting a FiADC. For sake of clarity and brevity the iADC with 3-bits of resolution is described here, but the iADC's resolution can be extended to more or less bit. Here, the FiADC, depicted with 3-bits of resolution, has one analog input $A_{IN}$, one reference input REF, and 3 digital outputs $D_3$, $D_2$, $D_1$.

Note that the input current mirrors and the reference current mirrors can be cascaded to increase their output impedance. The iADC's reference network is comprising of FETs $N_{7_H}$ scaled for $7I_R$, $N_{6_H}$ scaled for $6I_R$, $N_{5_H}$ scaled for $5I_R$, $N_{4_H}$ scaled for $4I_R$, $N_{3_H}$ scaled for $3I_R$, $N_{2_H}$ scaled for $2I_R$, and $N_{1_H}$ scaled for $I_R$. Note that the current reference network here is not segmented here and it is not a thermometer current reference network.

The $V_{GS}$ of a diode connected PMOS (operating at $I_{A_{IN}}$ that spans zero to full scale of $8I_R$) can be coupled with analog input $A_{IN}$ port.

The RALSP circuit illustrated in FIG. 1Q can provide the FiADC (illustrated in FIG. 3H) with the current input signal $I_{A_{IN}}$. This FiADC requires the $I_{A_{IN}}$ signal to be mirrored ($2^D - 1$ times or) with 7 FETs via $P_{1_{3H}}$ through $P_{7_{3H}}$ so that $I_{A_{IN}}$ can (in parallel or in a flash mode) be compared with each of the scaled current reference signals.

The resulting $T_7$ and $T_1$ are encoded by $ENCONDE_{1_{3H}}$ to generate the binary representation of $I_{IN}$ analog signal.

Let's run through the case where input current signal $I_{A_{IN}} = 6.5I_R \cong I_{P7_{3H}} \cong I_{P6_{3H}} \cong I_{P5_{3H}} \cong I_{P4_{3H}} \cong I_{P3_{3H}} \cong I_{P2_{3H}} \cong I_{P1_{3H}}$ Thus $\overline{T_{O1}} = 1$ since $I_{P1_{3H}} \cong 6.5I_R > I_{N1_{3H}} \cong I_R$, $\overline{T_{O2}} = 1$ since $I_{P2_{3H}} \cong 6.5I_R > I_{N2_{3H}} \cong 2I_R$, $\overline{T_{O3}} = 1$ since $I_{P3_{3H}} \cong 6.5I_R > I_{N3_{3H}} \cong 3I_R$, $\overline{T_{O4}} = 1$ since $I_{P4_{3H}} \cong 6.5I_R > I_{N4_{3H}} \cong 4I_R$, $\overline{T_{O5}} = 1$ since $I_{P5_{3H}} \cong 6.5I_R > I_{N5_{3H}} \cong 5I_R$, $\overline{T_{O6}} = 1$ since $I_{P6_{3H}} \cong 6.5I_R > I_{N6_{3H}} \cong 6I_R$, $\overline{T_{O7}} = 0$ since $I_{P7_{3H}} \cong 6.5I_R < I_{N7_{3H}} \cong 7I_R$.

In summary, the analog input $I_{A_{IN}}=6.5I_R/8$ corresponds to thermometer codes $xT_7=0$, $xT_6=1$, $xT_5=1$, $xT_4=1$, $xT_3=1$, $xT_2=1$, $xT_1=1$ corresponds to binary format $D_3=1$, $D_2=1$, $D_1=0$, as depicted in table of FIG. 2A'.

The FiADC does not operate on the basis of the summation function, and does not have the benefits of the SCM based TiADC described in this disclosure. The statistical (random) contribution of normal manufacturing mismatches of σ % directly impact the accuracy of FiADC. This is because the mismatch between the input ($I_{A_{IN}}$) current mirror network ($P_{1_{3H}}$ through $P_{7_{3N}}$) directly contribute to the accuracy of the FiADC. Also, the FiADC inaccuracies are compounded by the mismatch between FETs in the scaled reference current mirror network that is not founded on 'summation', and is comprising of independently scaled FETs, which are $N_{7_{3H}}$ through $N_{1_{3N}}$.

Figure 3I:
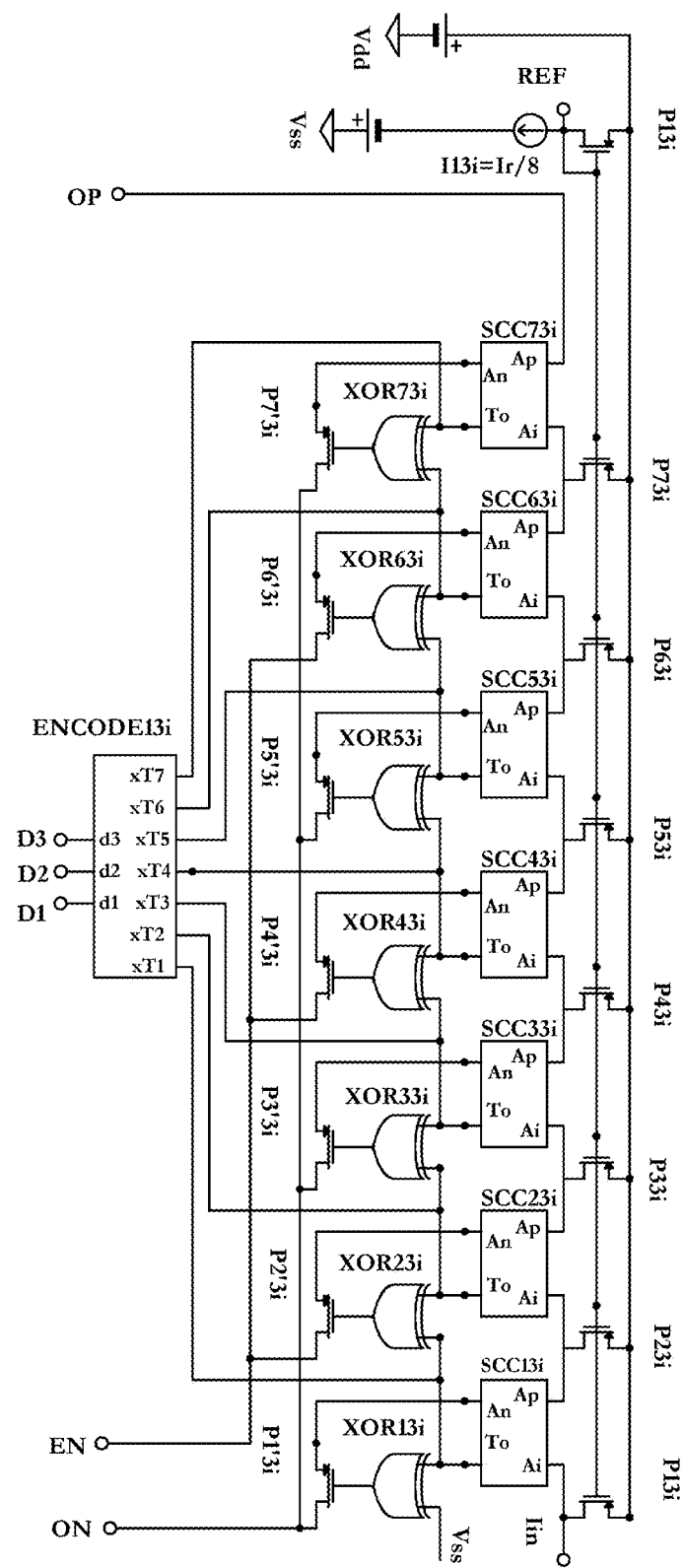
FIG. 3I is a circuit block diagram of another embodiment illustrating a TiADC.

Description of FIG. 3I

FIG. 3I is a circuit block diagram of an embodiment illustrating a TiADC that also successively utilizes the disclosed SCM of FIG. 6B.

Similarly, for sake of clarity and brevity, the TiADC with 3-bits of resolution is described here. In applying the disclosed SCM here, it would be obvious for one skilled in the art that the TiADC can be made with different resolutions.

The embodiment of FIG. 3I aims to provide an alternative between TiADC illustrated in FIG. 3A and that of FIG. 3D.

This 3-bit illustration of TiADC has one analog input port $I_{IN}$, one analog reference input port REF, three analog output ports $O_N$, $E_N$, $O_P$, and 3-bit digital binary outputs $D_3$, $D_2$, $D_1$, where $D_3$ is the MSB and $D_1$ is the LSB. As described earlier, note that TiADC's internal (digital outputs of successive SCCs are the) thermometer code ($T_1$ through $T_7$) are mapped into a binary format output code ($D_1$ through $D_3$) utilizing a logic encoder (ENCODE).

Applying the successive SCM illustrated in FIG. 6B, the iADC of FIG. 3I is comprising of a cascade of seven SCCs, arranged successively, from the first $SCC_{1_{3I}}$, $SCC_{2_{3I}}$, $SCC_{3_{3I}}$, $SCC_{4_{3I}}$, $SCC_{5_{3I}}$, $SCC_{6_{3I}}$, and the seventh $SCC_{7_{3I}}$ that can utilize similar SCC embodiments illustrated in FIG. 1A, 1B, 1C, 1D, 1E, or 1F.

A current with value $I_R/8$ is fed onto the REF port that is coupled with a diode connected $P_{8_{3I}}$. The segmented reference currents are generated by mirroring REF current onto $P_{1_{3I}}$, $P_{2_{3I}}$, $P_{3_{3I}}$, $P_{4_{3I}}$, $P_{5_{3I}}$, $P_{6_{3I}}$, $P_{7_{3I}}$ (that can be cascoded for increased output impedance) operating at current segment values $I_{R_1}/8$, $I_{R_2}/8$ $I_{R_3}/8$ $I_{R_4}/8$, $I_{R_5}/8$, $I_{R_6}/8$, $I_{R_7}/8$, respectively. Here, the $I_{R_1}/8$ to $I_{R_7}/8$ values are all set to be equal to $I_R/8$. However, for example, in the case of non-linear converters having a non-linear transfer functions, different $I_{R_1}/8$ to $I_{R_7}/8$ values may be programmed.

Note also that the SCM enables multi-staging a TiADC by arranging its' $I_{O_N}$, $I_{E_N}$, $I_{O_P}$ signals through a RALSP circuit onto a second stage iADC, to expand the overall resolution of a iADC at low cost and low currents.

Similar to FIG. 3D, utilizing the TiADC illustrated in FIG. 3I, provides additional benefits for extending the resolution by multi-staging an iADC.

The $I_{O_N}$ or $I_{E_N}$, generated in TiADC of FIG. 3I, are digitally selected $I_{A_N}$ of a single SCC. As a reminder, SCC is a transistor level embodiment of SCB. To select a SCC (or SCB) in transition $SCC_t$ (or $SCB_t$), the digital output signal $T_O$ of all SCCs (or SCBs) preceding the $SCC_t$ (or $SCB_t$) exhibits a polarity opposite to the polarity of the digital output signal $T_O$ of all SCCs (or SCBs) including and succeeding the $SCC_t$ (or $SCB_t$).

Accordingly, along the SCC chain in the TiADC, the $I_{A_N}$ of that SCC in transition is steered onto either $O_N$ or $E_N$ ports. As described earlier, the $I_{O_N}$ and $I_{E_N}$ are subtracted from one another in the RALSP circuit, which generates a $I_{A_L}$ signal that is fed onto the second stage iADC. One of the benefits of generating $I_{A_L}$ in this manner is that it follows an equilateral triangular waveform pattern that avoids zero to full scale transitions from pulsing the next stage iADC, which benefits the iADC's dynamic response.

Additional benefit of utilizing TiADC of FIG. 3I i that $I_{A_L}$ is generated by subtracting one digitally selected (odd or even) $I_{A_N}$ at a time. The TiADC of FIG. 3I avoids the non-linearity associated with subtraction of several even $I_{A_N}$ s from several odd $I_{A_N}$ s (in the SCCs in the cascade chain) to generate $I_{A_L}$. As such, a high-resolution MSB TiADC can still generate a quality $I_{A_L}$ that would not deter the linearity of the overall multi-stage iADC.

Note also that there are alternative (digital selection) embodiments that would be obvious to those skilled in the art.

Linearity improvements pertaining to TiADC illustrated in FIG. 3I are demonstrated in montecarlo simulations illustrated in FIG. 5J, which will be described later.

As an example, applying the same $I_{IN}=2.5I_R/8$ condition as that of FIG. 3A, the thermometer output bit of FIG. 3I are $T_7=0$, $T_6=0$, $T_5=0$, $T_4=0$, $T_3=0$, $T_2=1$, $T_1=1$.

In such example, the output of the Exclusive OR gate $XOR_{3'_{3I}}$ goes low, which turns $P_{3'_{3I}}$ on, which in turn steers $I_{A_N}$ of $SCC_{3'_{3I}}$ through to the $O_N$ port.

As described in FIG. 3A, also here in FIG. 3I, when $I_{IN}=2.5I_R/8$ condition then for $SCC_{3_{3I}}$ the $I_{A_N} \cong I_{R_3}/8-[I_{IN}-(I_{R_1}/8+I_{R_2}/8)] \cong (I_{R_1}/8 \ I_{R_2}/8+I_{R_3}/8)-I_{IN} \cong 0.5I_R/8 \cong I_{O_N}$. The other unselected FETs ($P_{2'_{3I}}$ and $P_{4'_{3I}}$ through $P_{8'_{3I}}$) are off and block $I_{A_N}$ of their respective SCCs (non-transitioning ones) from feeding their respective $I_{A_N}$ currents onto either the $O_N$ or the $O_L$ ports.

As mentioned earlier, for non-linear iADCs, one of the benefits of TiADC of FIG. 3I's manner of generating the $I_{A_L}$ signal, is that each current reference segment values can be programmed accordingly to an objective non-linear transfer function such as logarithmic or square. The $I_{A_L}$ of a non-linear thermometer current network, can then be fed onto a second stage linear iADC which can in effect linearly extrapolate from one non-linear segment to another non-linear segment (established by the nonlinear MSB iADC). The resulting transfer function of for example a 6-bit iADC would follow a non-linear approximation, wherein a non-linear 3-MSB TiADC combined with a linear 3-LSB iADC that extrapolate (approximate) between the non-linear 3-MSB TiADC transition points.

In summary, one of the benefits of a first alternative way in generating $I_{A_L}$ by pairing up a TiADC (illustrated in FIG. 3A) with a RALSP circuit (illustrated in FIG. 1I) is that $I_{A_L}$ would follow an equilateral triangular waveform profile. This feature smoothes the signal transitions for $I_{A_L}$ and avoids zero-scale to full-scale impulses from being inputted to the next iADC, which improves the overall dynamic performance of the multi-stage iADC. Also, this (FIG. 3A plus FIG. 1I) arrangement is logic light which is small and consumes lower dynamic power consumption. However, this (FIG. 3A plus FIG. 1I) arrangement would not be ideal in high-resolution multi-stage iADCs where the first stage TiADC may also need to have more resolution (e.g., 5 bits requiring $2^5=32$ segments and SCCs generating 16 odd $I_{A_N}$s and 16 even $I_{A_N}$ s). As explained earlier, $I_{A_L}$ of (FIG. 3A plus FIG. 1I) arrangement would contain the difference between sum of many odd and sum of many even $I_{A_N}$. As a result, the (overall) iADC's non-linearity could increase due to the mismatch between lumped sum of many odd $I_{A_N}$ and lump sum of many even $I_{A_N}$ s that is contained in the $I_{A_L}$ results.

The benefit of a second alternative way in generating $I_{A_L}$ by utilizing the TiADC illustrated in FIG. 3D is that $I_{A_L}$ is generated by digitally selecting on $I_{A_N}$ of one SCC in the TiADC. As such, TiADC of FIG. 3D can generate a quality $I_{A_L}$ that would not deter the linearity of the overall multi-stage iADC.

FIG. 3I is a third alternative TiADC embodiment, and when coupled with a RALSP circuit, it generates $I_{A_L}$ with the best of what both the first and the second alternatives have to offer. FIG. 3I's TiADC is also incorporated in a multi-stage iADC illustrated in FIG. 4F, to be discussed later). FIG. 5J depicts the montecarlo simulation of FIG. 4F, which demonstrates the linearity enhancement of this alternative, which will be explained later. In this third alternative TiADC embodiment, the SCC's $T_O$ transitions are used to select an $I_{A_N}$ of a SCC (along the SCC cascade). The selected $I_{A_N}$ is steered onto the $O_N$ or $E_N$ ports which feed a RALSP circuit.

As explained earlier, one of the benefit of generating $I_{A_L}$ from the difference between a single odd or even $I_{A_N}$ is that it avoids the cumulative errors associated with the difference between sum of many odd $I_{A_N}$ s and sum of many even $I_{A_N}$ s along the SCC's cascade. Hence, accuracy of $I_{A_L}$ remains undeterred as does the overall accuracy of multi-staged iADC.

Another benefit here is that the resulting $I_{A_L}$ would follow an equilateral triangular waveform, which avoids the zero-scale to full-scale pulses and hence benefits the dynamic performance multi-staged iADC.

There are other alternative knowable to these skilled in the art, including but not limited to another embodiment. For example, the $I_{A_N}$ of each odd numbered SCC can be subtracted from $I_{A_N}$ of the subsequent even numbered SCC to generate an $I'_{A_L}$ of the first odd-even SCC pair. A sum of $I'A_L$ of the all the odd-even SCC pairs can be generated. The $I_{A_O}$ of the last SCC can be subtracted from the sum of $I'_{A_L}$ of the all the odd-even SCC pairs to generate a final $I_{A_L}$. This alternative avoids the digital circuits and remains digital light. The $I_{A_L}$ waveform would follow an equilateral triangular waveform, and good for dynamic response. It would also avoids subtracting sums of several odd from several even $I_{A_N}$ s in one shot which helps linearity.

Figure 3J:
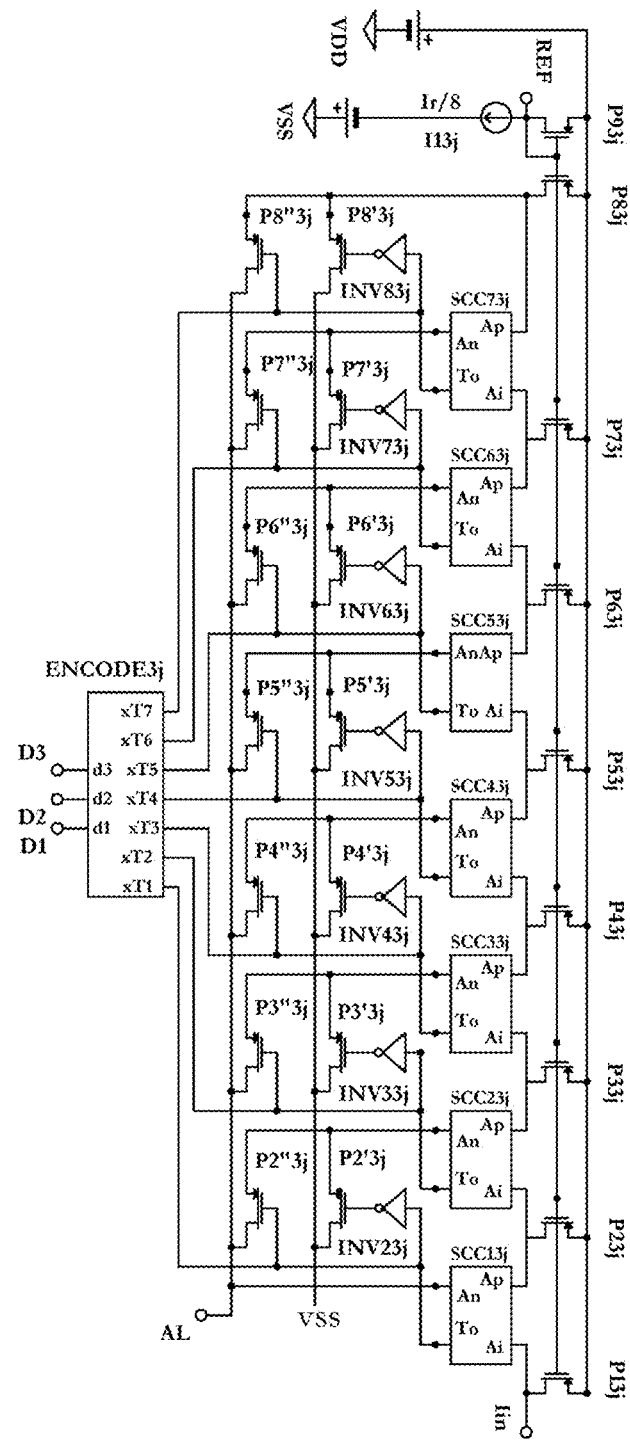
FIG. 3J is a circuit block diagram of another embodiment illustrating a TiADC.

Description of FIG. 3J

FIG. 3J is a circuit block diagram of another embodiment illustrating a TiADC utilizing the disclosed SCM of FIG. 6B.

Also, here for sake of descriptive clarity and brevity and not for limitation, the TiADC with 3-bits of resolution is described here. Applying the disclosed SCM here, it would be obvious to one skilled in the art that the TiADC can be made with different resolutions. As a reminder, by utilizing SCM in combining plurality of signal conditioning blocks (SCB), a TiDAC can be arranged, and for example, a signal conditioning circuit (SCC) is a circuit embodiment of SCB.

Similar to the TiADC described in FIG. 3D, the TiADC disclosed here in FIG. 3J has one analog input port $I_{IN}$, one analog reference input port REF, and 3-bit digital binary outputs $D_3$, $D_2$, $D_1$, where $D_3$ is the MSB and $D_1$ is the LSB. Also, ADC of FIG. 3J only has one analog output $A_L$ port, whose arrangement will be explained shortly.

As described earlier, note that TiADC's internal (digital outputs of successive SCCs are the) thermometer code ($T_1$ through $T_7$) are mapped into a binary format output code ($D_1$ through $D_3$) utilizing a logic encoder (ENCODE).

Applying the SCM successively here, there are cascade of seven SCCs which are $SCC_{1_{3J}}$, $SCC_{2_{3J}}$, $SCC_{3_{3J}}$, $SCC_{4_{3J}}$, $SCC_{5_{3J}}$, $SCC_{6_{3J}}$, $SCC_{7_{3J}}$. The SCC can, for example, utilize similar embodiments illustrated in FIG. 1A, 1B, 1C, 1D, 1E, or 1F.

A current with value $I_R/8$ is fed onto the REF port that is coupled with a diode connected $P_{9_{3J}}$. The REF current is mirrored onto seven segments utilizing FETs that are $P_{1_{3J}}$, $P_{2_{3J}}$, $P_{3_{3J}}$, $P_{4_{3J}}$, $P_{6_{3J}}$, $P_{7_{3J}}$ (that can be cascoded for increased output impedance), and which operate at current segment values $I_{R_1}/8$, $I_{R_2}/8$, $I_{R_3}/8$, $I_{R_4}/8$, $I_{R_5}/8$, $I_{R_6}/8$, $I_{R_7}/8$, respectively. Here, the $I_{R_1}/8$ to $I_{R_7}/8$ are all set to be equal at $I_R/8$. There is a $P_{8_{3J}}$ that operates at $I_{R_8}/8$ also set to value of $I_R/8$, which is an injection current to offset (shift) the $I_{A_P}$ of the last $SCC_{7_{3J}}$ before it is selected for being steered onto the $A_L$ port, which will be explained later.

Also, as indicated earlier, in the case of non-linear converters having a non-linear transfer functions, different $I_{R_1}/8$ to $I_{R_7}/8$ values may be programmed.

The SCM enables multi-staging a TiADC by feeding $A_L$ signal ($I_{A_L}$) to a subsequent iADC to expand the overall resolution of iADC at low cost and low currents.

In the embodiment illustrated in FIG. 3J, the $A_L$ is generated by summing only the gated $I_{A_N}$ s, which are digitally selected by sequence of $T_0$s of successive SCCs, and here is how. In successive cascade of SCCs, the $T_0$ of a previous SCC controls an analog switch or gates to pass on $I_{A_N}$ of a succeeding SCC to the $A_L$ port.

Note that $P_{1''_{3J}}$ to $P_{8''_{3J}}$ are analog switches or gates that are controlled by $T_0$s of SCCs to pass or block the selected $I_{A_N}$ s of selected SCCs onto the $A_L$ port.

For example, $T_0$ of $SCC_{1_{3J}}$ keeps $P_{2''_{3J}}$ off which blocks (i.e., gates off) $I_{A_N}$ of $SCC_{2_{3J}}$ from being steered onto the $A_L$ port until $T_0$ of $SCC_{1_{3J}}$ switches polarity from high to low (i.e., gates on). While $T_0$ of $SCC_{1_{3J}}$ is high, $P_{2'_{3J}}$ prevents the voltage at $A_N$ port of $SCC_{2_{3J}}$ from floating undeterminably, and shunts it to $V_{SS}$. The $P_{2'_{3J}}$ to $P_{8'_{3J}}$ perform this function of preventing SCCs $A_N$ ports from floating in an undetermined state. Similarly, $T_0$ of $SCC_{2_{3J}}$ keeps $P_{3''_{3J}}$ off which blocks (i.e., gates off) $I_{A_N}$ of $SCC_{3_{3J}}$ from being steered onto the $A_L$ port until $T_0$ of $SCC_{2_{3J}}$ switches polarity from high to low (i.e., gate on). This process continues up to $T_0$ of $SCC_{6_{3J}}$ that keeps $P_{7''_{3J}}$ off which blocks (i.e., gates off) $I_{A_N}$ of $SCC_{7_{3J}}$ from being steered onto the $A_L$ port until $T_0$ of $SCC_{6_{3J}}$ switches polarity from high to low (i.e., gate on).

Figure 5D:
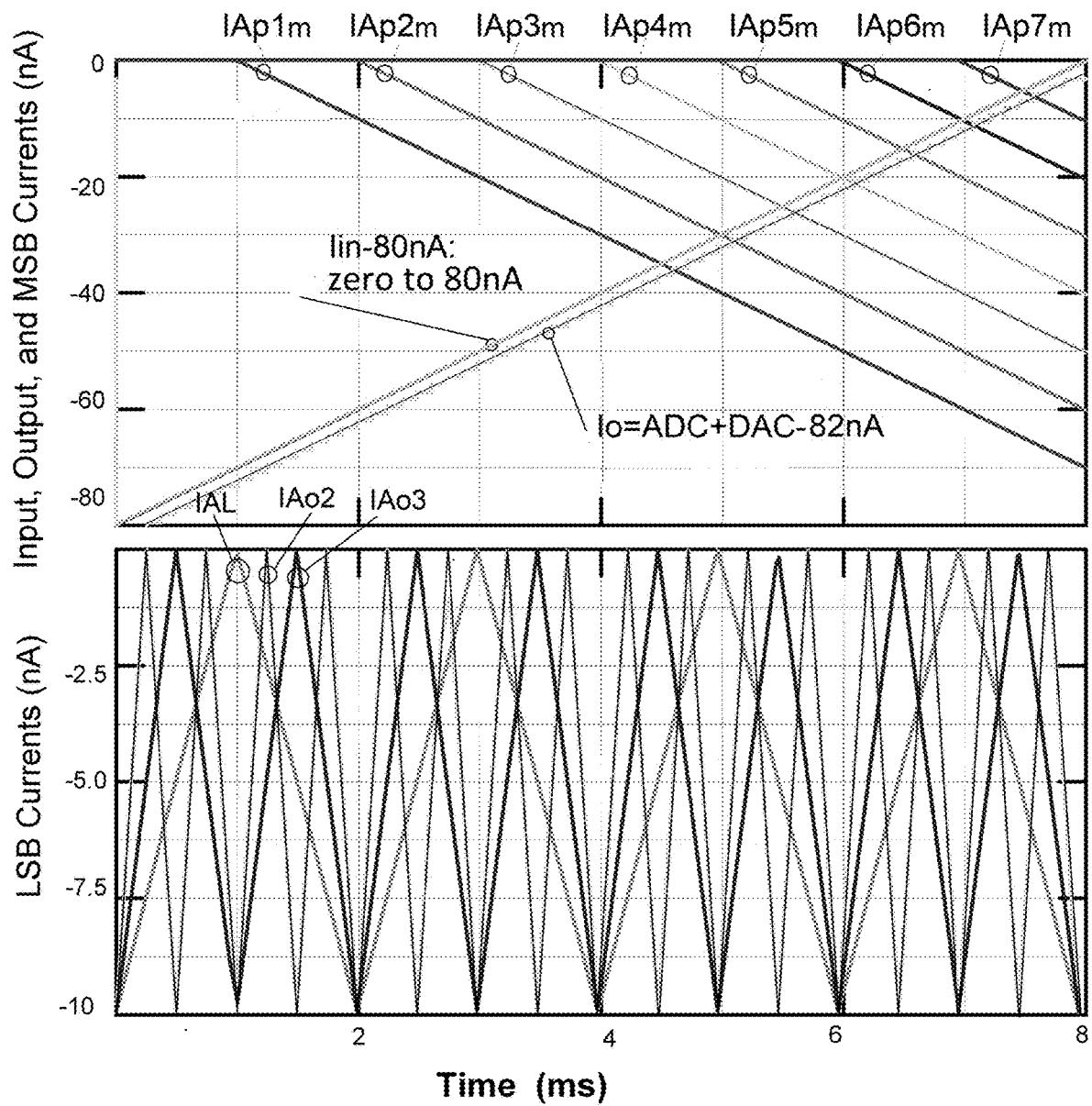
FIG. 5D is a circuit simulation showing waveforms of the iADC illustrated in FIG. 4B
Figure 5E:
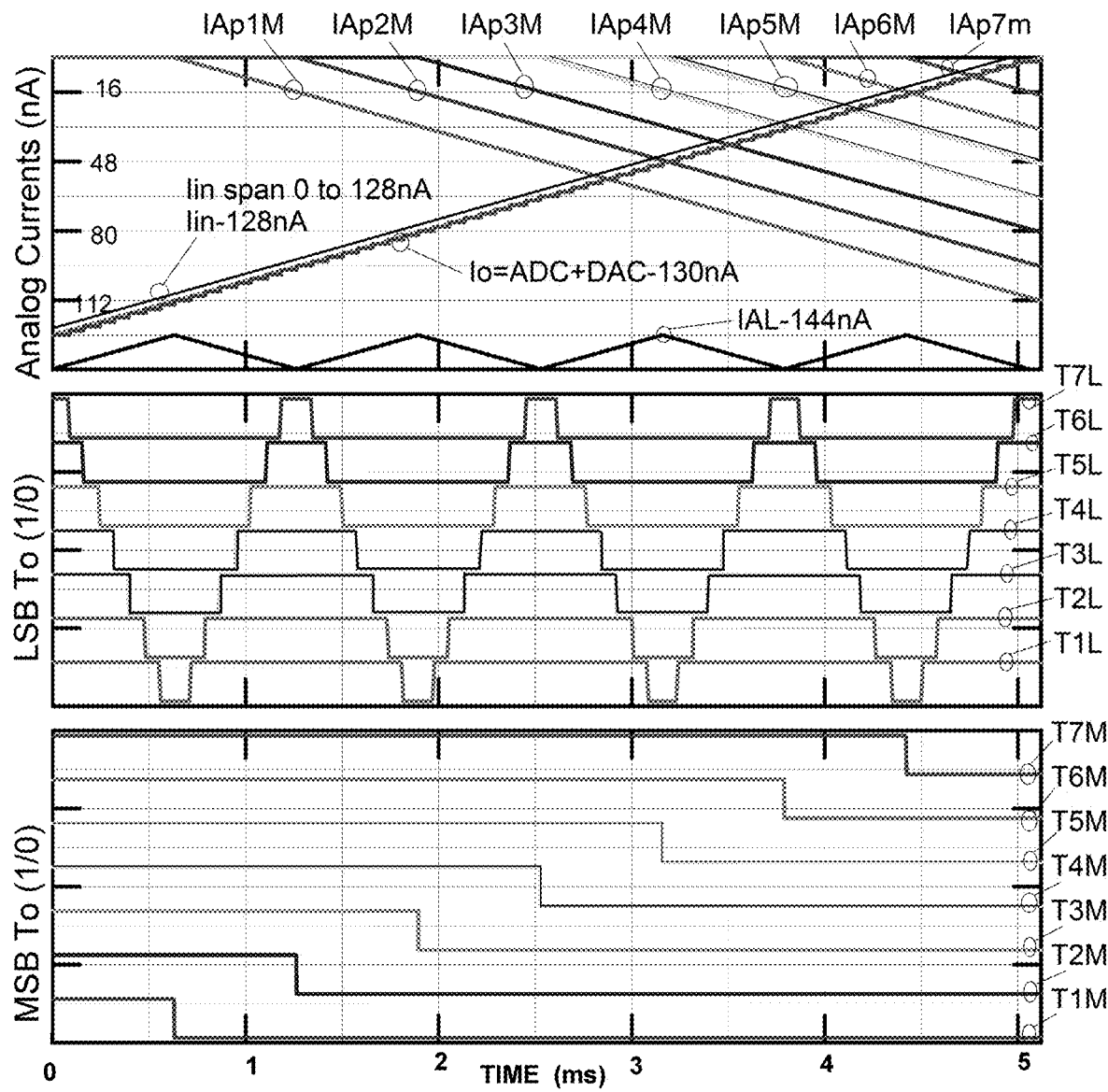
FIG. 5E is a circuit simulation showing waveforms of the iADC illustrated in FIG. 4C
Figure 5F:
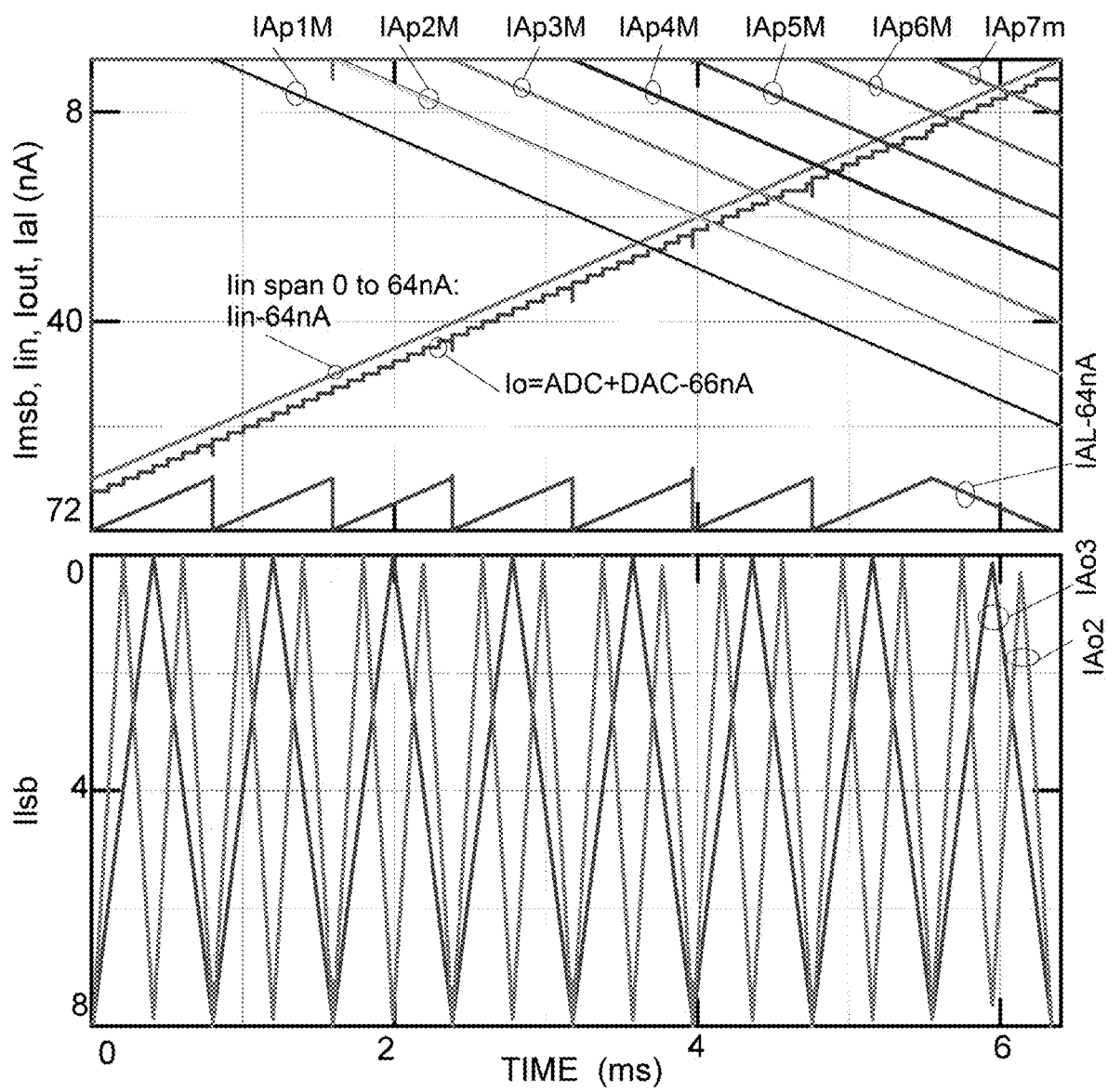
FIG. 5F is a circuit simulation showing waveforms of the iADC illustrated in FIG. 4D
Figure 5G:
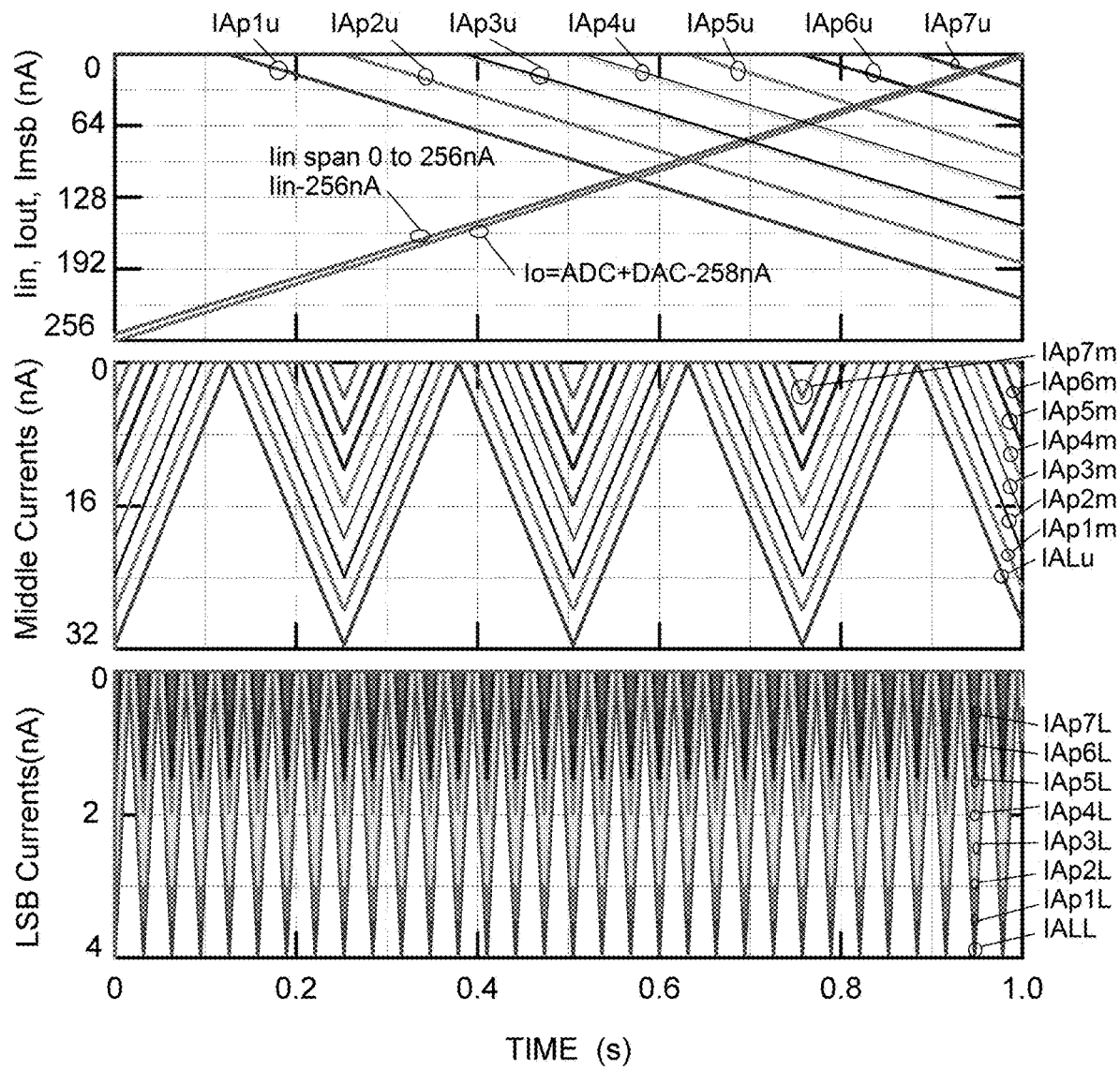
FIG. 5G is a circuit simulation showing waveforms of the iADC illustrated in FIG. 4E
Figure 5H:
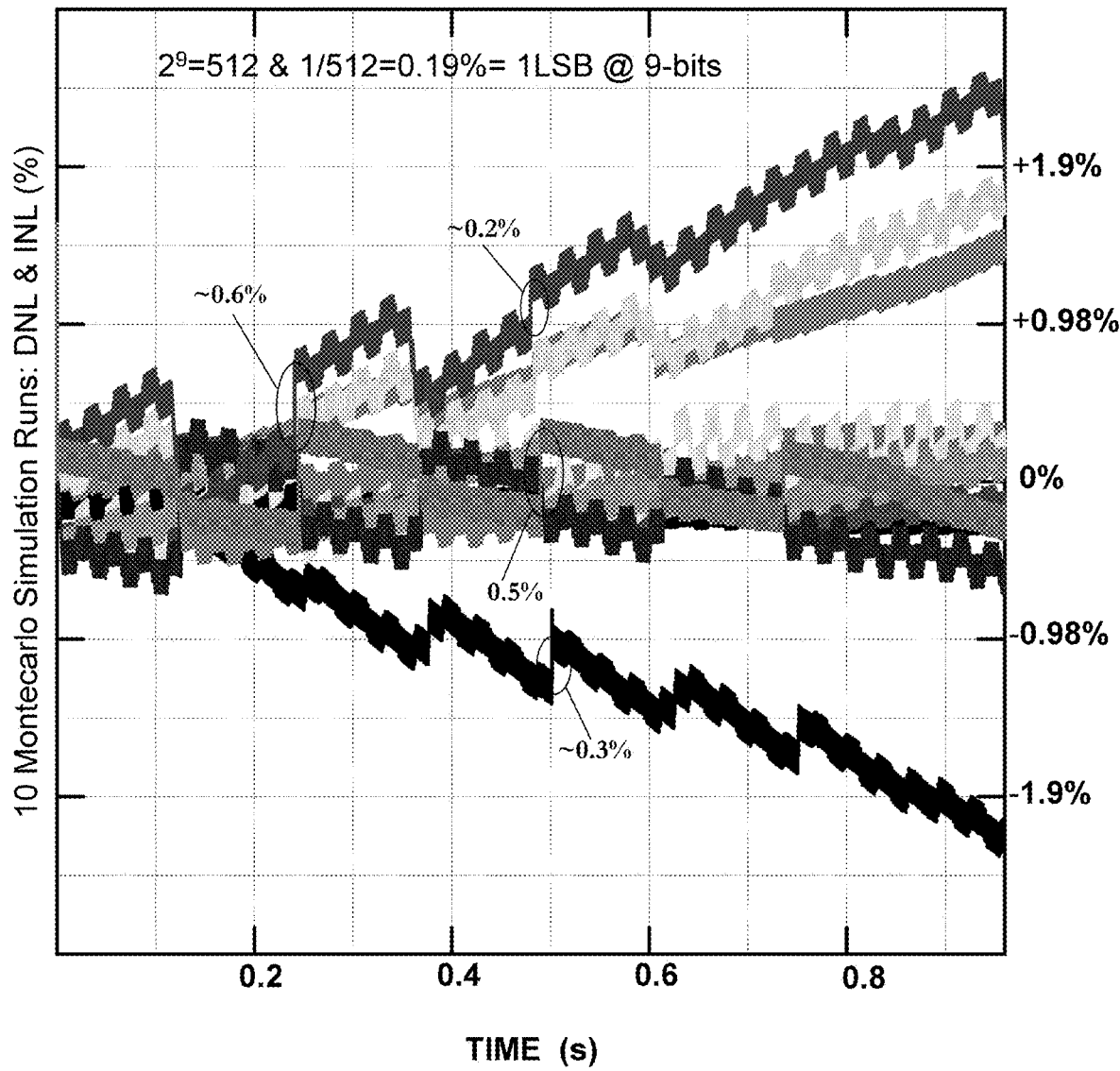
FIG. 5H is a circuit simulation showing waveforms of montecarlo (MC) simulations depicting linearity of the multi-stage iADC illustrated in FIG. 4E.
Figure 5I:
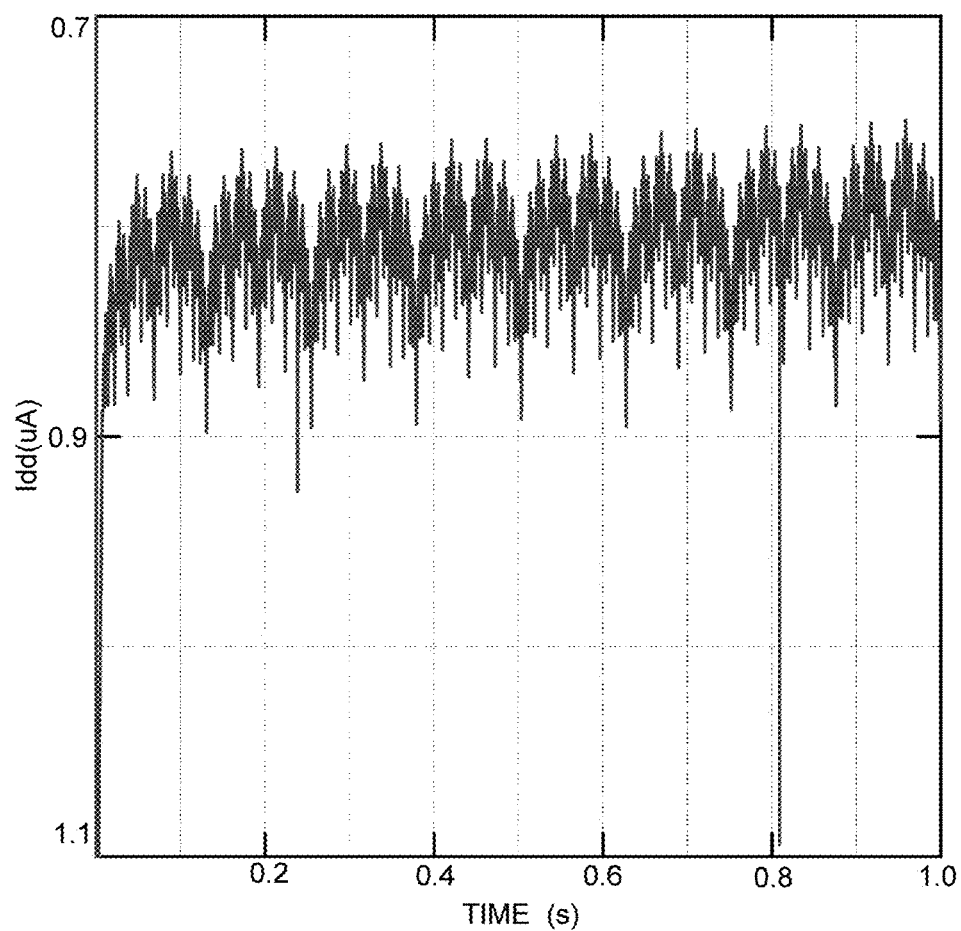
FIG. 5I is a circuit simulation showing the $I_{DD}$ waveform of the multi-stage iADC illustrated in FIG. 4E.
Figure 5J:
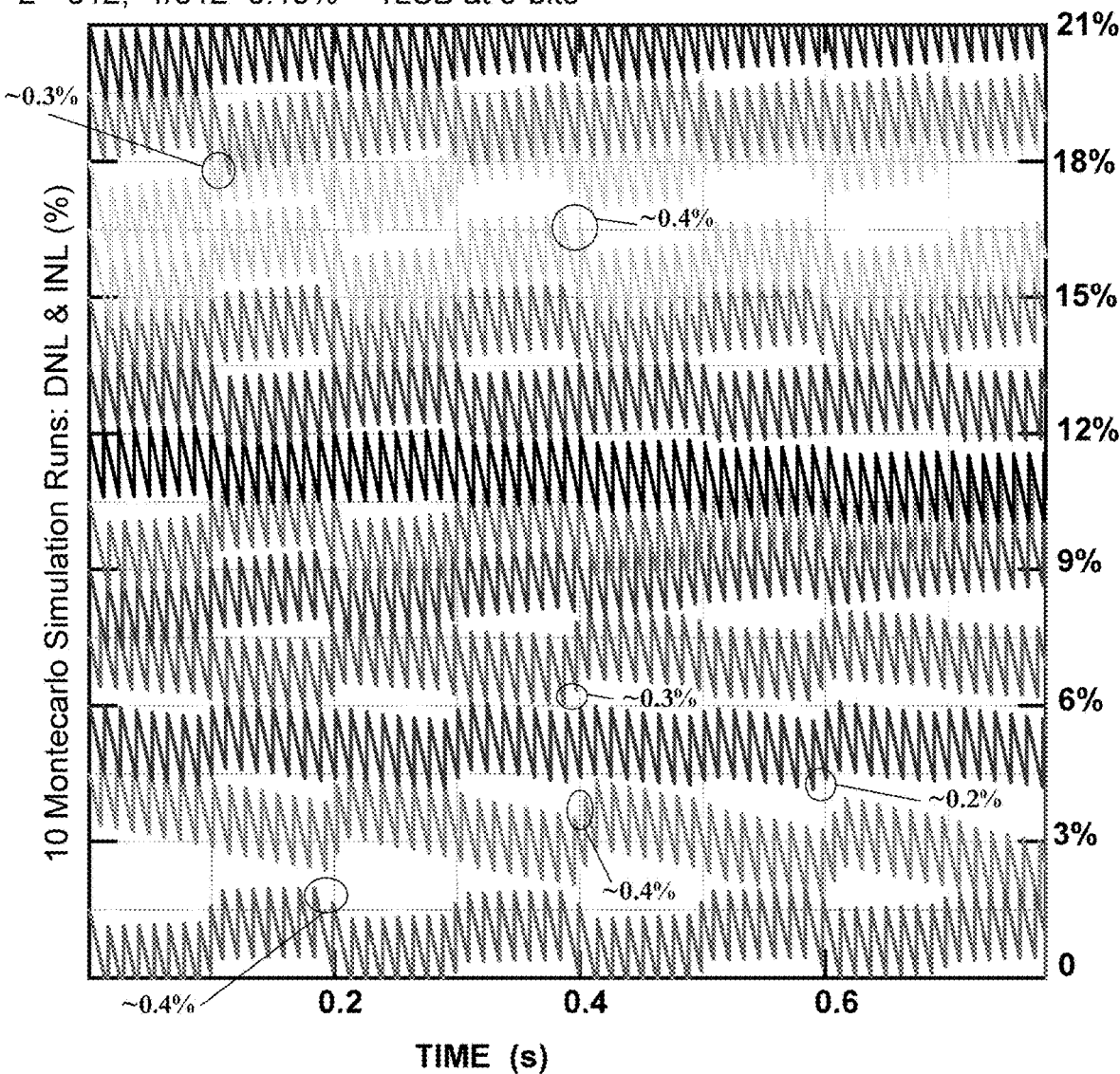
FIG. 5J is a circuit simulation showing waveforms of montecarlo simulations depicting linearity of the iADC illustrated in FIG. 4A wherein $ADC1_{4A}$ is of the kind illustrated in FIG. 3I.
Figure 5K:
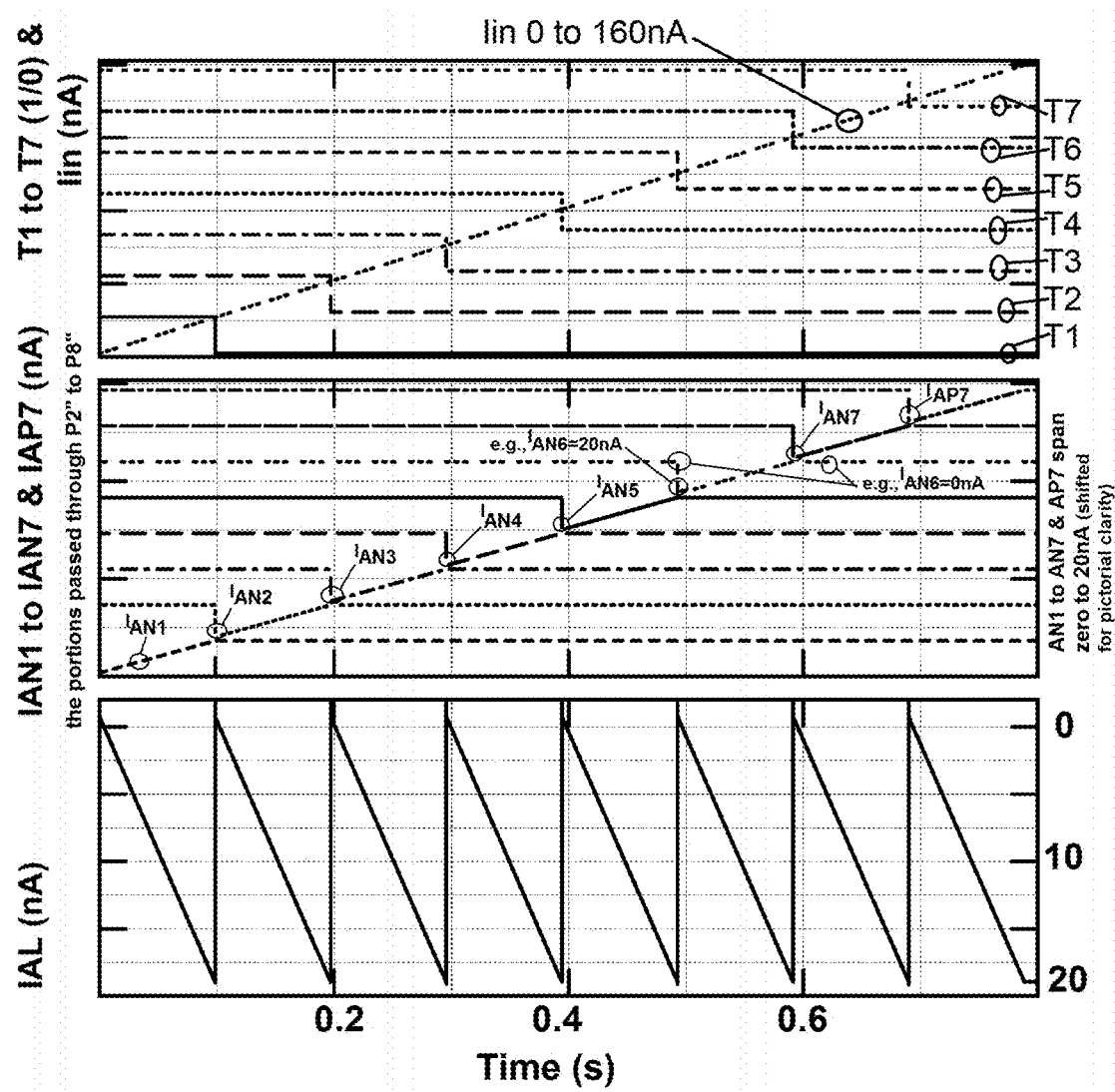
FIG. 5K is a circuit simulation showing waveforms of the TiADC illustrated in FIG. 3J that is also utilized in FIG. 4F

FIG. 5K, which will be described later, depicts the simulations of FIG. 3J's circuit. It illustrated the selected portion of $I_{A_N}$ of each SCC, after they each passes through the switches $P_{2''_{3J}}$ to $P_{7''_{3J}}$. FIG. 5K also shows the net $I_{A_L}$ (sum of all passed through $I_{A_N}$) plot as a function of $I_{IN}$ (spanning from zero to 160 nA). The $I_{A_L}$ is a right triangular waveform with the peak-trough value of zero to $I_R/8=20$ nA.

For $I_{IN}=2.5I_R/8$, the thermometer digital output bit of FIG. 3J are $xT_7=1$, $xT_6=1$, $xT_5=1$, $xT_4=1$, $xT_3=1$, $xT_2=0$, $xT_1=0$.

In such example, at $I_{IN}=2.5I_R/8$ and with $T_3$ to $T_7$ all at 1 state, then $P_{4''_{3J}}$ to $P_{8''_{3J}}$ are all off, which blocks their respective $I_{A_N}$ s from passing through to the $A_L$ port. When $T_1$ to $T_1$ at 0 state, then $P_{2''_{3J}}$ to $P_{3''_{3J}}$ are on. But when $I_{IN}=2.5I_R/8$, then $I_{A_N}$s of $SCC_{1_{3J}}$ and $SCC_{2_{3J}}$ are zero, which contributes no current to the $A_L$ port. Therefore, only when selected (i.e., gate on), then $I_{A_N}$ of $SCC_{3_{3J}}$ is passed through $P_{3''_{3J}}$ and onto the $A_L$ port.

In summary, when $I_{IN}=2.5I_R/8$ condition, for $SCC_{3_{3J}}$ the $I_{A_N} \cong I_{R_3}/8-[I_{IN}-(I_{R_1}/8+I_{R_2}/8)] \cong (I_{R_1}/8+I_{R_2}/8+I_{R_3}/8)-I_{IN} \cong 0.5I_R/8 \cong I_{A_L}$.

Note also that for a correct sign/direction, the $I_{A_P}$ of $SCC_{7_U}$ is inverted by subtracting an $I_R/8$ (using $P_{8_U}$) from it and then passing the corrected net-current through the (i.e., gate) analog switch $P_{8''_U}$ if $T_O$ of $SCC_{7_U}$ goes from high to low state.

For comparative perspective, in the example of $I_{IN}=2.5I_R/8$ for FIG. 3A, $I_{A_L}$ is generated by subtracting the sum of all odd numbered SCC's $I_{A_N}$s from sum of all even numbered SCC's $I_{A_N}$s. That is $I_{A_L}=I_{O_N}-I_{E_N}-I_{O_P}\cong(I_R/8+I_{R_5}/8+0.5I_{R_3}/8+0I_{R_1}/8)-(I_{R_6}/8+I_{R_4}/8+0I_{R_2}/8)-0\cong0.5I_R/8$.

In the example of $I_{IN}=2.5I_R/8$ for FIG. 3J, the $I_{A_L}$ is effectively generated from output of a single SCC. The $I_{A_N}$'s of other SCCs that remain connected to the $A_L$ port, run with zero currents and effectively don't contribute to $I_{A_L}$. The $I_{A_L}$ of FIG. 3J when $I_{IN}=2.5I_R/8$ is selected from $SCC_{3_U}$ with $I_{A_N}\cong I_{R_3}/8-[I_{IN}-(I_{R_1}/8+I_{R_2}/8)]\cong(I_{R_1}/8+I_{R_2}/8+I_{R_3}/8)-I_{IN}\cong0.5I_R/8\cong I_{A_L}$.

Utilizing the TiADC illustrated in FIG. 3J to generate $I_{A_L}$, provides additional benefits for extending the resolution by multi-staging an iADC. The $I_{A_L}$, in TiADC of FIG. 3J, is generated by extracting residual segmented currents from a SCC (as opposed to extracting $I_{A_L}$ from the difference between the sum of several odd and several even segment currents of SCC's $I_{A_N}$s). As such, a high-resolution first stage TiADC can still generate a higher quality $I_{A_L}$ that would not deter the non-linearity of the overall multi-stage iADC. Also, as it will be described later, note that FIG. 4F depicts a functional block diagram of another embodiment illustrating another multi-stage iADC that combines a TiADC illustrated in FIG. 3J with an AiADC illustrated in FIG. 3C The descriptions provided in the next section pertain to the FIGS. 4A, 4B, 4C, 4D, and 4E, to explain the capability of the disclosed methods to increase the iADC's resolution by multi-staging the iADC. For descriptive clarity and continuity of discussion, the resolution of first or second or third stages are chosen to be equal at 3-bits of resolution each. It would be obvious to one skilled in the art that each stage can have different number of bit resolutions and there can be more than three stages, depending on cost-performance targets of an end application. To be clear about terminologies, for example, 6-bits refers to $D_6$, $D_5$, $D_4$, $D_3$, $D_2$, $D_1$ where $D_6$ is the MSB and $D_1$ is the LSB. The MSB bank refers to the upper bits $D_6$, $D_5$, $D_4$. The LSB bank refers to the lower bits $D_3$, $D_2$, $D_1$. Also, for example, in a 6-bit 2-stage iADC, the 3-MSB iADC refers to the first stage iADC that outputs 3-MSB (for example $D_6$, $D_5$, $D_4$).

Successive SCM embodied in cascade of SCCs are utilized in a TiADC. The TiADC is utilized as the first stage (or MSB stage) of a multi-stage iADCs. The benefits of multi-stage iADCs disclosed in the application are:

First, the resolution of the multi-stage iADC can be increased cost-effectively by cascading at least two iADCs (where in some iADC arrangements RALSP circuit is inserted between 2 iADCs).

For example, to make a single stage 6-bit TiADC, that uses a full thermometer current mode topology, it would require $2^6=64$ SCCs and a 64 bit to 6-bit encoder which would be accurate and monotonic (e.g., to the degree of precision attained by the MSB TiADC). Comparatively, to make a 6 bit multi-stage iADC with two identical 3-bit TiADCs, it would require two of $2^3=8$ of SCCs, a RALSP circuit, and a 8 to 3 bit encoder, which would be smaller and lower power than 64 SCCs and a 64 bit to 6 bit encoder.

Second, the overall accuracy of iADC is improved, since the accuracy would be dominated by the (MSB or) first TiADC based on the SCM. For example, as explained earlier, the non-linearity of TiADC attributed to the contribution of normal but random mismatches (between FETs that make the current reference network of TiADC) is reduced by about $\sqrt{2^3}=2.8$ times.

Third, the non-MSB (subsequent) stages of the iADC can be designed for less accuracy but it can also be smaller or faster. For example, for a 9-bit iADC, the first stage 3-bit TiADC need to be 9 bits accurate or about 0.19% accurate. A second stage 6-bit iADC need only be 6-bit accurate or about 1.5% (or better) for the whole 9-bit iADC to still be about 9-bit accurate. Therefore, the second stage iADC can be made with smaller FETs, for example, to optimize for dynamic performance and speed instead of accuracy. Note also that the RALSP circuit is fed with $I_{A_L}$ from the first stage 3-bit TiADC. Hence, the matching accuracy of the RALSP circuit (e.g., the mismatch between FET current mirrors) need be about 6-bit accurate or 1.5% (or better) for the overall iADC to be 9-bit accurate. As stated earlier, for high-resolution multi-stage iADCs that require a mid-to-high resolution TiADC as their first stage iADC, more precision RALSP circuit (that those illustrated in FIG. 1H, 1I, 1J would be needed)

Fourth, As noted earlier, the TiADC's accuracy is dominated by the matching of the segmented reference current sources, and the offset or mismatches attributed to SCC have insubstantial contribution to the accuracy of the TiADC.

Fifth, operating the multi-stage iADC in current mode is inherently fast.

Sixth, operating in current mode, inherently requires small voltage swings, which enables an iADC to operate with low supply voltage as well as fast speeds.

Seventh, the iADC can operate in subthreshold, which enables the iADC to operate at ultra low current and even lower power supply voltages.

Eight, the slowest comparison time ($\tau_s$) in the TiADC occurs at a SCC's node when the reference current flowing-in and the input current flowing-out of a node are in balance. The larger the difference between input and reference current applied (as current over drive) to the SCC, the faster the comparison speed. Accordingly, the dynamic response of the disclosed TiADC is dominate by the SCC where its' input signal value is near the reference signal value. Also, the neighboring (before and after) SCC that experience the larger difference (farther from zero-crossing point) between their inputs and reference currents, provide faster response time. In other words, although the SCC are cascaded in TiADC, the contribution of the delay of each SCC in the cascade to the TiADC's speed is not equal. The dynamic response of the TiADC is dominated by one SCC whose input signal value and reference signal value are near balance. It is of note that, for multi-stage iADC, the RALSP circuit is cascaded with the TiADC which impacts the dynamic response of the overall iADC.

Ninth, alternative embodiments of TiADC (combined with RALSP circuit) enable having a continuous, instead of abrupt transitions between full-scale and zero-scale for $I_{A_L}$ applied to the subsequent iADC stage. This would improve the iADC dynamic response. For example, FIG. 5B shows the $I_{A_L}$ which is an equilateral triangular waveform (compared to $I_{A_L}$ of FIG. 5F which is a right-angled triangular waveform). As discussed earlier in FIG. 1H, I, J, the RALSP circuit operates in current mode and by keeping the current mirrors alive by feeding them with enough injection currents, the RALSP circuit delay would not impede the overall dynamic performance of the iADC.

Tenth, as stated earlier, the SCC concurrently performs analog differencing and digital comparison between its input current and reference current. Therefore, the dynamic accuracy of iADC deteriorates gradually, and not abruptly, with increased frequency of the input current signal.

Eleventh, the SCC can utilize differential circuitry (such as differential amplifier and comparator) which can improve iADC's noise rejection.

Twelfth, low cost multi-stage iADC can be configured such that it approximates an objective non-linear transfer function. This is accomplished by programming (by different scaling of) the segmented reference current sources in the MSB TiADC according to an objective non-linear transfer function. Accordingly, the MSB iADC has the information to generate a non-linear RALSP signal ($I_{A_L}$) that can be fed onto the next stage (LSB) iADC. The second stage iADC can have equal segmented reference current sources, which enables it to linearly extrapolate between the non-linear increments provided by the non-linear MSB iADC. Thus, low cost iADC can be made that approximates an objective non-linear transfer function.

Thirteenth, the multi-stage iADC is asynchronous and is clock free, which reduces dynamic power consumption and eliminates the need for clock, which reduces digital induced noise in the analog circuitry and lowers the clock feedthrough to the power supplies.

Fourteenth, multi-stage iADC is based on standard CMOS technology that can be made low at costs, rugged, and it is reliably manufacturable with standard digital fabrication processes that are widely available.

Fifteenth, the multi-stage iADC requires neither any resistors nor any capacitors which saves additional manufacturing cost.

Sixteenth, the accuracy of TiADC can be increased further by post manufacturing trimming or on-chip calibration, knowable by those skilled in the art.

Description of FIG. 4A

FIG. 4A is a functional block diagram of an embodiment illustrating a multi-stage iADC that combines a first TiADC with a second TiADC.

The $ADC_{1_{4A}}$ and $ADC_{2_{4A}}$ depict TiADC, for example such as the one disclosed in FIG. 3A and FIG. 3C, respectively. Alternatively, $ADC_{2_{4A}}$ can utilize a TiADC such as the one in FIG. 3A whose $O_N$ and $E_N$ pins are connected to $V_{SS}$, and $O_N$ is connected to $V_{DD}$. Another alternative is that $ADC_{1_{4A}}$ can utilize a TiADC of the kind illustrated in FIG. 3I, and $ADC_{2_{4A}}$ can utilize a TiADC of the kind illustrated in FIG. 3C. The $RALSP_{1_{4A}}$ depicts the RALSP circuit, for example such as the one disclosed in FIG. 1H, FIG. 1I, or FIG. 1J.

The reference current, $I_{1_{4A}} = I_R$ is supplied to $ADC_{1_{4A}}$. The term D(MSB) denotes number of bits for the MSB-stage TiADC, which in this example is 3 bits. The $I_{1_{4A}}$ value is $2^{D(MSB)} = 2^3 = 8$ time bigger than the reference current $I_{2_{4A}} = \frac{1}{8}I_R$ that is supplied to $ADC_{2_{4A}}$.

As mentioned earlier, $ADC_{1_{4A}}$ generates the 3 MSBs, as well as three analog outputs $I_{O_N}$, $I_{E_N}$, $I_{E_N}$ which are fed onto $RALSP_{1_{4A}}$. Then, $RALSP_{1_{4A}}$ performs the analog addition and subtraction function to generate $I_{A_L} \cong I_{O_N} - I_{E_N} - I_{E_N}$. The $I_{A_L}$ is the RALSP of the TiADC's ($ADC_{1_{4A}}$) input signal, which is fed, as analog input current, to the second stage $ADC_{2_{4A}}$ to generates the 3-LSBs.

FIG. 5B is a graphical depiction of FIG. 4A various waveforms, which will be described later. FIG. 5B simulations pertain to a iADC of FIG. 4A where $ADC_{1_{4A}}$ is a TiADC of the kind illustrated in FIG. 3A. FIG. 5B includes the $I_{A_L}$ waveform which is an equilateral triangular waveform, showing the avoidance of abrupt zero-scale to full-scale transitions, which helps improve the overall iADC's dynamic response.

FIG. 5J, which will also be described later, depicts montecarlo simulation waveforms pertaining to a iADC of FIG. 4A. For FIG. 5J's simulations of FIG. 4A's iADC, $ADC_{1_{4A}}$ is a TiADC of the kind illustrated in FIG. 3I, and $ADC_{2_{4A}}$ is a TiADC of the kind illustrated in FIG. 3C. FIG. 5J indicates that the linearity of multi-stage iADC is improved by utilizing the SCM disclosed in this application. Moreover, linearity improvement is not diminished in the multi-stage iADC here because $I_{A_L}$ is generated form the subtraction of one even SCC's $I_{A_N}$ and one odd SCC's $I_{A_N}$, wherein the SCC is digitally selected (by $T_O$s) from one of TiADC's SCC in transition.

In FIG. 4A, in accordance with the $I_{A_L}$ analog flipping which makes an equilateral triangular waveform, the polarity of the LSB (digital) outputs of the second stage TiADC is also digitally corrected by using the $D_4$ bit to flip the polarity of LSB bank ($D_3$, $D_2$, $D_1$) with $FLIP_{1_{4A}}$.

Description of FIG. 4B

FIG. 4B is a functional block diagram of an embodiment illustrating a multi-stage iADC that combines a first (or MSB) stage TiADC with a second-stage that is an AiADC.

The $ADC_{1_{4B}}$ also depicts a TiADC, for example such as the one disclosed in FIG. 3A. The $RALSP_{1_{4B}}$ also depicts the RALSP circuit, for example such as the one disclosed in FIG. 1H, 1I, or 1J. The $ADC_{2_{4B}}$ depicts an AiADC, for example such as the one disclosed in FIG. 3E, or similarly, the complementary versions (e.g., PMOS current reference network version) of 3F or 3G.

The reference current, $I_{1_{4B}} = I_R$ that is supplied to $ADC_{1_{4B}}$ is $2^{D_{-}MSB} = 2^3 = 8$ time bigger than the reference current, $I_{2_{4B}} = \frac{1}{8}I_R$ that is supplied to $ADC_{2_{4B}}$.

As mentioned earlier, $ADC_{1_{4B}}$ generates the 3 MSBs ($D_6$, $D_5$, $D_4$), as well as three analog outputs $I_{O_N}$, $I_{E_N}$, $I_{E_N}$ which are fed onto $RALSP_{1_{4B}}$. Then, $RALSP_{1_{4B}}$ performs the analog addition and subtraction function to generate $I_{A_L} \cong I_{O_N} - I_{E_N} - I_{E_N}$. The $I_{A_L}$ represents the RALSP of the ($ADC_{1_{4B}}$) iADC's input signal, which is fed, as analog input current, to the second stage $ADC_{2_{4B}}$, that is an AiADC which would generates the 3-LSBs ($D_3$, $D_2$, $D_1$).

FIG. 5D is a graphical depiction of FIG. 4B (utilizing FIG. 3A for $ADC_{1_{4B}}$, and FIG. 3E for $ADC_{2_{4B}}$) various waveforms, which will be described later. FIG. 5D also includes the plot of $I_{A_L}$ as a function of $I_{IN}$ which is an equilateral triangular waveform to helps improve the ADC's dynamic response.

As explained in the description of FIG. 3E, 3F, 3G, the AiADC generate a gray code output that is decoded to binary format. The digital input S of $ADC_{2_{4B}}$ enables flipping its gray code LSB bank (as a function of the $D_4$ from $ADC_{1_{4B}}$). Accordingly, the LSB bank polarity is corrected in response to the signal flipping that shapes the analog equilateral triangular waveform inputted to $ADC_{1_{4B}}$.

Description of FIG. 4C

FIG. 4C is a functional block diagram of another embodiment illustrating a multi-stage 6-bit iADC that combines a 3-bit TiADC with a 3-bit FiADC.

The 3-bit $ADC_{1_{4C}}$ depicts TiADC, for example such as the one disclosed in FIG. 3A, which generates the 3-MSBs ($D_6$, $D_5$, $D_4$). The $RALSP_{1_{4C}}$ also depicts the RALSP circuit, for example such as the one disclosed in FIG. 1Q. The 3-bit $ADC_{2_{4C}}$, depicts a FiADC, for example such as the one disclosed in FIG. 3E, which generates the 3-LSBs ($D_3$, $D_2$, $D_1$).

The reference current, $I_{1_{4C}} = I_R$ is supplied to $ADC_{1_{4C}}$, is $2^{D\_MSB} = 2^3 = 8$ time bigger than the reference current, $I_{2_{4C}} = \frac{1}{8} I_R$, that is supplied to $ADC_{2_{4C}}$.

As stated earlier, $ADC_{1_{4C}}$ generates the 3 MSBs, as well as three analog outputs $I_{O_N}$, $I_{E_N}$, $I_{E_N}$ which are fed onto $RALSP_{1_{4C}}$. Then, $RALSP_{1_{4C}}$ performs the analog addition and subtraction to generate $I_{A_L} \cong I_{O_N} - I_{E_N} - I_{E_N}$. The $I_{A_L}$ represents the RALSP of the ($ADC_{1_{4C}}$) iADC's input signal, which is fed (as analog input current signal) to the second stage $ADC_{2_{4C}}$ that is FiADC which generates the 3-LSBs. FIG. 5E is a graphical depiction of FIG. 4C various waveforms (utilizing FIG. 3A for $ADC_{1_{4D}}$, and FIG. 3H for $ADC_{2_{4D}}$), which will be described later.

Description of FIG. 4D

FIG. 4D is a functional block diagram of another embodiment illustrating a multi-stage 6-bit iADC that combines a 3-bit TiADC with another 3-bit AiADC.

The 3-bit $ADC_{1_{4D}}$ depicts TiADC, for example such as the one disclosed in FIG. 3D, generates the 3-MSBs ($D_6$, $D_5$, $D_4$) and the residual analog LSB portion of the input current signal, $I_{A_L}$ that is inputted onto $ADC_{2_{4D}}$ to generates the 3-LSBs ($D_3$, $D_2$, $D_1$).

The reference current, $I_{1_{4D}} = I_R$, supplied to $ADC_{1_{4D}}$ is $2^{D\_MSB} = 2^3 = 8$ time bigger than the reference current, $I_{2_{4D}} = \frac{1}{8} I_R$ that is supplied to $ADC_{2_{4D}}$.

The current steering network within TiADC contains all the information to re-construct, $I_{A_L}$, as a residual analog LSB portion of $I_{IN}$ input current signal, and this feature provides TiADC topology with some flexibility to be arranged in variety of fashions. For example, the $ADC_{1_{4D}}$ can utilize a variation of the TiADC that is disclosed in FIG. 3D.

Here, the $XNOR_{8_{3D}}$ and $P_{8'_{3D}}$ are eliminated and instead the $I_{A_{P'}}$ (that is the current mirror of $I_{A_P}$ available at $SCC_{7_{3D}}$) with proper polarity is directly fed onto the $A_L$ port. FIG. 5F shows the $I_{A_L}$, which is a right-angled triangular waveform except the back-end of the waveform, which is an equilateral triangular waveform, feeding $ADC_{2_{4D}}$ that is a AiADC. Note that the 3-bit (LSBs) $ADC_{2_{4D}}$ depicts a AiADC, for example such as a complementary version of AiADC that is disclosed in FIG. 3E (e.g., NMOS current reference network version, and MOS complementary DABS2 circuit). The digital input S of $ADC_{2_{4D}}$ enables flipping its gray code LSB bank (as a function of the $T_7$ bit of $ADC_{1_{4D}}$). Accordingly, $T_7$ flips the polarity of the LSB bank, where the transition from right angled triangular to equilateral triangular waveform occurs.

FIG. 5F is a graphical depiction of FIG. 4D various waveforms (utilizing FIG. 3D for $ADC_{1_{4D}}$, and FIG. 3E for $ADC_{2_{4D}}$), which will be described later.

Figure 4E:
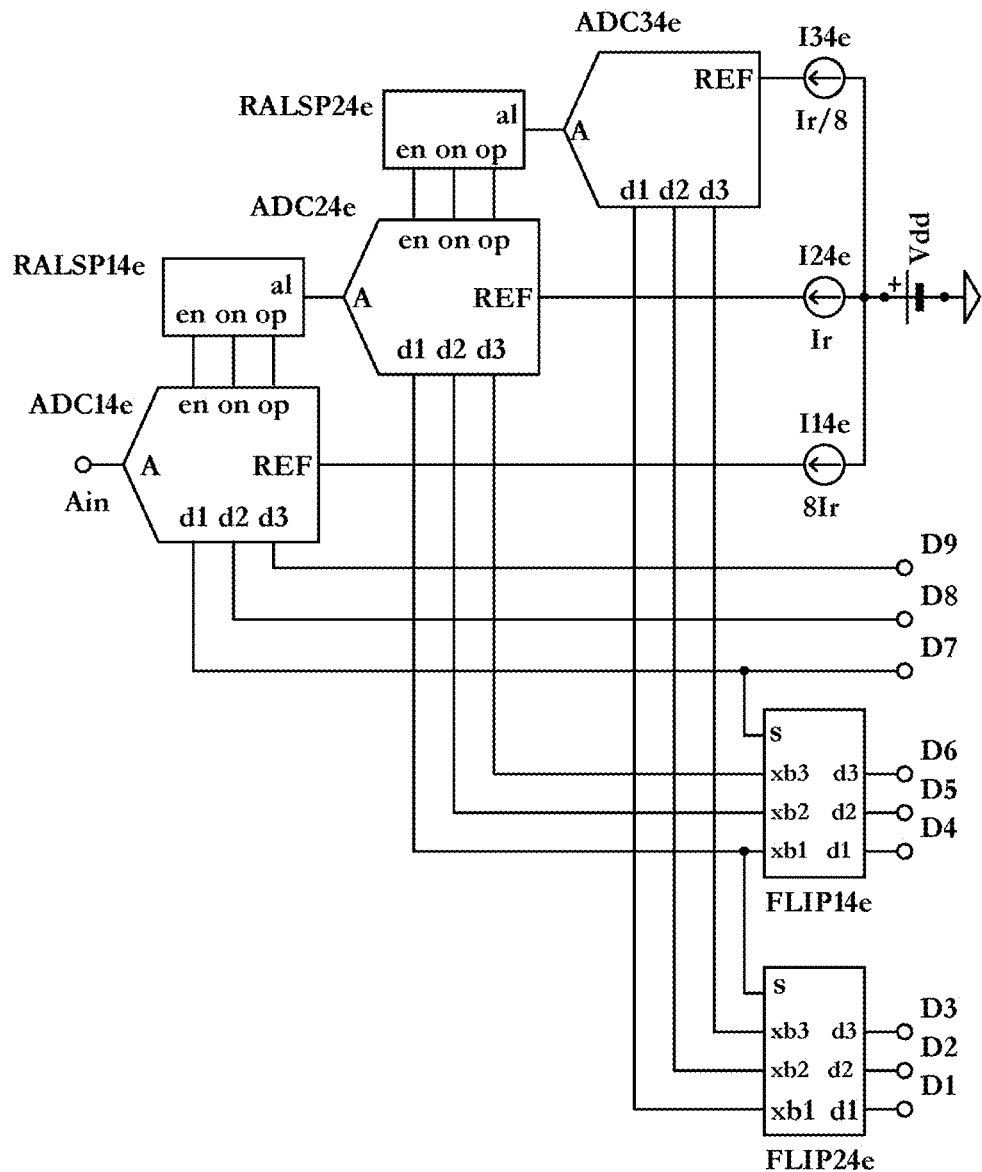
FIG. 4E is a functional block diagram of another embodiment illustrating a multi-stage iADC that combines a TiADC with a second TiADC and a third TiADC, where all three TiADC are illustrated in FIG. 3A.
Figure 4F:
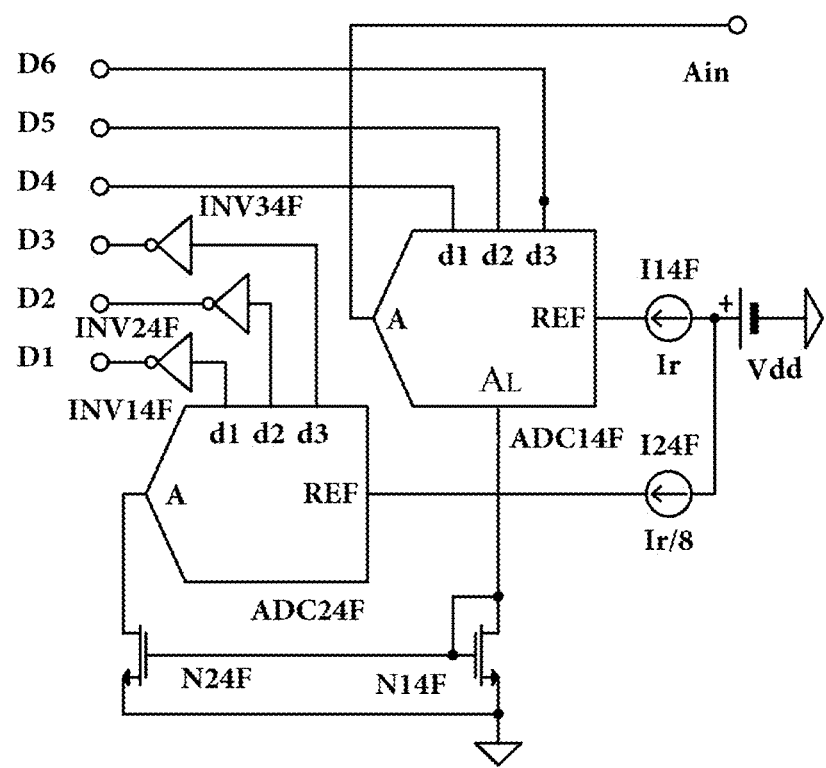
FIG. 4F is a functional block diagram of another embodiment illustrating another multi-stage iADC that combines a TiADC illustrated in FIG. 3J with an AiADC illustrated in FIG. 3C.

Description of FIG. 4E

FIG. 4A is a functional block diagram of an embodiment illustrating a 3-stage iADC comprising three cascaded TiADCs with two RALSP circuits, one in between first and second and one between second and third TiADCs.

The $ADC_{1_{4E}}$, $ADC_{2_{4E}}$, $ADC_{3_{4E}}$ are each a TiADC, for example such as the one illustrated in FIG. 3C. Note that $ADC_{3_{4E}}$ can utilize TiADC of FIG. 3A or that of FIG. 3C whose $O_N$ and $E_N$ pins are connected to $V_{SS}$, and $O_P$ is connected to $V_{DD}$. The $RALSP_{1_{4E}}$, $RALSP_{2_{4E}}$ depicts the RALSP circuit, for example such as the one illustrated in FIG. 1H, 1I, or 1J.

The reference currents supplied to each of the consecutive TiADC are scaled by $\frac{1}{8}$th. For example, $I_{1_{4E}} = 8 I_R$, $I_{2_{4E}} = I_R$, and $I_{3_{4E}} = \frac{1}{8} I_R$.

The $I_{A_{IN}}$ spans from zero to full scale is $8 I_R$.

As mentioned earlier, $ADC_{1_{4E}}$ generates the upper 3 MSBs ($D_9$, $D_8$, $D_7$), as well as three upper analog outputs $I_{O_{Nu}}$, $I_{E_{Nu}}$, $I_{E_{Nu}}$ that are fed onto $RALSP_{1_{4E}}$ (the RALSP circuit) to generate the upper $I_{A_{Lu}} \cong I_{O_{Nu}} - I_{E_{Nu}} - I_{E_{Nu}}$. The upper $I_{A_{Lu}}$ represents the residual analog least significant portion (RALSP) of the analog input current signal, which is then fed onward as analog input to the middle $ADC_{2_{4E}}$.

Similarly, $ADC_{2_{4E}}$ generates the 3 middle bits ($D_6$, $D_5$, $D_4$) as well as three middle analog outputs $I_{O_{Nm}}$, $I_{E_{Nm}}$, $I_{E_{Nm}}$ which are fed onto $RALSP_{2_{4E}}$ which is also a RALSP circuit, to generate the $I_{A_{Lm}} \cong I_{O_{Nm}} - I_{E_{Nm}} - I_{E_{Nm}}$.

FIG. 5G is a graphical depiction of FIG. 4E various waveforms, which will be described later. FIG. 5G simulated waveforms shows the upper $I_{A_{Lu}}$ and the middle $I_{A_{Lm}}$ which are equilateral triangular waveforms whose profile improve the 9-bit TiADC's overall dynamic response. As stated earlier, the middle ($D_6$, $D_5$, $D_4$) and least significant bits ($D_3$, $D_2$, $D_1$) of the second and third stage TiADC (in response to the analog flipping of signals that shapes the equilateral triangular waveform at its input) flip their digital output bits as a function of the $D_7$ and $D_4$ bits, respectively (by utilizing the $FLIP_{1_{4E}}$ and $FLIP_{2_{4E}}$ circuits).

Description of FIG. 4F

FIG. 4F is a functional block diagram of another embodiment illustrating a multi-stage 6-bit iADC that combines a 3-bit TiADC with another 3-bit TiADC.

The 3-bit $ADC_{1_{4F}}$ depicts a TiADC, for example such as the one disclosed in FIG. 3J, which generates the 3-MSBs ($D_6$, $D_5$, $D_4$) and the residual analog LSB portion of the input current signal, $I_{A_L}$, that is inputted onto $ADC_{2_{4F}}$. The 3-bit $ADC_{2_{4F}}$ also depicts a TiADC, for example such as the one disclosed in FIG. 3C, to generates the 3-LSBs ($D_3$, $D_2$, $D_1$).

The reference current, $I_{1_{4F}} = I_R$ supplied to $ADC_{1_{4F}}$ is $2^{D\_MSB} = 2^3 = 8$ time bigger than the reference current, $I_{2_{4F}} = \frac{1}{8} I_R$ that is supplied to $ADC_{2_{4F}}$.

The current steering network within TiADC contains all the information to re-construct, $I_{A_L}$, as a residual analog LSB portion of $I_{IN}$ input current signal, and this feature provides TiADC topology with some flexibility to be arranged in variety of fashions. For example, the $ADC_{1_{4F}}$ can be a variation of the TiADC that is disclosed in FIG. 3J.

Here, the $A_L$ output port of $ADC_{1_{4F}}$ is fed onto a current mirror comprising of FETs $N_{1_{4F}}$ and $N_{1_{4F}}$ (which can be cascoded for higher output resistance and matching), wherein the output of the said current mirror, which is the drain terminal of $N_{1_{4F}}$, is fed onto the input terminal of $ADC_{2_{4F}}$ (which is of the TiADC type illustrated in FIG. 1C). It would be obvious to those skilled in the art that utilizing a complementary version of TiADC type illustrated in FIG. 1C (e.g., with NNOS type current references), would eliminate the need for the current mirror, $N_{1_{4F}}$ and $N_{1_{4F}}$. Moreover, it would be obvious to one skilled in the art that $ADC_{2_{4F}}$ could utilized other type of iADC such as, for example, FiADC and AiADC with the proper logic interface for the $ADC_{1_{4F}}$ and $ADC_{2_{4F}}$.

FIG. 5K is a graphical depiction of FIG. 4F's various waveforms (utilizing FIG. 3J for $ADC_{1_{4F}}$), which will be described later.

In the next sections, descriptions of FIGS. 5A, 5B, 5C, 5D, 5E, 5F, 5G, and 5I are provided. The FIG. 5 series are the Spice circuit simulations showing the various waveforms several iADCs illustrated in this disclosure. The simulations are performed in order to demonstrate functionality and typical specifications of the disclosed embodiments. These simulations are not intended to guarantee the embodiment's performance to a particular range of specifications. Note that circuit simulations use the Top-Spice simulator, and are based on approximate device models for a typical standard 0.18 µm CMOS process fabrication.

Description of FIG. 5A

FIG. 5A is a circuit simulation showing the waveforms of the 3-bit TiADC of the kind illustrated in FIG. 3A (which are also applicable to FIG. 3C)

The horizontal axis shows time in seconds, where $I_{IN}$ is ramped from zero to full scale, which is 80 nA (nano-ampere), in 8 seconds. The $I_{IN}$ is plotted in the middle section of FIG. 5A, which ramps from zero to 80 nano-ampere (nA) and it is offset down by −80 nA for pictorial clarity.

Also, $I_O$ is offset by −80 nA for pictorial clarity, and plotted in the middle section of FIG. 5A. The $I_O$ is generated by feeding the output codes of the 3-bit TiADC onto an ideal 3-bit current mode digital to analog converter (iDAC) so that the reconstructed $I_O$ can be compared with $I_{IN}$. For $I_{IN}$ to be re-constructed through iADC+iDAC in form of an $I_O$ is a way to demonstrate the functionality and performance of iADCs.

Additionally, the middle section of FIG. 5A show the plots the $I_{IN}$ ramp versus the output currents $I_{A_{P1}}$ to $I_{A_{P7}}$, corresponding to each of the seven SCC $SCC_{1_{34}}$ to $SCC_{7_{34}}$, respectively (pertaining to TiADC illustrated in FIG. 3A).

The upper section of FIG. 5A graphs $I_{IN}$ versus the digital thermometer outputs $T_1$ to $T_7$ codes (by 1s and 0s) that is later (inverted to be) encoded to a binary format with the proper polarity. Setting aside the −80 nA offset factor, when $I_{IN}=0$ at time of zero seconds, then $T_1$ to $T_7$ are all ones. When $I_{IN}=80$ nA at time of 8 second, then $T_1$ to $T_7$ are all zeros.

With $I_{IN}=80$ nA, then each current segment in the thermometer current reference network is $I_R=10$ nA. It can be noticed that, for example as $I_{IN}$ ramps by every 10 nA per second, then the thermometer codes $T_1$ to $T_7$ transitions one every second.

The lower section of FIG. 5A shows the digital binary outputs $D_1$ to $D_3$ codes (by 1s and 0s) as a function of $I_{IN}$ ramping up. Setting aside the −80 nA offset factor, when $I_{IN}=0$ at time of zero seconds, then $D_1$ to $D_3$ are all zero. When $I_{IN}=80$ nA at time of 8 second, then $D_1$ to $D_3$ are all ones.

Description of FIG. 5B

FIG. 5B is a circuit simulation showing the waveforms of the 6-bit iADC illustrated in FIG. 4A, which is comprised of $ADC_{1_{44}}$ and $ADC_{2_{44}}$, which are two 3-bit TiADCs (each of the kind illustrated in FIG. 3A) with a RALSP circuit (of the kind illustrated in FIG. 1J) in between the two 3-bit TiADCs.

The horizontal axis shows time in milliseconds (ms), where $I_{IN}$ is ramped from zero to full scale 80 nA in 8 ms. The $I_{IN}$, plotted in the upper section of FIG. 5B, ramps from zero to 80 nano-ampere (nA) and it is also offset down by −80 nA for pictorial clarity.

The $I_O$ is also plotted in the upper section of FIG. 5B, and it is also offset by −82 nA for pictorial clarity. The $I_O$ is also generated by feeding the output codes of the 6-bit TiADC onto an ideal 6-bit iDAC so it can be compared with $I_{IN}$, which indicates functionality of the overall iADC via simulation.

Additionally, the upper section of FIG. 5B show the plots of $I_{IN}$ ramp versus the output currents of SCCs of $ADC_{1_{44}}$ (which is the MSBs TiADC of the kind illustrated in FIG. 3A). As such, the upper section of FIG. 5B shows the $I_{IN}$ ramp versus the plots (pertaining to $ADC_{1_{44}}$) for the corresponding $I_{A_{P1m}}$ to $I_{A_{P7m}}$ that flow through the $A_P$ ports of $SCC_{1_{34}}$ to $SCC_{7_{34}}$, respectively.

The lower section of FIG. 5B shows $I_{A_L}$, which is the output of the $RALSP_{1_{44}}$ circuit in FIG. 4A. It can be noticed that as $I_{IN}$ ramps 10 nA every milli-seconds (ms), the $I_{A_L}$ also ramps 10 nA up followed by ramping 10 nA down, which generates the $I_{A_L}$ with an equilateral triangular (saw tooth profile) waveform. As it was described earlier, feeding $ADC_{2_{44}}$ with $I_{A_L}$, which is an equilateral triangular waveform, avoids subjecting $ADC_{2_{44}}$ to zero-scale to full-scale input pulses, which improves $ADC_{2_{44}}$ dynamic response and the overall dynamic response of the 6-bit iADC.

The middle section of FIG. 5B shows the $I_{A_L}$ waveform versus the plots (pertaining to $ADC_{2_{44}}$ of the kind illustrated in FIG. 3A) for the corresponding $I_{A_{P1L}}$ to $I_{A_{P7L}}$ that flow through the $A_P$ ports of $SCC_{1_{34}}$ to $SCC_{7_{34}}$, respectively. Note that s described earlier, the reference input current in MSBs $ADC_{2_{44}}$ is ⅛th of that of LSBs $ADC_{1_{44}}$.

Description of FIG. 5C

FIG. 5C is a circuit simulation showing waveforms of 3-bit AiADC of the kind illustrated in FIG. 3E.

The horizontal axis shows time in seconds, when $I_{IN}$ is ramped down from full scale 80 nA to zero in 8 seconds. The $I_{IN}$, plotted in the middle section of FIG. 5C, ramps down from 80 nA to 0, but note that $I_{IN}$ polarity is plotted as reversed for pictorial clarity (showing ramp from 0 to 80 nA).

Also, $I_O$ is plotted in the middle section of FIG. 5C. The $I_O$ is generated by feeding the output codes of the 3-bit AiADC onto an ideal 3-bit iDAC so it can be compared with $I_{IN}$, which indicates functionality of the overall AiADC via simulation.

Additionally, the middle section of FIG. 5C show the plots the $I_{IN}$ ramp down versus the output currents $I_{A_{O1}}$, $I_{A_{O1}}$, $I_{A_{O3}}$ corresponding to each of the three $DABS2_{1_{3E}}$ (i.e., paired $SCC_{3_{1E}}$ & $DIF2_{3_{3E}}$), $DABS2_{2_{3E}}$ (i.e., paired $SCC_{2_{3E}}$ & $DIF2_{2_{3E}}$), $DABS2_{3_{3E}}$ (i.e., paired $SCC_{3_{3E}}$ & $DIF2_{3_{3E}}$), respectively.

The upper section of FIG. 5C shows the gray code $G_1$, $G_2$, $G_3$ codes (by 1s and 0s) as a function of $I_{IN}$ (and $I_O$).

The lower section of FIG. 5C shows the binary code outputs $B_1$, $B_2$, $B_3$ codes (by 1s and 0s) as a function of $I_{IN}$ (and $I_O$), as well.

Keeping in mind the pictorial reversal of $I_{IN}$ plot in the middle section of FIG. 5C, when $I_{IN}$ and $I_O$ are at full scale (80 nA) at time of zero seconds, then $G_3=1$, $G_2=0$, $G_1=1$ and $D_3=1$, $D_2=1$, $D_1=1$. When $I_{IN}$ and $I_O$ are at zero scale (0 nA) at time of 8 seconds, then $G_3=0$, $G_2=0$, $G_1=0$ and $D_3=0$, $D_2=0$, $D_1=0$.

Description of FIG. 5D

FIG. 5D is a circuit simulation showing waveforms of a 6-bit iADC illustrated in FIG. 4B, which is comprised of a first stage 3-bit MSBs TiADC ($ADC_{1_{4B}}$), a RALSP circuit ($RALSP_{1_{4B}}$), and a second stage 3-bit LSBs AiADC ($ADC_{2_{4B}}$).

As provided in description of FIG. 4B, the $ADC_{1_{4B}}$ utilize a TiADC of the kind illustrated in FIG. 3A. The $ADC_{2_{4B}}$ of FIG. 4B utilize a AiADC of the kind illustrated in FIG. 3E. The $RALSP_{1_{4B}}$ of FIG. 4B utilize a RALSP circuit of the kind illustrated in FIG. 1J.

In FIG. 5D, the horizontal axis shows time in seconds, when $I_{IN}$ is ramped up from zero to full scale 80 nA in 8 ms, and it is offset down by −80 nA for pictorial clarity.

Also, $I_O$ is also plotted in the upper section of FIG. 5D, and it is also offset by −82 nA for pictorial clarity. The $I_O$ is generated by feeding the output codes of the 6-bit iADC onto an ideal 6-bit iDAC so it can be compared with $I_{IN}$, which indicates functionality of the overall iADC via simulation.

Additionally, the upper section of FIG. 5D show the plots of $I_{IN}$ ramp versus the output currents of SCCs of $ADC_{1_{4A}}$ (of the kind illustrated FIG. 3A) that correspond to $I_{A_{P1m}}$ to $I_{A_{P7m}}$ that flow through the $A_P$ ports of $SCC_{1_{3A}}$ to $SCC_{7_{3A}}$ (within the $ADC_{1_{4A}}$), respectively.

The lower section of FIG. 5D shows $I_{A_L}$, which is the output of the $RALSP_{1_{4B}}$ circuit in FIG. 4B. It can be noticed that as $I_{IN}$ ramps by 10 nA every 1 ms. Also $I_{A_L}$ full scale is 10 nA which is set by full scale $I_{IN}$ of 80 nA divided by $2^{MSB}=2^3=8$. Accordingly, $I_{A_L}$ ramps 10 nA/1 ms up followed by ramping 10 nA/1ms down, which shows $I_{A_L}$'s profile of equilateral triangular waveform. As it was described earlier, feeding $I_{A_L}$ with an equilateral triangular waveform pattern onto $ADC_{2_{4B}}$ avoids subjecting $ADC_{2_{4B}}$ to zero-scale to full-scale input pulses, which improves $ADC_{2_{4B}}$ dynamic response and the overall dynamic response of the 6-bit iADC.

Moreover, the lower section of FIG. 5D show the plots of $I_{A_{O3}}$ (the output current signal of $DABS2_{3_{3E}}$, which is the paired $SCC_{3_{3E}}$ & $DIF2_{3_{3E}}$) and $I_{A_{O2}}$ (the output current signal of $DABS2_{2_{3E}}$, which is the paired $SCC_{2_{3E}}$ & $DIF2_{2_{3E}}$). The $I_{A_{O2}}$ and $I_{A_{O3}}$ are current signals within the 3-bit $ADC_{2_{4B}}$ (an AiADC of the kind illustrated FIG. 3E).

Description of FIG. 5E

FIG. 5E is a circuit simulation showing waveforms of a 6-bit iADC illustrated in FIG. 4C, which is comprised of a first stage 3-bit MSBs TiADC ($ADC_{1_{4C}}$), a RALSP circuit ($RALSP_{1_{4C}}$), and a second stage 3-bit LSBs FiADC ($ADC_{2_{4C}}$).

As provided earlier in the description of FIG. 4C, the $ADC_{1_{4C}}$ utilize a TiADC of the kind illustrated in FIG. 3A. The $ADC_{2_{4C}}$ of FIG. 4C utilize a FiADC of the kind illustrated in FIG. 3H. The $RALSP_{1_{4C}}$ of FIG. 4C utilize a RALSP circuit of the type illustrated in FIG. 1J.

The horizontal axis shows time in seconds, when $I_{IN}$ is ramped from zero to full scale 128 nA in 512 ms, that is $I_{IN}$ ramping up 1 nA per 4 ms. The $I_{IN}$, plotted in the upper section of FIG. 5E, ramps from zero to 128 nA, and it is offset down by −128 nA for pictorial clarity.

Also, $I_O$ is also plotted in the upper section of FIG. 5E, and it is also offset by −130 nA for pictorial clarity. The $I_O$ is generated by feeding the output codes of the 6-bit TiADC onto an ideal 6-bit iDAC so it can be compared with $I_{IN}$, which indicates functionality of the overall iADC via simulation.

Additionally, the upper section of FIG. 5E graphs the $I_{A_L}$, which is the output of the $RALSP_{1_{4C}}$ (of FIG. 4C). The $I_{A_L}$ is offset by −144 nA for pictorial clarity. The $I_{A_L}$ is offset by −144 nA for pictorial clarity. It can be noticed that with $I_{IN}$ full scale of 128 nA, then $I_{A_L}$ full scale is 16 nA=128 nA/$2^{MSBs}$=128 nA/8.

Moreover, the upper section of FIG. 5E show the plots of $I_{IN}$ ramp versus the output currents of SCCs of $ADC_{1_{4C}}$ (3-MSB TiADC of the kind illustrated FIG. 3A) that correspond to $I_{A_{P1m}}$ to $I_{A_{P7m}}$ that flow through the $A_P$ ports of $SCC_{1_{3A}}$ to $SCC_{7_{3A}}$.

The lower section of FIG. 5E is a graph of $I_{IN}$ versus the $ADC_{1_{4C}}$'s MSBs digital thermometer outputs $T_{1m}$ to $T_{7m}$ codes (by 1s and 0s), that are later encoded to MSB binary code format for the proper polarity. Setting aside the −128 nA offset factor, when $I_{IN}$=0 at time of zero seconds, then $T_{1m}$ to $T_{7m}$ are all ones. When $I_{IN}$=128 nA at time of 512 ms, then $T_{1m}$ to $T_{7m}$ are all zeros.

The middle section of FIG. 5E plots the LSBs digital thermometer outputs $T_{1L}$ to $T_{7L}$ codes (of $ADC_{2_{4C}}$, which is the 3-LSBs FiADC, illustrated in FIG. 3H), that are later encoded to LSB binary codes with the proper polarity.

Also, as $I_{IN}$ ramps from zero to full scale of 128 nA in 512 ms, it can be noticed that $I_{A_L}$ (that feed the input current signal to the next 3-LSBs FiADC) spans its full scale peak-to-peak of 16 nA every 64 ms=512 ms/$2^{MSBs}$=512 ms/$2^3$.

As stated earlier, $I_{A_L}$ (that is the input current signal to the next 3-LSBs FiADC) spans from zero to its full scale of 16 nA every 64 ms. Setting aside the −144 nA offset factor of $I_{A_L}$, when $I_{A_L}$=0 at time of zero seconds, then $T_{1L}$ to $T_{7L}$ are all ones. When $I_{A_L}$=16 nA at time of 64 ms, then $T_{1L}$ to $T_{7L}$ are all zeros. As $I_{A_L}$ follows an equilateral triangular waveform profile, the $T_{1L}$ to $T_{7L}$ are properly encoded with the right sign to generate the LSB binary codes (with $D_4$ controlling the LSB's polarity utilizing $FLIP_{1_{4C}}$, of FIG. 4C that was illustrated in FIG. 2C)

Description of FIG. 5F

FIG. 5F is a circuit simulation showing waveforms of a 6-bit iADC illustrated in FIG. 4D, which is comprised of a first stage 3-bit MSBs TiADC ($ADC_{1_{4D}}$) and a second stage 3-bit LSBs AiADC ($ADC_{2_{4D}}$).

As noted in description of FIG. 4D, the $ADC_{1_{4D}}$ utilize a TiADC of the kind illustrated in FIG. 3D, which provides the RALSP function and generates the $I_{A_L}$ signal as well which becomes the input current signal for the next stage 3-LSBs AiADC. The 3-bit LSBs $ADC_{2_{4D}}$ of FIG. 4D utilize a AiADC of the kind illustrated in FIG. 3E.

The horizontal axis shows time in seconds, when $I_{IN}$ is ramped from zero to full scale 64 nA in 64 ms. The $I_{IN}$, plotted in the upper section of FIG. 5F, ramps from zero to 64 nA and it is offset down by −64 nA for pictorial clarity.

Also, $I_O$ is also plotted in the upper section of FIG. 5F, and it is also offset by −68 nA for pictorial clarity. The $I_O$ is generated by feeding the output codes of the 6-bit TiADC onto an ideal 6-bit iDAC so it can be compared with $I_{IN}$, which indicates functionality of the overall iADC.

The upper section of FIG. 5F also graphs the $I_{A_L}$, which is the output of the $RALSP_{1_{4C}}$ (of FIG. 4C). The $I_{A_L}$ is offset by 64 nA for pictorial clarity. It can be noticed that with $I_{IN}$ full scale of 64 nA, then $I_{A_L}$ full scale is 8 nA=64 nA/$2^{MSBs}$=64 nA/8.

Additionally, the upper section of FIG. 5F show the plots of $I_{IN}$ ramp versus the output currents of SCCs of $ADC_{1_{4D}}$ (3-MSBs TiADC of the kind illustrated FIG. 3D) which are the $I_{A_{P1m}}$ to $I_{A_{P7m}}$ that flow through the $A_P$ ports of $SCC_{1_{3D}}$ to $SCC_{7_{3D}}$.

As $I_{IN}$ ramps from zero to full scale of 64 nA in 64 ms, it can be noticed that $I_{A_L}$ (that feed the input current signal to the next 3-LSBs AiADC) spans its full scale peak-to-peak of 8 nA every 8 ms=64 ms/$2^{MSBs}$=64 ms/$2^3$.

As explained in the FIG. 4D's description, the $I_{A_L}$ here has a right-angled triangular waveform pattern (but for the last or 8th wave).

Notice that the lower section of FIG. 5F show the plots of $I_{A_{02}}$ (the output DABS2$_{3_E}$, which is the paired SCC$_{3_E}$ & DIF2$_{3_E}$) and $I_{A_{02}}$ (the output DABS2$_{2_E}$, which is the paired SCC$_{2_E}$ & DIF2$_{2_E}$).

Description of FIG. 5G

FIG. 5G is a circuit simulation showing the waveforms of the 9-bit iADC illustrated in FIG. 4E, which is comprised of three ADCs including the upper ADC$_{1_{4E}}$, the middle ADC$_{2_{4E}}$, and the lower ADC$_{3_{4E}}$, each of which is a 3-bit TiADC (of the kind illustrated in FIG. 3A) with two RALSP circuits (of the kind illustrated in FIG. 1J) in between each TiADC.

The horizontal axis shows the time in seconds, where $I_{IN}$ is ramped from zero to full scale 256 nA in 1.024s. The $I_{IN}$, plotted in the upper section of FIG. 5G, ramps from zero to 256 nA and it is also offset down by −256 nA for pictorial clarity.

Also, $I_O$ is plotted in the upper section of FIG. 5G, and it is also offset by −258 nA for pictorial clarity. The $I_O$ is also generated by feeding the output codes of this 9-bit TiADC onto an ideal 9-bit iDAC so it can be compared with $I_{IN}$, which indicates the overall functionality of the iADC.

The upper section of FIG. 5G shows the $I_{IN}$ ramp versus the plots (pertaining to FIG. 4E's ADC$_{1_{4E}}$ that is the upper 3 bits for TiADC of the kind illustrated in FIG. 3A) for the corresponding $I_{A_{P1u}}$ to $I_{A_{P7u}}$ that flow through the $A_P$ ports of SCC$_{1_{34}}$ to SCC$_{7_{34}}$, respectively.

The middle section of FIG. 5G shows $I_{A_{Lu}}$, which is the output of the RALSP$_{1_{4E}}$ circuit in FIG. 4E. It can be noticed that with $I_{IN}$ full scale of 256 nA, then $I_{A_{Lu}}$ full scale is 32 nA=256 nA/$2^{MSBs}$=256 nA/8.

Moreover, as $I_{IN}$ ramps from zero to full scale of 256 nA in 1024 ms, it can be noticed that $I_{A_{Lu}}$ spans its full scale peak-to-peak of 32 nA every 128 ms=1024 ms/$2^{MSBs}$=1024 ms/$2^3$.

As such, the middle section of FIG. 5G shows the $I_{A_{Lu}}$ waveform versus the plots (pertaining to the middle ADC$_{2_{4E}}$ which is also a 3-bit TiADC of the kind illustrated in FIG. 3A) for the corresponding $I_{A_{P1m}}$ to $I_{A_{P7m}}$ that flow through the $A_P$ ports of SCC$_{1_{34}}$ to SCC$_{7_{34}}$, respectively.

The lower section of FIG. 5G, note that with $I_{A_{LL}}$ full scale of 32 nA, then $T_{A_{LL}}$ full scale is 4 nA=32 nA/$2^{middle-bits}$=32 nA/8. Moreover, $I_{A_{LL}}$ ramps from zero to full scale of 32 nA in 16 ms=128 ms/$2^{middle-bits}$=128 ms/$2^3$.

The lower section of FIG. 5G shows the $T_{A_{LL}}$ waveform versus the plots (pertaining to the lower ADC$_{3_{4E}}$ which is also a 3-bit TiADC of the kind illustrated in FIG. 3A) for the corresponding $I_{A_{P1L}}$ to $I_{A_{P7L}}$ that flow through the $A_P$ ports of SCC$_{1_{34}}$ to SCC$_{7_{34}}$, respectively.

As described earlier, the reference input current for upper ADC$_{1_{4A}}$ is 8 times that of the middle ADC$_{2_{4A}}$. Similarly, the reference input current for middle ADC$_{2_{4A}}$ is 8 times that of the upper ADC$_{2_{4A}}$.

Description of FIG. 5H

FIG. 5H is a circuit simulation showing the linearity graph. It illustrates the $I_{IN}$–$I_O$ of 10 montecarlo (MC) simulations depicting linearity (DNL, and INL) of the 9-bit iADC illustrated in FIG. 4E. The $I_O$ is generated by feeding the output codes of this 9-bit iADC onto an ideal 9-bit iDAC. By plotting $I_{IN}$–$I_O$, the linearity (errors) attributed to the 9-bit iADC is captured.

The MC simulations were performed in real-time transient mode and used all CMOSFET based circuits in FIG. 4E (no macro modeling).

The horizontal axis shows time in seconds, where $I_{IN}$ is ramped from zero to full scale 512 nA in 1024 ms.

The FETs in the segmented reference network operate in the subthreshold region where most of the mismatch between FETs is due to their threshold voltage ($V_{TH0}$) mismatch. Accordingly, for Top Spice simulator, the $V_{TH0}$ tolerance statistical distribution for FETs was selected at σ~1.6% (i.e., STAT CMOS VTH0 GAUSS 0.8%+1−1 cc=0.998). The $V_{TH0}$ mismatch indicated $I_{DS}$ current mismatch of ~1.2% between two arbitrary FETs, of the same kind and size as the FETs used in the iADC's current reference network, in the circuit of FIG. 4E.

The FIG. 4E's 9-bit iDAC utilizes a 3-bit TiDAC, with $2^3$=8 reference current segments for its first stage TiDAC. Thus, the linearly can theoretically improve by about $\sqrt{8}$, which computes to about 1.2%/$\sqrt{8}$=0.43%. The 10 montecarlo simulation runs in FIG. 5H, captured a an average DNL of ~0.3% (which is less than the theoretical improvement to 0.43%) and high DNL of about 0.6%. The high DNL is likely due to the error contribution of RALSP circuit when it subtracts several of TiADC's SCC's even $I_{A_N}$ from several of SCC's odd $I_{A_N}$, which was explained earlier.

Description of FIG. 5I

FIG. 5I is a circuit simulation showing the current consumption ($I_{DD}$) waveform of the 9-bit iADC illustrated in FIG. 4E.

The $I_{DD}$ simulation was performed in real time transient mode and using all CMOSFET based circuits in FIG. 4E (no macro modeling).

The horizontal axis shows time in seconds, where $I_{IN}$ is ramped from zero to full scale 512 nA in 1024 ms. The vertical axis shows the real-time transient $I_{DD}$ of about 0.8 micro ampere (μA).

Logic heavy circuits with free running clocks can consume large amounts of transient power consumption. Given that the disclosed iADCs are clock free and the embodiments are not logic heavy, the transient current consumption associated with digital logic sections of the circuits, and thus the current consumption of the whole multi-stage iADC can be kept low.

Description of FIG. 5J

FIG. 5J is a circuit simulation showing waveforms of montecarlo simulations (MC) depicting linearity of the 6-bit iADC illustrated in FIG. 4A wherein ADC1$_{4A}$ is of the kind illustrated in FIG. 3I. Here, the $I_{IN}$–$I_O$ of 30 montecarlo (MC) simulations depicting linearity (DNL, and INL) of the 6-bit iADC. Instead of illustrating a higher resolution iADCs, a 6-bit iADC is depicted for graphical clarity of showing 30 montecarlo runs (that are real time transient, all transistor level spice simulations, with no macro-modeling). Selected MC runs with largest DNL are displayed and each run is offset from one another by 1.5% for pictorial clarity.

The $I_O$ is generated by feeding the output codes of this 6-bit iADC onto an ideal 6-bit iDAC. By plotting $I_{IN}$–$I_O$, the linearity (errors) in % terms is recorded, which can be compared and contrasted with simulations results for the 9-bit iADC montecarlo simulations of FIG. 5H.

The horizontal axis shows time in seconds, where $I_{IN}$ is ramped from zero to full scale 160 nA in 800 ms.

The FETs in the segmented reference network operate in the subthreshold region where most of the mismatch between FETs is due to their threshold voltage ($V_{TH0}$) mismatch. Accordingly, for TopSpice simulator, the $V_{TH0}$ tolerance statistical distribution for FETs was selected at σ~1.6% (i.e., STAT CMOS VTH0 GAUSS 0.8%+1−1 cc=0.998). The $V_{TH0}$ mismatch indicated $I_{DS}$ current mismatch of ~1.2% between two arbitrary FET, with the same size and type as that of the iADC current reference network, in the circuit of FIG. 4A, wherein $ADC1_{4A}$ is of the kind illustrated in FIG. 3I.

The FIG. 4A's 6-bit iDAC utilizes a 3-bit TiDAC, with $2^3$=8 reference current segments for its first stage. Thus, the linearly can theoretically improve by about √8, which computes to about 1.2%/√8≅0.42%. The 30 montecarlo simulation runs in FIG. 5J, captured a high DNL of about 0.4% which is consistent with the theoretical. Moreover, as explained earlier, the DNL indicated in FIG. 5J is lower than that of FIG. 5H due to the RALSP circuit (of FIG. 4A wherein $ADC1_{4A}$ is of the kind illustrated in FIG. 3I) in subtracting only one of TiADC's SCC's even $I_{A_N}$ from one SCC's odd $I_{A_N}$.

Description of FIG. 5K

FIG. 5K is a circuit simulation showing waveforms of a 3-bit iADC illustrated in FIG. 3J.

The horizontal axis shows time in seconds, when $I_{IN}$ is ramped from zero to full scale 160 nA in 800 ms.

The middle section of FIG. 5J graphs the portions of $I_{A_N}s$ of each of the $SCC_{1_{3J}}$ to $SCC_{7_{3J}}$ after they are selected and passed through the analog switches $P_{1''_{3J}}$ to $P_{7''_{3J}}$.

Also, the selected portion of $I_{Ap7_{3J}}$ that flows through $P_{8''_{3J}}$, is plotted on the same middle graph. Note that the selected passed-through $I_{A_N}s$ only span between zero (high point) and 20 nA (low point), but they are each graphically shifted to avoid over-lapping plots for pictorial clarity.

The lower section of FIG. 5J graphs the $I_{A_L}$, which is the sum of the selected portions the $I_{A_N}s$ that pass through $P_{1''_{3J}}$ to $P_{7''_{3J}}$ plus the selected portion of $I_{Ap7_{3J}}$ that passes through $P_{8''_{3J}}$.

It can be noticed that with $I_{IN}$ full scale of 160 nA, then $I_{A_L}$ full scale is 20 nA=160 nA/$2^{MSBs}$=160 nA/8. As explained in the FIG. 3J's description, the $I_{A_L}$ here has a right-angled triangular waveform pattern.

What is claimed:

1. A method for conditioning signals (SCM) in an integrated circuit, the method comprising:
    receiving an input current;
    producing a first comparison by comparing the input current to a first reference current and producing a first difference current;
    producing a first digital thermometer code corresponding to the polarity of the first difference current;
    producing successive comparisons by comparing the first and subsequent difference signals respectively with a second and subsequent reference signals; and
    producing successive thermometer digital codes corresponding to the respective polarities of the successive comparisons.

2. A signal conditioning method (SCM), the method comprising:
    providing a first signal conditioning block (SCB);
    the first SCB having an analog input port, an analog output port, and a digital output port;
    receiving an analog input signal ($I_{A_I}$) at the first SCB's analog input port ($A_I$);
    receiving an analog reference input signal ($I_{A_R}$) at the first SCB's analog input port $A_I$;
    generating a digital output signal $T_O$ at the first SCB's digital output port;
    generating an analog output signal ($I_{A_O}$) at the first SCB's analog output port ($A_O$);
    generating $T_O$ with a polarity X and generating $I_{A_O}=I_{A_I}-I_{A_R}$, if $I_{A_I}>I_{A_R}$; and
    generating $T_O$ with a polarity opposite to X and generating $I_{A_O}=0$, if $I_{A_I}\leq I_{A_R}$.

3. The signal conditioning method (SCM) of claim 2, the method further comprising:
    providing an analog to digital converter (ADC) having T bits of resolution comprising:
    cascading T of SCBs beginning with the first SCB and ending with a last SCB, the analog output $A_O$ of the first SCB communicating with the analog input $A_I$ of a second SCB, and respectively, the analog output $A_O$ of each successive SCB communicating with the analog input $A_I$ of each subsequent successive SCB;
    receiving, at the analog input port $A_I$ of each SCB, an analog reference input signal $I_{A_R}$ wherein each respective analog reference input signal $I_{A_R}$ is individually weighted;
    providing a reference input port to the ADC;
    receiving an ADC reference signal at the reference input port of the ADC, wherein the ADC reference signal is proportional to $I_{A_R}$;
    providing a plurality of digital output ports to the ADC, wherein each digital output port to the ADC receives the digital output signal $T_O$ from each SCB to form an ADC thermometer code; and wherein the analog input signal ($I_{A_I}$) at the first SCB's analog input port $A_I$ is the input signal to the ADC.

4. The signal conditioning method (SCM) of claim 3, the method further comprising:

programming each respective analog reference input signal $I_{A_R}$ such that each is individually weighted.

5. The signal conditioning method (SCM) of claim 3, the method further comprising:

mapping the ADC thermometer code to another output code format.

6. A signal conditioning method (SCM), the method comprising:

providing a first signal conditioning block (SCB);

the first SCB having an analog input port ($A_I$), a first analog output port ($A_O$), a second analog output port ($A_N$), and a digital output port;

receiving an analog input signal ($I_{A_I}$) at the first SCB's analog input port $A_I$;

receiving an analog reference input signal ($I_{A_R}$) at the first SCB's analog input port $A_I$;

generating a digital output signal $T_O$ at the first SCB's digital output port;

generating a first analog output signal $I_{A_O}$ at the first SCB's first analog output port ($A_O$);

generating a second analog output signal ($I_{A_N}$) at the first SCB's second analog output port $A_N$;

generating $T_O$ with a polarity X and generating $I_{A_O}=I_{A_I}-I_{A_R}$ and generating $I_{A_N}=0$, if $I_{A_I}>I_{A_R}$; and generating $T_O$ with a polarity opposite to X and generating $I_{A_O}=0$ and generating $I_{A_N}=I_{A_R}-I_{A_I}$, if $I_{A_I} \le I_{A_R}$.

7. The signal conditioning method (SCM) of claim 6, the method further comprising:

providing an analog to digital converter (ADC) having T bits of resolution comprising:

cascading T SCBs beginning with the first SCB and ending with a last SCB, the first analog output $A_O$ of the first SCB communicating with the analog input $A_I$ of a second SCB, and respectively, the analog output $A_O$ of each successive SCB communicating with the analog input $A_I$ of each subsequent successive SCB;

receiving, at the analog input port $A_I$ of each SCB, an analog reference input signal $I_{A_R}$ wherein each respective analog reference input signal $I_{A_R}$ is individually weighted;

providing a reference input port to the ADC;

receiving an ADC reference signal at the reference input port of the ADC, wherein the ADC reference signal is proportional to $I_{A_R}$;

providing a plurality of digital output ports to the ADC, wherein each digital output port to the ADC receives the digital output signal $T_O$ from each SCB to form an ADC thermometer code;

providing a plurality of analog output ports to the ADC, wherein each analog output port to the ADC receives the second output signal ($I_{A_N}$) from each SCB;

wherein the analog input signal ($I_{A_I}$) at the first SCB's analog input port $A_I$ is the input signal to the ADC; and wherein the first SCB and every other successive SCB is an odd-numbered SCB, and wherein the second SCB and every other successive SCB is an even-numbered SCB.

8. The signal conditioning method (SCM) of claim 7, the method further comprising:

generating $I'_{A_L}$ by summing the subtracting of the second analog output signal ($I_{A_N}$) of an odd-numbered SCB from the second analog output signal ($I_{A_N}$) of an even-numbered SCB to the subtracting of the second analog output signal ($I_{A_N}$) of another odd-numbered SCB from the second analog output signal ($I_{A_N}$) of another even-numbered SCB;

generating a residual analog least significant portion (RALSP) signal $I_{A_L}=I'_{A_L}-I_{O_P}$; and wherein the $I_{A_O}$ of the last SCB is $I_{O_P}$.

9. The signal conditioning method (SCM) of claim 7, the method further comprising:

summing the $I_{A_N}$ of all odd-numbered SCBs to generate an odd-numbered sum $I_{O_N}$;

summing the $I_{A_N}$ of all even-numbered SCBs to generate an even-numbered sum $I_{E_N}$;

wherein the $I_{A_O}$ of the last SCB is $I_{O_P}$; and generating a residual analog least significant portion (RALSP) signal $I_{A_L}=I_{O_N}-I_{E_N}-I_{O_P}$.

10. The signal conditioning method (SCM) of claim 7, the method further comprising:

selecting an SCB in transition ($SCB_t$), wherein the digital output signal $T_O$ of all SCBs preceding the $SCB_t$ exhibits a polarity opposite to the polarity of the digital output signal $T_O$ of all SCBs including and succeeding the $SCB_t$;

generating a residual analog least significant portion (RALSP) signal $I_{A_L}=I'_{A_L}-I_{O_P}$;

wherein the $I_{A_N}$ signal of the $SCB_t$ is $I'_{A_L}$; and wherein the $I_{A_O}$ of the last SCB is $I_{O_P}$.

11. The signal conditioning method (SCM) of claim 7, the method further comprising:

spanning $I_{A_I}$ signal from zero scale to full scale, wherein $I_{A_I}$'s zero scale to full scale is proportional to $I_{A_R}$;

detecting a SCB in transition ($SCB_t$), wherein $T_O$ of all SCBs before $SCB_t$ have the opposite polarity of $T_O$ of all SCBs after $SCB_t$;

generating a $I_{O_N}$ which is the $I_{A_N}$ signal of an Odd number $SCB_t$ if an Odd numbered $SCB_t$ is detected, otherwise $I_{O_N}=0$;

generating a $I_{E_N}$ which is the $I_{A_N}$ signal of an Even number $SCB_t$ if the Even numbered $SCB_t$ is detected, otherwise $I_{E_N}=0$;

generating a $I_{O_P}$ which is the first output signal $I_{A_O}$ of the last SCBs; and generating a residual analog least significant portion (RALSP) signal $I_{A_L}=I_{O_N}-I_{E_N}-I_{O_P}$.

12. The signal conditioning method (SCM) of claim 7, the method further comprising:

generating $I'_{A_L}$ by summing the subtraction of the $I_{A_N}$ of an odd-numbered SCB from the $I_{A_N}$ of an even-numbered SCB that is adjacent to the odd-numbered SCB; and generating a residual analog least significant portion (RALSP) signal $I_{A_L}=I'_{A_L}-I_{O_P}$; and wherein the $I_{A_O}$ of the last SCB is $I_{O_P}$.

13. The signal conditioning method (SCM) of claim 7, the method further comprising:

generating $I'_{A_L}$ by gating the $I_{A_N}$ of a succeeding SCB to the $A_L$ port, the gating responsive to the $T_0$ of a previous SCB;

generating $I_{O_P}$ by gating the $I_{A_O}$ of the last SCB, the gating responsive to the $T_0$ of the SCB preceding the last SCB;

directing the $I_{A_N}$ of the first SCB to the $A_L$ port; and generating a residual analog least significant portion (RALSP) signal $I_{A_L}=I'_{A_L}-I_{O_P}$.

14. The signal conditioning method (SCM) of claim 9, the method further comprising:

providing a second ADC having a second ADC analog input port receiving the $I_{A_L}$.

15. The signal conditioning method (SCM) of claim 10, the method further comprising:
  providing a second ADC having a second ADC analog input port receiving the $I_{A_L}$.

16. The signal conditioning method (SCM) of claim 11, the method further comprising:
  providing a second ADC having a second ADC analog input port receiving the $I_{A_L}$.

17. The signal conditioning method (SCM) of claim 12, the method further comprising:
  providing a second ADC having a second ADC analog input port receiving the $I_{A_L}$.

18. The signal conditioning method (SCM) of claim 13, the method further comprising:
  providing a second ADC having a second ADC analog input port receiving the $I_{A_L}$.

19. A method for generating an absolute value of a difference (ABSDIF) between two currents in an integrated circuit, the method comprising:
  providing a current mirror (CM) circuit having first and second ports;
  receiving a first current $I_1$ and a second current $I_2$;
  comparing $I_1$ to $I_2$;
  responsive to the comparing, configuring the first port as an input port and the second port as an output port and providing a difference current equivalent to the difference between $I_2$ and $I_1$ to the first port, if $I_2$ is greater than $I_1$;
  responsive to the comparing, configuring the first port as an output port and the second port as an input port and providing a difference current equivalent to the difference between $I_1$ and $I_2$ to the second port, if $I_1$ is greater than $I_2$;
  responsive to the comparing, configuring the first port as an output port and the second port as an input port and providing a near zero difference current equivalent to the difference between $I_1$ and $I_2$ to the second port, if $I_1$ is near balance with $I_2$; and
  wherein the difference current is the ABSDIF.

20. A system to generate ABSDIF of claim 19 comprising:
  cascading CM to increase output impedance and sharpen the zero crossing of ABSDIF when $I_1$ and $I_2$ are near or at balance.

21. A system to generate ABSDIF of claim 19 comprising:
  utilizing regulated cascade current mirrors for CM to increase output impedance and sharpen the zero crossing of ABSDIF when $I_1$ and $I_2$ are near balance.

* * * * *